United States Patent
Aoki et al.

(10) Patent No.: US 8,749,028 B2
(45) Date of Patent: Jun. 10, 2014

(54) SEMICONDUCTOR DEVICE WITH SILICON THROUGH ELECTRODE AND MOISTURE BARRIER

(75) Inventors: Mayu Aoki, Kokubunji (JP); Kenichi Takeda, Higashimurayama (JP); Kazuyuki Hozawa, Hino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/381,070

(22) PCT Filed: Jul. 1, 2009

(86) PCT No.: PCT/JP2009/062037
§ 371 (c)(1),
(2), (4) Date: Dec. 27, 2011

(87) PCT Pub. No.: WO2011/001520
PCT Pub. Date: Jan. 6, 2011

(65) Prior Publication Data
US 2012/0098106 A1    Apr. 26, 2012

(51) Int. Cl.
*H01L 23/522*    (2006.01)
(52) U.S. Cl.
USPC ............... 257/621; 257/774; 257/E23.145
(58) Field of Classification Search
USPC ........................................ 257/621, 774
See application file for complete search history.

(56) References Cited

U.S. PATENT DOCUMENTS

| 7,935,624 B2 | 5/2011 | Ohtsuka et al. |
| 2007/0069364 A1 | 3/2007 | Kawano et al. |
| 2007/0069634 A1 | 3/2007 | Carmon et al. |
| 2010/0130003 A1* | 5/2010 | Lin et al. ............... 438/637 |
| 2010/0140749 A1* | 6/2010 | Kuo ........................ 257/621 |

FOREIGN PATENT DOCUMENTS

| JP | 2007-123857 | 5/2007 |
| JP | 2007-221103 A | 8/2007 |

OTHER PUBLICATIONS

S. Denda "Process Examination of Through Silicon Via Technologies", IEEE Polytronic 2007 Conference, p. 149, 2007.

* cited by examiner

*Primary Examiner* — Thanh Nguyen
(74) *Attorney, Agent, or Firm* — Miles & Stockbridge P.C.

(57) ABSTRACT

When a silicon through electrode is to be formed from a back surface (the surface on which a semiconductor device is not formed) of a silicon substrate, a wide range of an interlayer insulating film made of a Low-k material absorbs moisture, and there is a problem that the electrical characteristics of wiring are degraded. The above-described problem can be solved by forming at least a single ring-shaped frame laid out to enclose the silicon through electrode by using metal wirings in plural layers and a connection via connecting the upper and lower metal wirings in a Low-k material layer penetrated by the silicon through electrode and by forming a moisture barrier film made up of at least a metal wiring and a connection via between the silicon through electrode and a circuit wiring formed in the vicinity of the silicon through electrode.

14 Claims, 51 Drawing Sheets

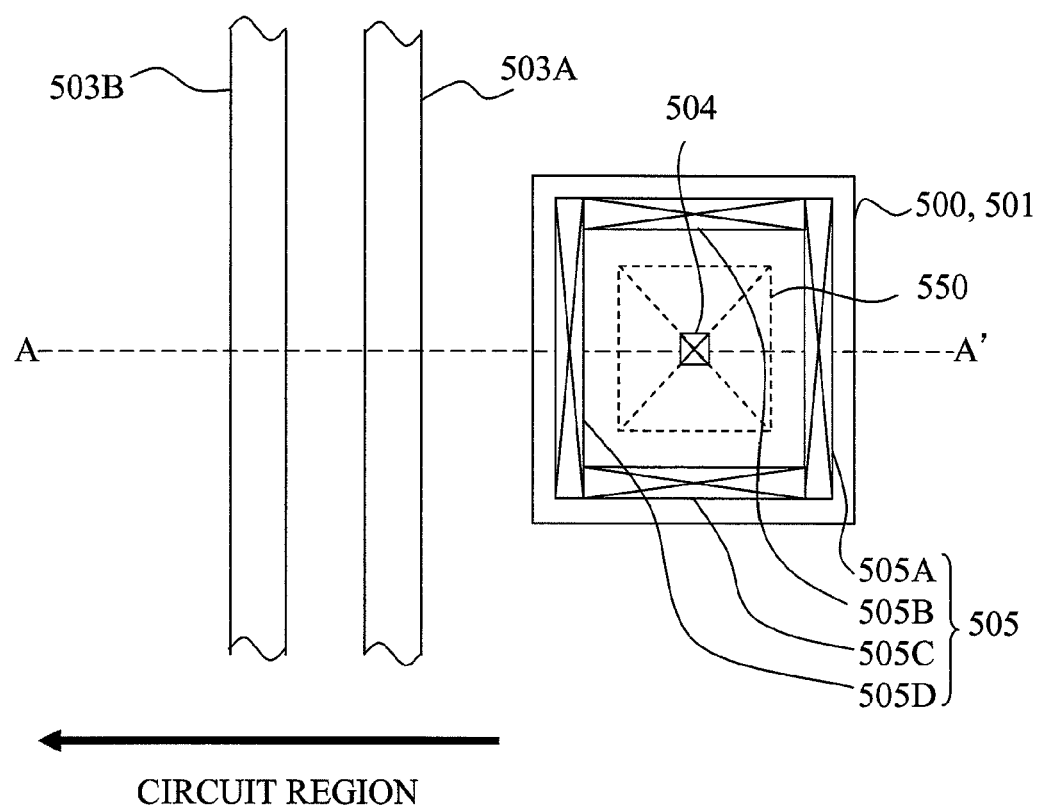

SEMICONDUCTOR DEVICE WITH SILICON THROUGH ELECTRODE AND MOISTURE BARRIER

TECHNICAL FIELD

The present invention relates to a high-performance semiconductor device having a silicon through electrode and to a method of manufacturing the same.

BACKGROUND ART

In order to achieve advanced functions and performance improvement of semiconductor LSI, techniques for miniaturizing the wirings have been developed. For the further improvement in performance and reduction in power consumption, a technique in which a plurality of semiconductor chips equipped with LSI are stacked in three-dimensional directions to mount the chips in one package has attracted attention in recent years. Connection methods of the three-dimensional stacking include a wire bonding method and a flip chip method. In the wire bonding method, the position of pad electrodes on a chip is limited to the periphery of the chip, and when communication is to be carried out between stacked chips, the communication is always carried out via the pad electrodes formed in the vicinity of the outer edges of the chips. Therefore, the wiring length is increased, and there is a problem that wiring delay is increased. Moreover, since the number of provided pad electrodes is also limited, there is a problem that the transmission band is narrowed. On the other hand, in the flip chip method, connection by bumps formed on the entire surfaces of chips is possible, and the wiring length is short. However, the number of stacked chips is limited to two. As a three-dimensional connection method that solves these problems, there is a method in which stacked chips are electrically connected by using silicon through electrodes.

The connection method using the silicon through electrodes is a method in which many through holes are formed in a silicon substrate on which a semiconductor element has been formed, the through holes are filled with a conductor typified by copper, and the through holes filled with copper are used as electrodes to electrically connect stacked semiconductor chips to each other. When the plurality of chips provided with the silicon through electrodes are mutually connected, the chips can be connected at multiple points by the shortest distance, and there is no upper limit for the number of stacked semiconductor chips in principle.

Non-Patent Document 1 is an example of the three-dimensional connection method using the silicon through electrodes and is a method in which through holes are formed from a back surface of a semiconductor device having elements to bring them into contact with upper pads, thereby connecting them to a wiring layer. A typical conventional example of the three-dimensional connection method described in this document and problems thereof will be described with reference to FIG. 2 and FIG. 3.

First, the manufacturing process of the typical conventional example of a semiconductor device using the three-dimensional connection method using the silicon through electrodes will be shown. An under-wiring insulating film 200 made up of a silicon oxide film having a film thickness of 250 nm and silicon nitride having a film thickness of 50 nm is formed on a substrate 100 on which a semiconductor element has been formed, and a tungsten plug is formed in the under-wiring insulating film. Then, a first interlayer insulating film 201 using a Low-k material made of carbon-containing silicon oxide (SiOC) and having a film thickness of 100 nm is formed, and a first metal wiring 400 made of tantalum and copper is sequentially formed in the interlayer insulating film. Then, a first protective insulating film 204 made of nitrogen-containing silicon carbide (SiCN) and having a film thickness of 25 nm and a second interlayer insulating film 202 using a Low-k material made of SiOC and having a film thickness of 250 nm are sequentially formed, and parallel metal wirings 403A and 403B adjacent to a second metal wiring 401 made of tantalum and copper are formed in the interlayer insulating film. Then, a second protective insulating film 205 made of SiCN and having a film thickness of 25 nm and a third interlayer insulating film 203 using a Low-k material made of SiOC are sequentially formed, and a third metal wiring 402 made of tantalum and copper is formed in the interlayer insulating film 203. Then, a third protective insulating film 206 made of SiCN and having a film thickness of 25 nm is formed, an aluminum pad made up of a titanium nitride film having a film thickness of 50 nm and an aluminum film having a film thickness of 500 nm is formed, and a passivation film 207 made up of a silicon oxide film having a film thickness of 200 nm and a silicon nitride film having a film thickness of 250 nm is formed. Through the process described above, a semiconductor device having multilayer wirings can be formed.

Next, as shown in FIG. 3A, after a first back-surface insulating film 600 made of silicon oxide is formed by plasma CVD on the back surface of the substrate 100 on which the semiconductor element has been formed, an opening is provided by using lithography and dry etching in a region of the first back-surface insulating film 600 in which a silicon through electrode is desired to be formed, thereby forming a first back-surface insulating-film opening 700. Then, dry etching is carried out with using the back-surface insulating film as an etching mask until the etching penetrates through at least the substrate 100 on which the semiconductor device has been formed and reaches the first metal wiring 400, thereby forming a silicon through hole 701 as shown in FIG. 3B. Then, after a silicon oxide film having a film thickness of 1 μm is formed by plasma CVD so as to cover the silicon through hole 701, full-surface etch back is carried out to form a second back-surface insulating film 601 having a sidewall insulating film on the sidewall of the silicon through hole as shown in FIG. 3C. Then, a tantalum film having a film thickness of 50 nm and a plating seed film made of copper and having a film thickness of 50 nm are sequentially formed by using sputtering, and the silicon through hole 701 is completely filled with copper by using electrolytic plating. Thereafter, the tantalum film and the copper film in the region other than the silicon through hole 701 are removed by using chemical mechanical polishing, and a semiconductor device having a silicon through electrode 800 formed from the back surface of the substrate on which the semiconductor element has been formed is formed as shown in FIG. 3D. Hereinafter, the semiconductor device in which the silicon through electrode formed in accordance with the above-described process is formed will be referred to as a conventional example.

In the case in which the silicon through hole 701 having a depth of several tens μm that sufficiently penetrates through the silicon substrate and reaches the layer of the first metal wiring 400 having a thickness of 100 nm is to be formed by using dry etching as shown in FIG. 3B, the margin for the overetching is insufficient, and the etching proceeds to the first connection via layer or the metal wiring layer in the upper layer. If dry etching proceeds until the interlayer insulating film using the Low-k material and the silicon through hole are in contact with each other, the Low-k material is damaged by plasma. Furthermore, in a cleaning step after the dry etching step, the Low-k material absorbs moisture supplied in the cleaning. If the Low-k material absorbs moisture, since the dielectric constant of the interlayer insulating film made of the Low-k material increases, the parasitic capacitance of the metal wiring is increased, increase in wiring delay and power consumption occurs, and the circuit operation may be adversely affected.

Furthermore, the absorbed moisture may then oxidize the metal material constituting the metal wiring, which may cause the increase in the wiring resistance and conduction failure. In the process of forming the silicon through hole from the back surface of the substrate, a high-temperature process cannot be carried out unlike the pre-process. Therefore, there is a problem that it is difficult to return the Low-k material which has once absorbed moisture to the characteristics before the moisture absorption.

PRIOR ART DOCUMENTS

Non-Patent Documents

Non-Patent Document 1: S. Denda, "Process Examination of Through Silicon Via Technologies" IEEE Polytronic 2007 Conference, p. 149, 2007

SUMMARY OF THE INVENTION

Problems to be Solved by the Invention

A problem to be solved by the invention is that the interlayer insulating film made of the Low-k material absorbs moisture when the silicon through electrode is formed from the back surface (the surface on which a semiconductor device is not formed) of the silicon substrate, and the electric characteristics of wiring are degraded.

Means for Solving the Problems

The above-described problem can be solved by forming a moisture barrier film between a silicon through electrode, which is formed to partially penetrate through a Low-k material, and a circuit wiring which is formed in the vicinity of the silicon through electrode.

The above-described problem can be solved by forming at least a single ring-shaped frame laid out so as to enclose a silicon through electrode by using metal wirings in plural layers and connection vias connecting the upper and lower metal wirings in a Low-k material layer penetrated by the silicon through electrode and by forming a moisture barrier film made up of at least a metal wiring and a connection via between the silicon through electrode and a circuit wiring formed in the vicinity of the silicon through electrode.

The above-described problem can be solved by forming a ring-shaped opening which encloses a silicon through electrode in the process of forming an opening of metal wirings in plural layers and an opening of a connection via connecting the upper and lower metal wirings in an interlayer insulating film using a Low-k material in contact with the silicon through electrode.

The first feature of the present invention is (1) a semiconductor device including: a substrate having a semiconductor element formed on a front surface side thereof; a metal wiring formed on the substrate; a circuit wiring made of the metal wiring, electrically connected to the semiconductor element, and constituting part of a circuit network; a Low-k insulating film formed to bury the metal wiring and the circuit wiring; and a silicon through electrode formed from a back surface side of the substrate to inside of the Low-k insulating film, and a moisture barrier film is formed between the silicon through electrode and the circuit wiring in the semiconductor device.

In (1), (2) the moisture barrier film has metal wirings formed in two or more different wiring layers and has a connection via connecting the metal wirings formed in upper and lower wiring layers. In (2), (3) the moisture barrier film constitutes a single or more ring-shaped frame made up of the metal wirings and the connection via, and one or more silicon through electrode may be enclosed in the ring-shaped frame.

In (3), (4) the silicon through electrode is electrically connected to a metal electrode in the ring-shaped frame, and the metal electrode is electrically connected also to outside of the frame.

In (1), (5) a main component of the Low-k insulating film is preferably a compound selected from silicon oxide and hydrocarbon.

In (1), (6) the metal wiring is preferably formed by using any of copper, aluminum, and tungsten as a main component.

In (4), (7) the metal electrode is preferably formed by using any of copper, aluminum, and tungsten as a main component.

In (2), (8) the connection via is preferably formed by using any of copper, aluminum, and tungsten as a main component.

In (1), (9) the silicon through electrode is preferably made of metal mainly made of copper.

The second feature of the present invention is (10) a method of manufacturing a semiconductor device including the steps of: after forming a semiconductor element on a front surface side of a substrate, forming a metal wiring on the substrate and forming a circuit wiring made of the metal wiring, electrically connected to the semiconductor element, and constituting part of a circuit network; and before a step of forming an opening of a silicon through electrode from a back surface side of the substrate to inside of a Low-k insulating film, forming the Low-k insulating film so as to bury the metal wiring and the circuit wiring, and a moisture barrier film is formed between the silicon through electrode and the circuit wiring.

In (10), (11) the silicon through electrode is formed by forming an opening from a back surface side of the substrate having the semiconductor element formed on the front surface side thereof and then filling the opening with metal.

In (10), (12) the moisture barrier film has metal wirings formed in two or more different wiring layers and has a connection via connecting the metal wirings formed in upper and lower wiring layers.

In (12), (13) the moisture barrier film constitutes a single or more ring-shaped frame made up of the metal wirings and the connection via, and one or more silicon through electrode may be enclosed in the ring-shaped frame.

In (13), (14) the silicon through electrode is electrically connected to a metal electrode in the ring-shaped frame, and the metal electrode is electrically connected also to outside of the frame.

In (10), (15) a main component of the Low-k insulating film is preferably a compound selected from silicon oxide and hydrocarbon.

In (10), (16) the metal wiring is preferably formed by using any of copper, aluminum, and tungsten as a main component.

In (14), (17) the metal electrode is preferably formed by using any of copper, aluminum, and tungsten as a main component.

In (12), (18) the connection via is preferably formed by using any of copper, aluminum, and tungsten as a main component.

In (10), (19) the silicon through electrode is preferably made of metal mainly made of copper.

The third feature of the present invention is (20) a semiconductor device including: a substrate having a semiconductor element formed on a front surface side thereof; a moisture barrier film formed on the substrate and having metal wirings in plural layers and one or more connection via buried in a Low-k insulating film; and a silicon through electrode formed from a back surface side of the substrate to inside of the Low-k insulating film, and at least a single ring-shaped frame is formed by using the connection via, one or more silicon through electrode is enclosed in the ring-shaped frame, and the metal wirings in plural layers laid out to enclose the silicon through electrode are disposed in the semiconductor device.

In (20), (21) the silicon through electrode is electrically connected to a metal electrode in the ring-shaped frame, and the metal electrode is electrically connected also to outside of the frame.

In (20), (22) a main component of the Low-k insulating film is preferably a compound selected from silicon oxide and hydrocarbon.

In (20), (23) the metal wiring is preferably formed by using any of copper, aluminum, and tungsten as a main component.

In (21), (24) the metal electrode is preferably formed by using any of copper, aluminum, and tungsten as a main component.

In (20), (25) the connection via is preferably formed by using any of copper, aluminum, and tungsten as a main component.

In (20), (26) the silicon through electrode is preferably made of metal mainly made of copper.

Effects of the Invention

According to the present invention, in the process of forming the silicon through electrode in the interlayer insulating film using the Low-k material, since the region in which the interlayer insulating film using the Low-k material absorbs moisture can be significantly limited, increase in the dielectric constant of the interlayer insulating film can be prevented, and increase in the resistance of the wiring can also be prevented. Therefore, a highly-reliable semiconductor device whose wiring has good electrical characteristics can be obtained.

BRIEF DESCRIPTIONS OF THE DRAWINGS

FIG. 6 is a schematic layout plan view of the first embodiment of the present invention;

BEST MODE FOR CARRYING OUT THE INVENTION

Hereinafter, embodiments of the present invention will be described with reference to drawings. The drawings are schematically illustrated, and the parts unnecessary for description are omitted.

First Embodiment

Figure 1:
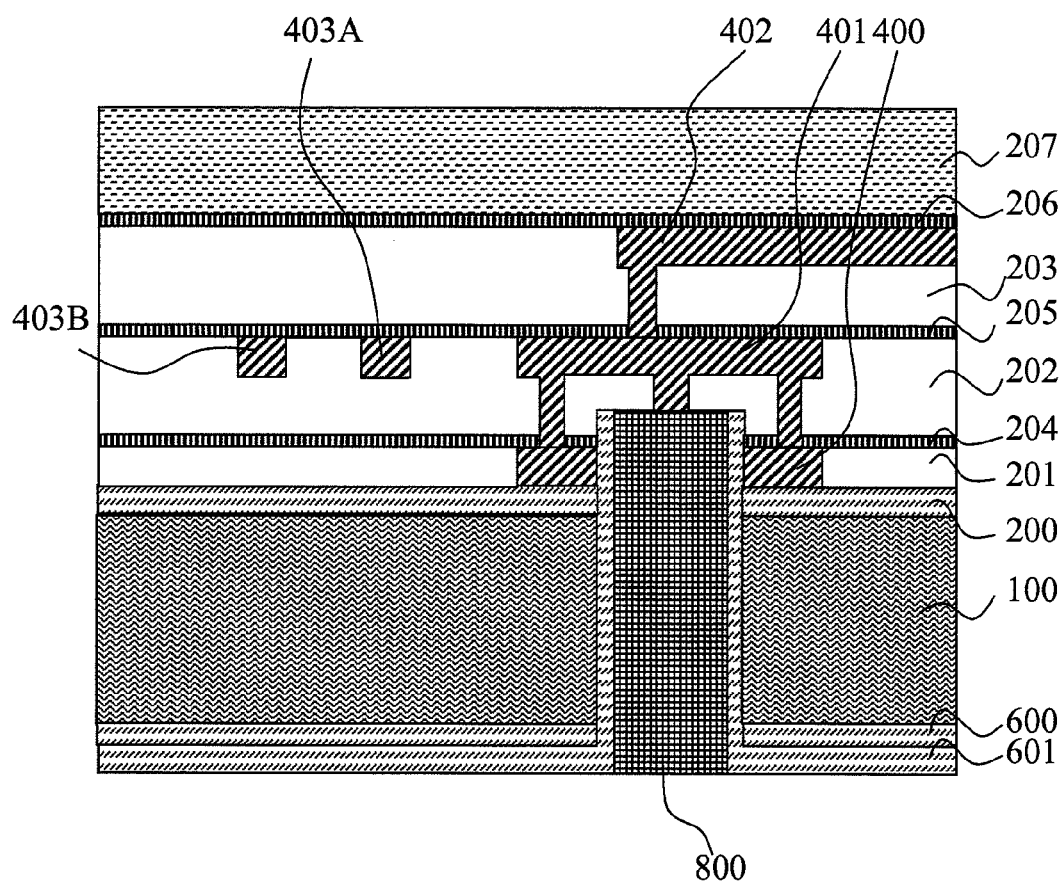
FIG. 1 is a schematic cross-sectional view of a main part of the manufacturing process of a semiconductor device in the first embodiment of the present invention.
Figure 2:
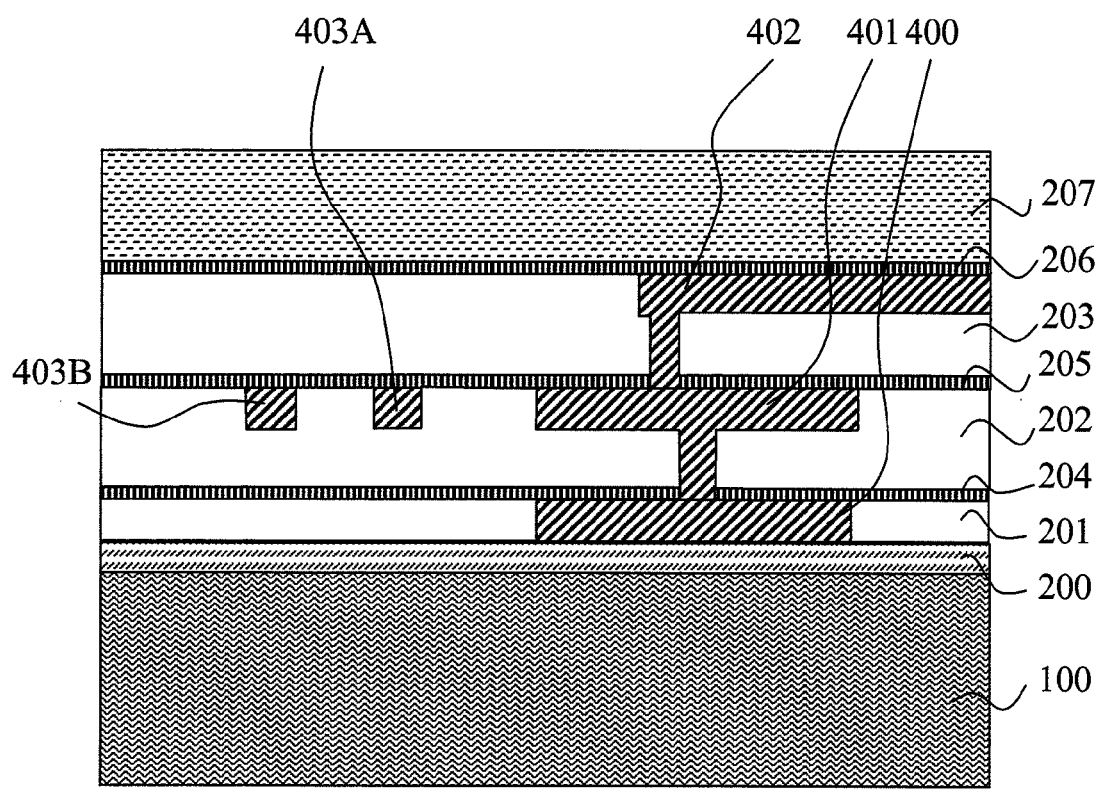
FIG. 2 is a schematic cross-sectional view of the manufacturing process of a semiconductor device of a conventional example.
Figure 3A:
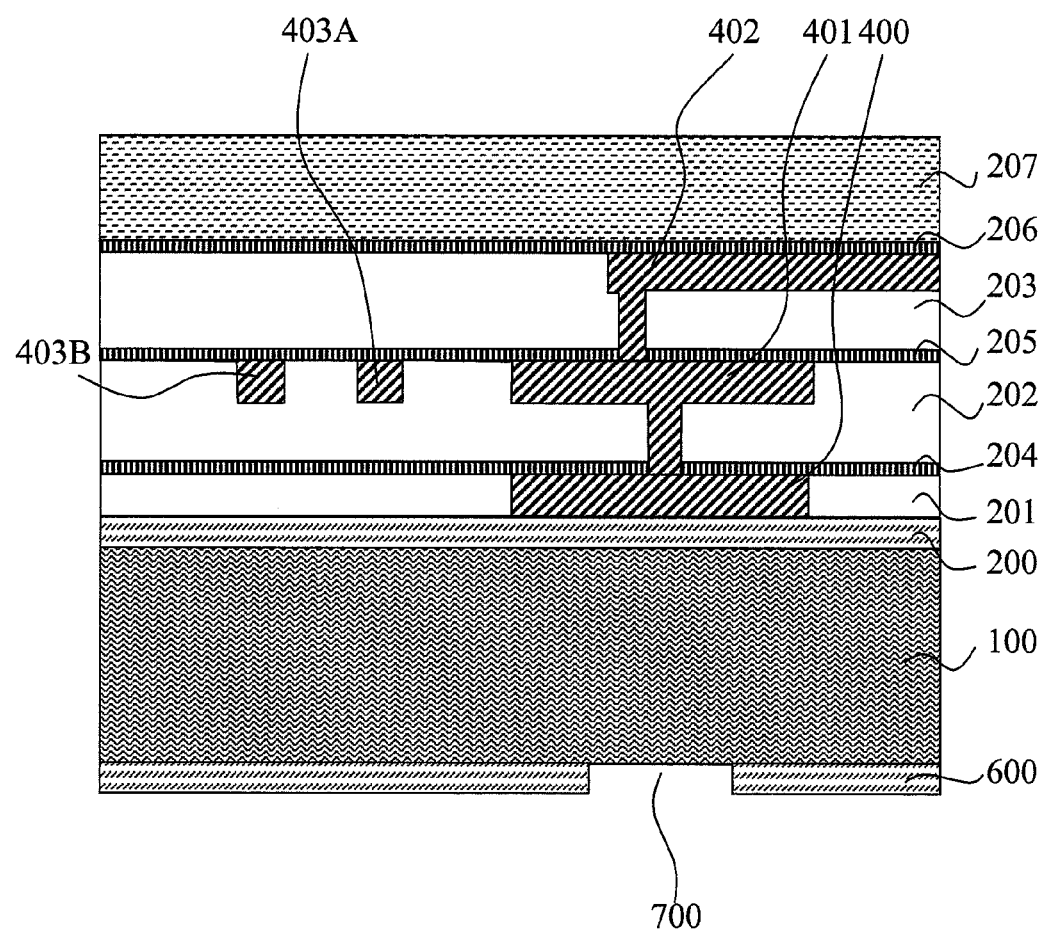
FIG. 3A is a schematic cross-sectional view of a main part of the manufacturing process of the semiconductor device of the conventional example continued from FIG. 2.
Figure 3B:
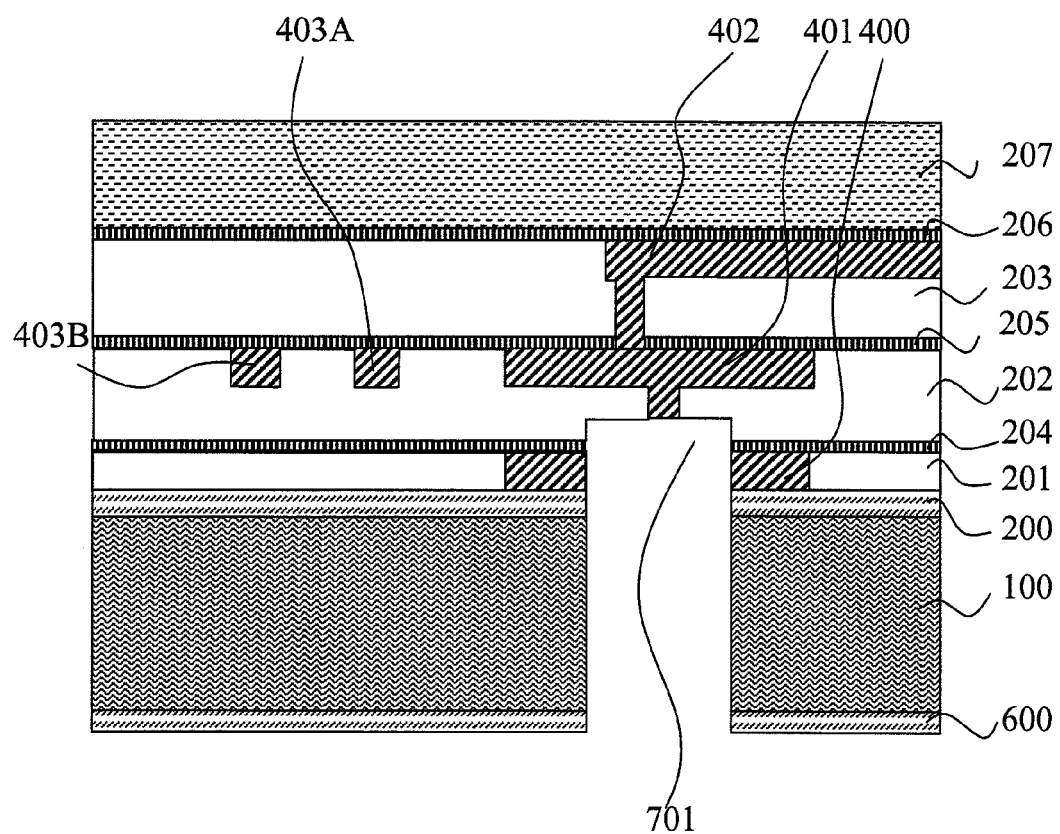
FIG. 3B is a schematic cross-sectional view of the main part of the manufacturing process continued from FIG. 3A.
Figure 3C:
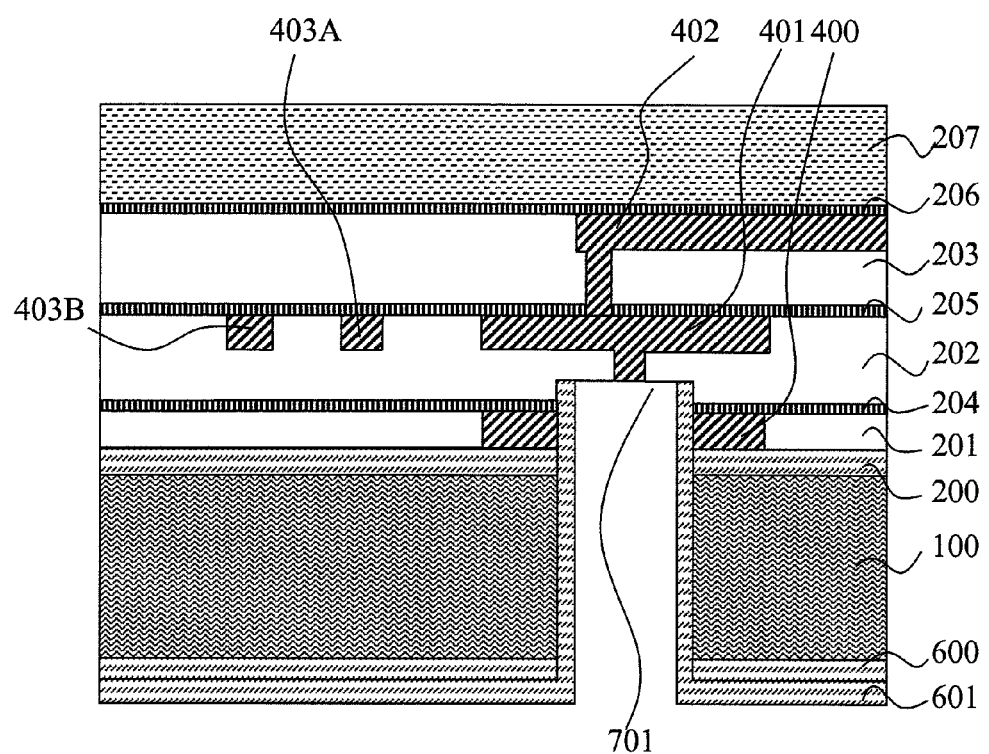
FIG. 3C is a schematic cross-sectional view of the main part of the manufacturing process continued from FIG. 3B.
Figure 3D:
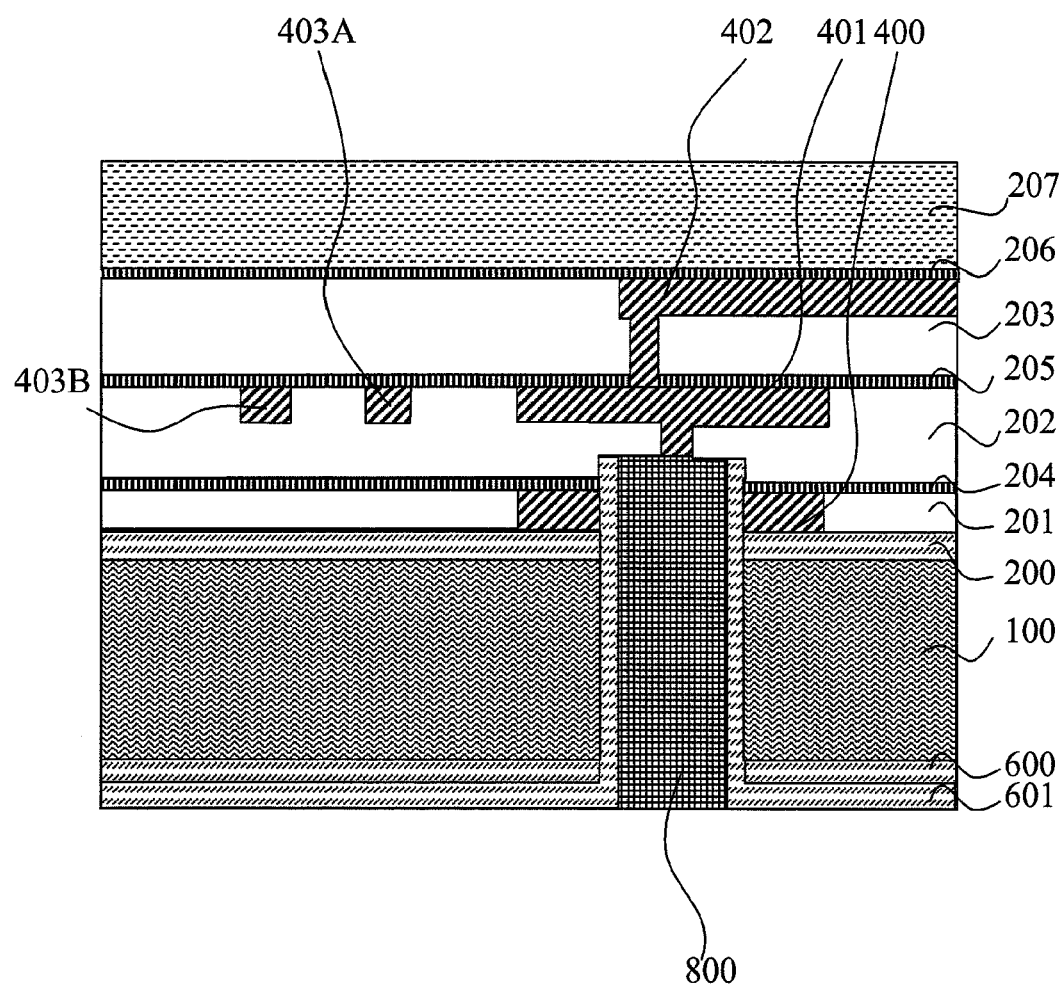
FIG. 3D is a schematic cross-sectional view of the main part of the manufacturing process continued from FIG. 3C.

FIG. 4, FIG. 5, and FIG. 1 are cross-sectional views showing the manufacturing process of a semiconductor device based on the first embodiment of the present invention, and FIG. 6 is a layout plan view of FIG. 1. Hereinafter, the process will be sequentially described.

Figure 4A:
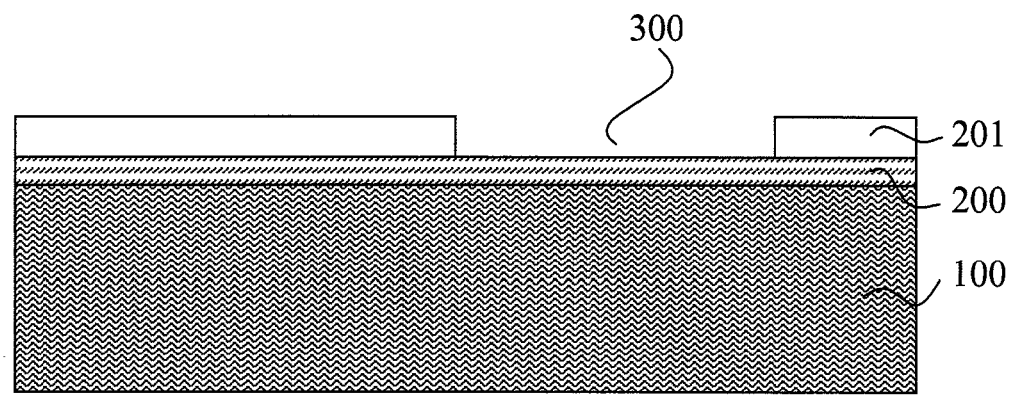
FIG. 4A is a schematic cross-sectional view of a main part of the manufacturing process of a semiconductor device of the first embodiment of the present invention.
Figure 4B:
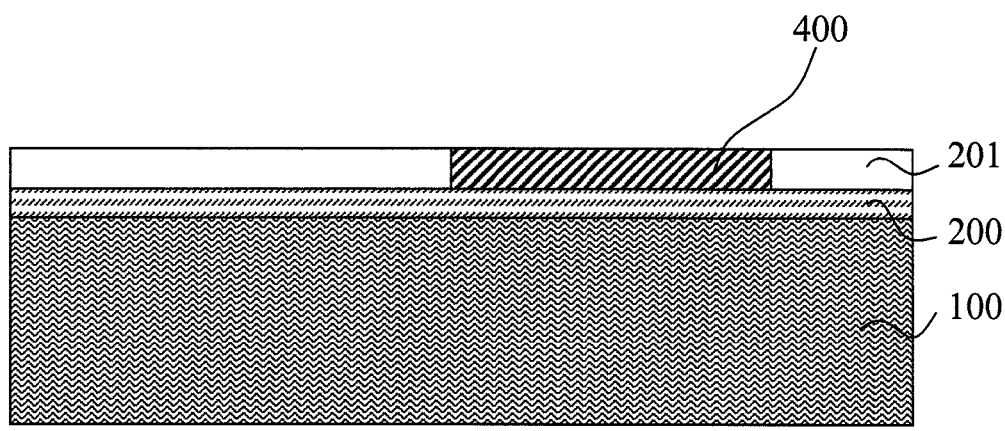
FIG. 4B is a schematic cross-sectional view of the main part of the manufacturing process continued from FIG. 4A.

An under-wiring insulating film 200 made up of a silicon oxide film having a film thickness of 250 nm and silicon nitride having a film thickness of 50 nm is formed on a substrate 100 on which a semiconductor element has been formed, an opening is formed in a desired region of the under-wiring insulating film 200, and a tungsten plug is formed therein by using CVD and chemical mechanical polishing. Then, a first interlayer insulating film 201 using a Low-k material made of carbon-containing silicon oxide (SiOC) and having a film thickness of 100 nm is formed by using plasma CVD, and a first metal wiring opening 300 is formed by using lithography and dry etching at least in a region of the first interlayer insulating film 201 in which metal wiring is desired to be formed (FIG. 4A). Subsequently, after a tantalum film having a film thickness of 50 nm is formed by using sputtering and a copper film is formed by using sputtering and electrolytic plating so as to fill the metal wiring opening 300, the tantalum film and the copper film in the region other than the first metal wiring opening 300 are removed by using chemical mechanical polishing, thereby forming a first metal wiring 400 as shown in FIG. 4B.

Figure 4C:
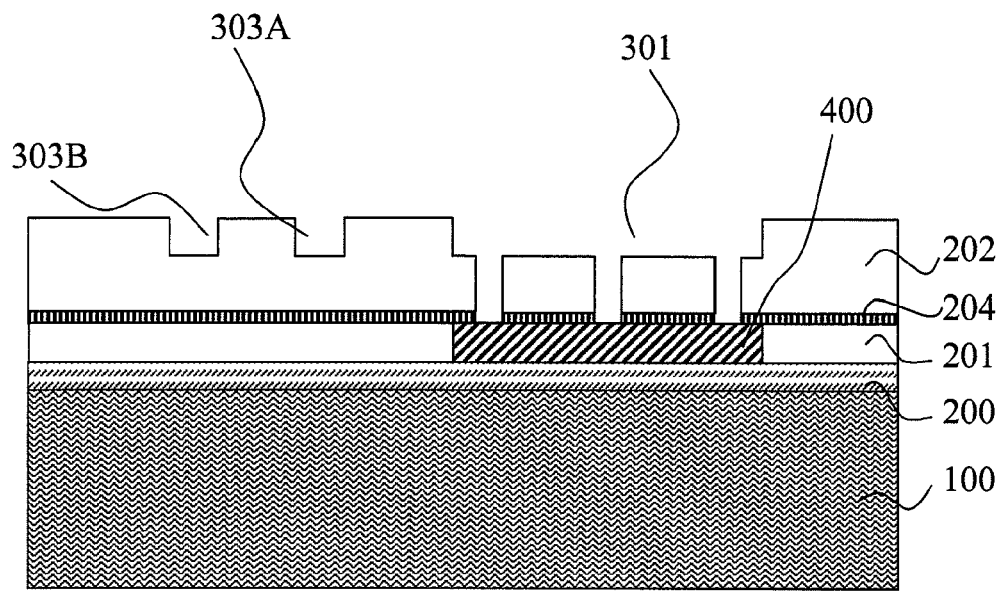
FIG. 4C is a schematic cross-sectional view of the main part of the manufacturing process continued from FIG. 4B.

Then, a first protective insulating film 204 made of nitrogen-containing silicon carbide (SiCN) and having a film thickness of 25 nm is formed by using plasma CVD, and a second interlayer insulating film 202 using a Low-k material made of SiOC and having a film thickness of 250 nm is formed on the first protective insulating film 204 by using plasma CVD. Openings are provided in desired regions of the interlayer insulating film 202 by using lithography and dry etching twice, and the openings are used as a second metal wiring opening 301 and mutually-adjacent parallel metal wiring openings 303A and 303B. In this process, the second metal wiring opening 301 is formed so that part of the first metal wiring 400 is exposed (FIG. 4C).

Figure 4D:
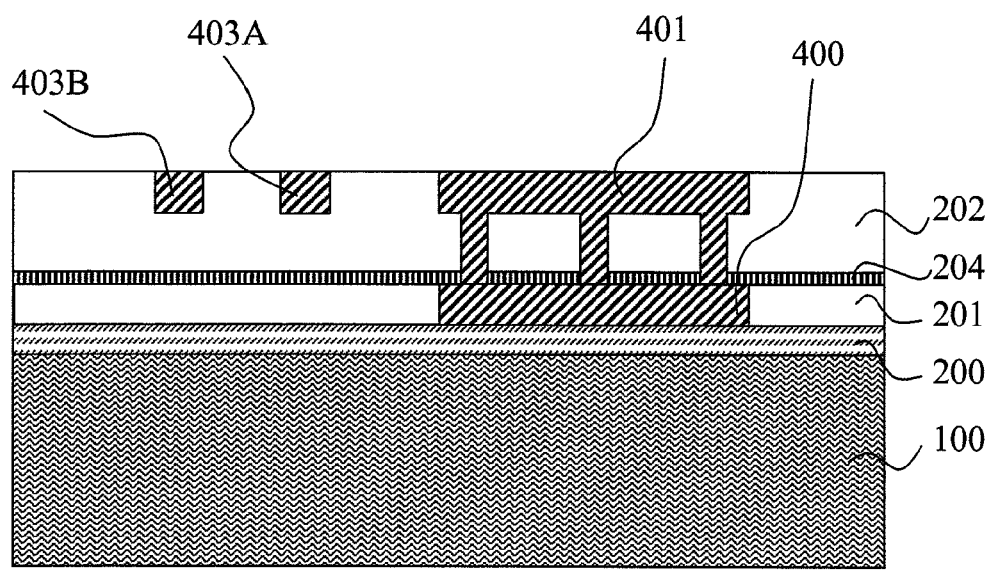
FIG. 4D is a schematic cross-sectional view of the main part of the manufacturing process continued from FIG. 4C.

Then, sequentially, a tantalum film having a film thickness of 50 nm is formed by using sputtering and a copper film having a film thickness of 500 nm is formed by using sputtering and electrolytic plating so as to fill the second metal wiring opening 301 and the mutually-adjacent parallel metal wiring openings 303A and 303B. Thereafter, the tantalum film and the copper film in the region other than the openings are removed by using chemical mechanical polishing, thereby forming a second metal wiring 401 and mutually-adjacent metal wirings 403A and 403B as shown in FIG. 4D.

Figure 4E:
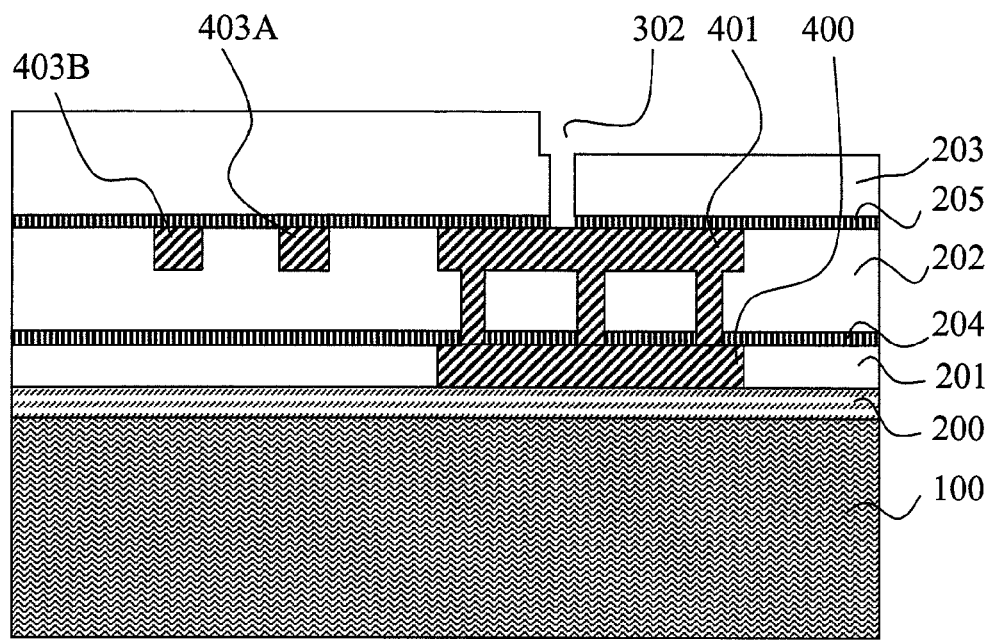
FIG. 4E is a schematic cross-sectional view of the main part of the manufacturing process continued from FIG. 4D.

Then, a second protective insulating film 205 made of SiCN and having a film thickness of 25 nm is formed by using plasma CVD, and a third interlayer insulating film 203 using a Low-k material made of SiOC and having a film thickness of 250 nm is formed on the second protective insulating film 205 by using plasma CVD. An opening is provided in a desired region of the interlayer insulating film 203 by using lithography and dry etching twice so that the second metal wiring 401 is exposed therefrom, and the opening is used as a third metal wiring opening 302 (FIG. 4E).

Then, sequentially, a tantalum film having a film thickness of 50 nm is formed by using sputtering and a copper film having a film thickness of 500 nm is formed by using sputtering and electrolytic plating so as to fill the third metal wiring opening 302. Thereafter, the tantalum film and the copper film in the region other than the opening are removed by using chemical mechanical polishing, thereby forming a third metal wiring 402.

Figure 4F:
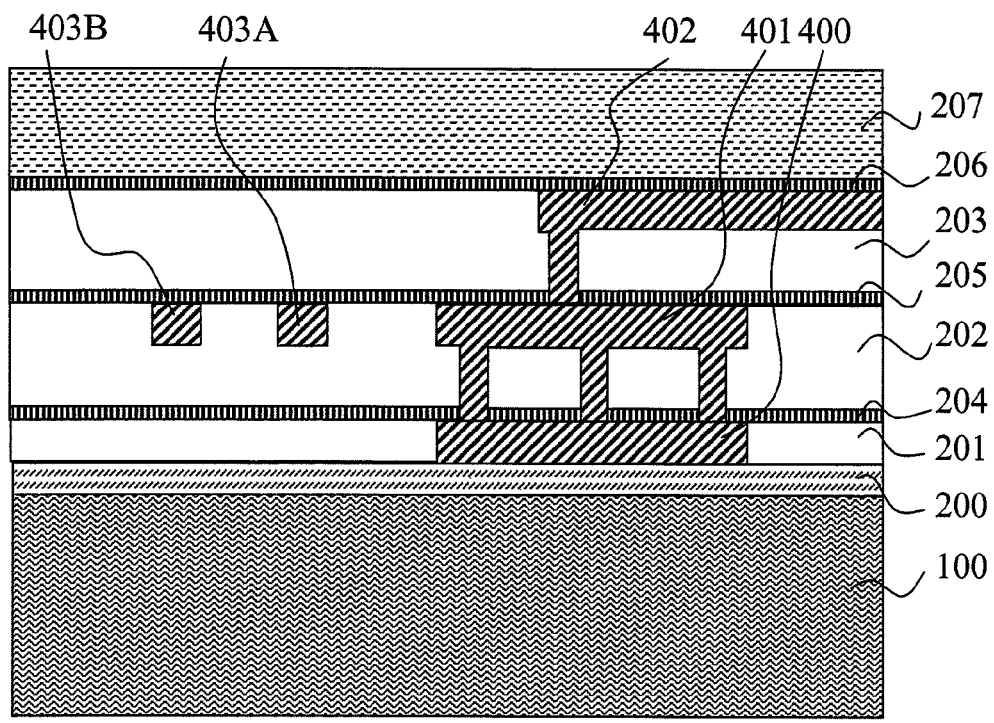
FIG. 4F is a schematic cross-sectional view of the main part of the manufacturing process continued from FIG. 4E.

Then, a third protective insulating film 206 made of SiCN and having a film thickness of 25 nm is formed by using plasma CVD, an opening is formed by using lithography and dry etching at least in a region of the third protective insulating film 206 in which a metal pad is desired to be formed so that the metal wiring in the lower layer is exposed therefrom, a titanium nitride film having a film thickness of 50 nm and an aluminum film having a film thickness of 500 nm are formed by using sputtering so as to cover the opening, and the titanium nitride film and the aluminum film in the region other than the desired region are removed by using lithography and dry etching, thereby forming an aluminum pad made of titanium nitride and aluminum. Then, a silicon oxide film having a film thickness of 200 nm and a silicon nitride film having a film thickness of 250 nm are formed by using plasma CVD, an opening is formed by using lithography and dry etching so that the aluminum pad is exposed therefrom, and a passivation film 207 made up of a silicon oxide film and a silicon nitride film as shown in FIG. 4F is formed. A semiconductor device having a multilayer wiring can be formed through the above-described process.

Figure 5A:
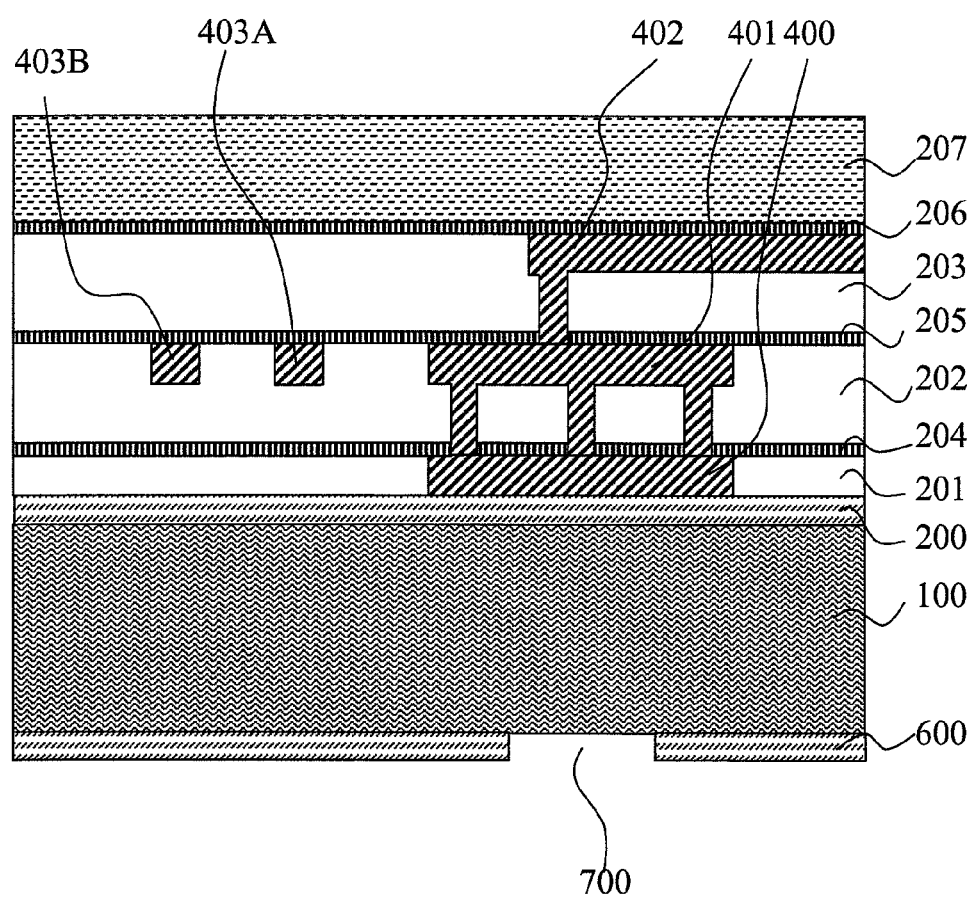
FIG. 5A is a schematic cross-sectional view of the main part of the manufacturing process of the semiconductor device of the first embodiment of the present invention continued from FIG. 4F.

Then, in the semiconductor device having the multilayer wiring, as shown in FIG. 5A, a first back-surface insulating film 600 made of silicon oxide is formed by plasma CVD on the back surface of the substrate 100, on which the semiconductor element has been formed. Thereafter, an opening is formed in a region of the first back-surface insulating film 600 in which a silicon through electrode is desired to be formed by using lithography and dry etching, thereby forming a first back-surface insulating-film opening 700.

Figure 5B:
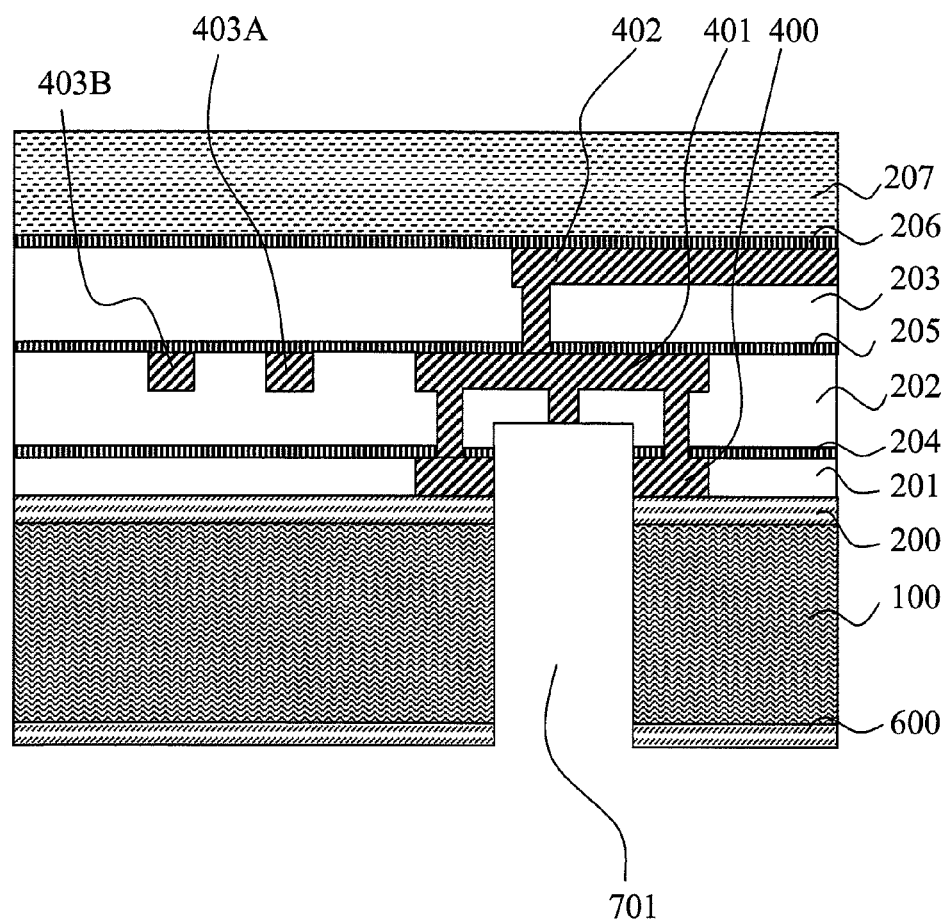
FIG. 5B is a schematic cross-sectional view of the main part of the manufacturing process continued from FIG. 5A.

Then, dry etching is carried out with using the back-surface insulating film as an etching mask until the etching penetrates through at least the substrate 100 on which the semiconductor device has been formed, and reaches the first metal wiring 400, thereby forming a silicon through hole 701 as shown in FIG. 5B.

Figure 5C:
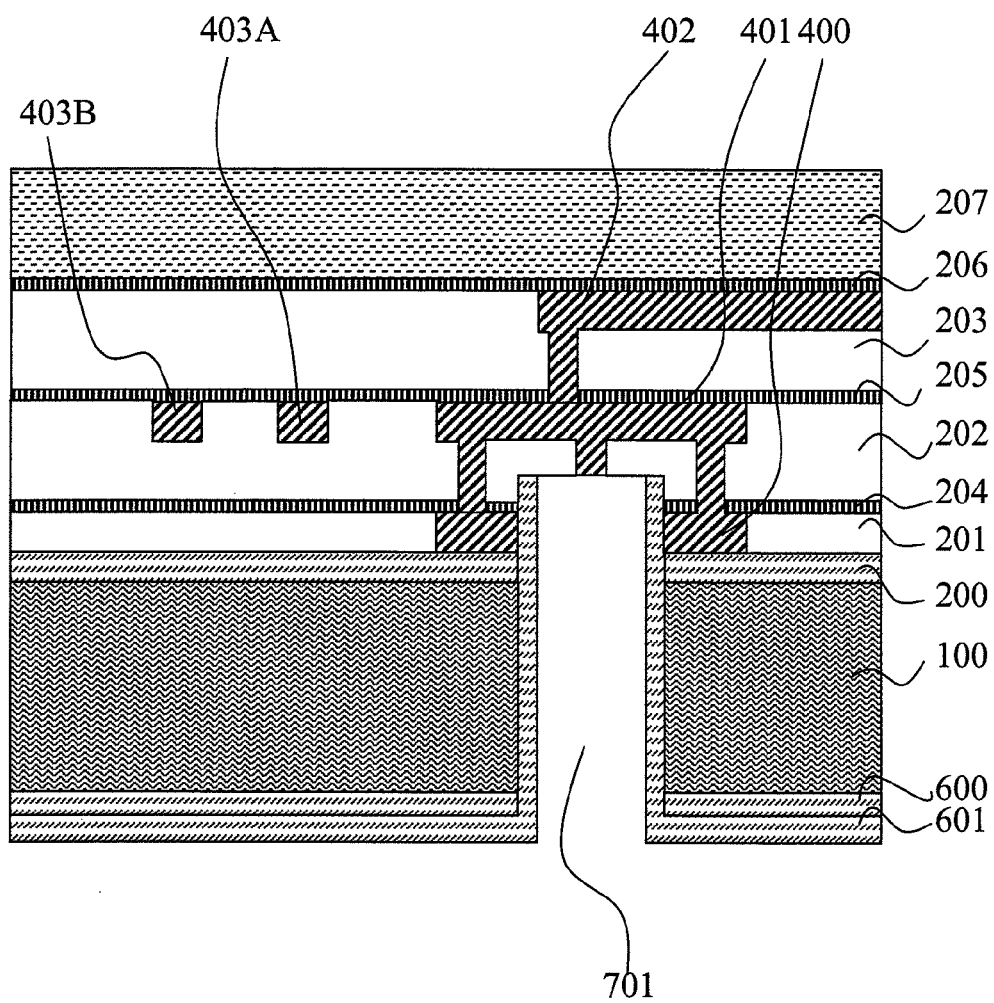
FIG. 5C is a schematic cross-sectional view of the main part of the manufacturing process continued from FIG. 5B.

Then, after a silicon oxide film having a film thickness of 1 μm is formed by plasma CVD so as to cover the silicon through hole 701, full-surface etch back is carried out, thereby forming a second back-surface insulating film 601 having a sidewall insulating film on the sidewall of the silicon through hole as shown in FIG. 5C.

Then, a tantalum film having a film thickness of 50 nm and a plating seed film made of copper and having a film thickness of 50 nm are sequentially formed by using sputtering, and the silicon through hole 701 is completely filled with copper by using electrolytic plating. Thereafter, the tantalum film and the copper film in the region other than the silicon through hole 701 are removed by using chemical mechanical polishing, thereby forming the semiconductor device having a silicon through electrode 800 formed from the back surface of the substrate, on which the semiconductor element has been formed, as shown in FIG. 1.

FIG. 6 shows part (the silicon through hole, the first and second metal wirings, the first connection via, and the mutually-adjacent parallel metal wirings) in the layout plan view of the semiconductor device formed by the above-described process. The cross-sectional view shown in FIG. 1 is a cross section taken along the line A-A' in FIG. 6. In FIG. 6, connection via regions 505A, 505B, 505C, and 505D constituting the second metal wiring form a ring-shaped frame 505 and enclose a silicon through-hole region 550. Herein, the length of each of the connection via regions 505A, 505B, 505C, and 505D constituting the second metal wiring in a short-side direction is 100 nm. Moreover, the ring-shaped frame 505 is disposed so as to be completely enclosed in a first metal wiring region 500 and a second metal wiring region 501. Furthermore, an adjacent parallel metal wiring region 503A and an adjacent parallel metal wiring region 503B are laid outside the ring-shaped frame 505.

As a comparative example of the first embodiment, a structure without the ring-shaped frame 505 is also fabricated. There is no difference in the layout and manufacturing process except for the presence/absence of the ring-shaped frame.

The performance of the semiconductor device formed in this manner is checked. When the interwiring capacitance between the adjacent parallel metal wiring 503A and the adjacent parallel metal wiring 503B is measured, the interwiring capacitance is increased by 15% in the semiconductor device in which the ring-shaped frame 505 is not provided compared with the case in which the ring-shaped frame 505 is provided. Aside from this, when the resistance of a connection via chain provided in the same layer as the first metal wiring 500 and the second metal wiring 501 is measured, the resistance of the via chain is increased by 15% in the semiconductor device in which the ring-shaped frame 505 is not provided compared with the case in which the ring-shaped frame 505 is provided. When TEM (Transmission-type Electron Microscope) observation of the connection via part of both samples is carried out in order to determine the reason why the resistance is increased, part of tantalum of barrier metal at the bottom of the connection via is oxidized in the sample without the ring-shaped frame. On the other hand, in the sample with the ring-shaped frame, it is found out that tantalum of the barrier metal at the bottom of the connection via is not oxidized. As a result of detailed study, it is found out that the oxidization of tantalum is due to moisture diffused through the Low-k material of the interlayer insulating film.

In other words, the semiconductor device having the wiring having low parasitic capacitance and low via resistance in the circuit region in the vicinity of the silicon through hole can be formed by forming metal wirings in plural layers so as to completely enclose the region in which the silicon through hole is formed, and further forming the ring-shaped structure so as to enclose the silicon through hole by using the connection vias between the metal wirings according to the present embodiment.

Also, the semiconductor device having the wiring having low parasitic capacitance and low via resistance in the circuit region in the vicinity of the silicon through hole can be formed by forming a film through which moisture is hard to pass such as a metal wiring or an under-wiring insulating film between the interlayer insulating film using the Low-k material exposed from the opening of the silicon through hole and the interlayer insulating film using the Low-k material formed in the circuit wiring region according to the present embodiment.

In the present embodiment, two layers of metal wirings, that is, the first metal wiring 400 and the second metal wiring 401 are used as moisture barrier films for preventing moisture absorption of the Low-k material. However, three or more wiring layers can also be utilized. The larger the number of used wiring layers, the larger the margin with respect to the overetching can be made in the etching for forming the opening of the silicon through via. On the other hand, since the region in which the moisture barrier film is formed cannot be used as a circuit wiring, the layout of wiring is restricted.

In the present embodiment, etching of the silicon through hole 701 is stopped at an intermediate part of the second interlayer insulating film 202 using the Low-k material. However, the effectiveness of the present invention is not limited to this case. Since the condition for making the silicon through electrode function is that the etching penetrates through at least the substrate 100 on which the semiconductor device has been formed and reaches the first metal wiring 400, etching may proceed to the upper wiring layer of the second interlayer insulating film 202 using the Low-k material. However, if etching proceeds to the third interlayer insulating film 203 using the Low-k material or above and the Low-k material and the silicon through hole 701 are in contact with each other, in order to limit the region in which moisture permeates to the Low-k material, the ring-shaped frame 505 in FIG. 6 has to be provided also in the upper wiring layer to which etching of the silicon through hole 701 reaches.

Moreover, in the present embodiment, the third metal wiring 402 is used as a method for extracting the wiring which is electrically connected to the silicon through electrode 800. However, the wiring may be extracted by the second metal wiring layer.

Moreover, in the present embodiment, tantalum and copper are used as the materials of the ring-shaped frame 505. However, other materials can be used as long as the effect of preventing passage of moisture can be expected by the materials like SiCN. When a metal is used as a material of the ring-shaped frame, the effect of preventing passage of moisture can be expected if the ring-shaped frame has a thickness of about 10 nm. Furthermore, in the layout plan view, the shape of the ring-shaped frame is not required to be quadrangular, and may surround the periphery of the silicon through electrode a plurality of times.

Moreover, in the present embodiment, the metal wiring does not have an opening. However, the metal wiring is not necessarily required to have no opening. For example, part of the metal wiring may include an opening in order to improve flatness.

The first, second, and third metal wirings use the material mainly made of copper in the present embodiment, but may use a material mainly made of tungsten.

The first, second, and third metal wirings use tantalum as barrier metal in the present embodiment, but the material is not limited thereto. For example, a tantalum compound, titanium, tungsten, ruthenium, manganese, or a compound thereof can be used. Furthermore, a plurality of films may be stacked in the structure of the barrier metal.

In the present embodiment, the interlayer insulating film uses the insulating film made of SiOC formed by using plasma CVD. However, the effects of the present invention are not limited to this material. Similar effects can be expected even by a porous Low-k film or an organic Low-k film. A method other than CVD can also be used as a film formation method.

In the present embodiment, insulating films made of SiCN formed by using plasma CVD are used as the material of the first, second, and third protective insulating films. However, the material is not limited thereto. For example, SiN, SiC, and a stacked structure thereof may be used.

Second Embodiment

FIG. 7 and FIG. 8 are cross-sectional views showing the manufacturing process of a semiconductor device based on the second embodiment of the present invention. Hereinafter, the process will be sequentially described.

Figure 7A:
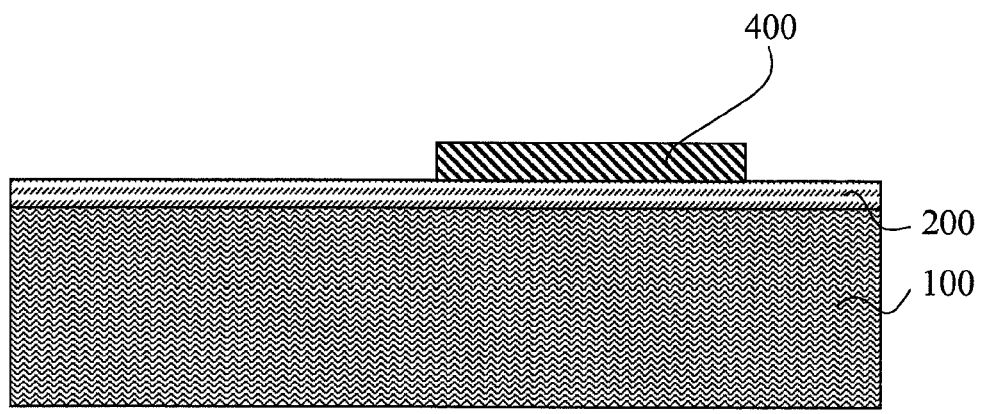
FIG. 7A is a schematic cross-sectional view of a main part of the manufacturing process of a semiconductor device of the second embodiment of the present invention.

An under-wiring insulating film 200 made up of a silicon oxide film having a film thickness of 250 nm and silicon nitride having a film thickness of 50 nm is formed on a substrate 100 on which a semiconductor element has been formed, an opening is provided in a desired region of the under-wiring insulating film 200, and a tungsten plug is formed therein by using CVD and chemical mechanical polishing. Then, a stacked structure of a titanium nitride film having a film thickness of 50 nm, an aluminum film having a film thickness of 300 nm, and a titanium nitride film having a film thickness of 50 nm is formed by using sputtering, and the titanium nitride film and the aluminum film in the region other than the region in which a metal wiring is desired to be formed are removed by using lithography and dry etching, thereby forming a first metal wiring 400 made of titanium nitride and aluminum (FIG. 7A).

Figure 7B:
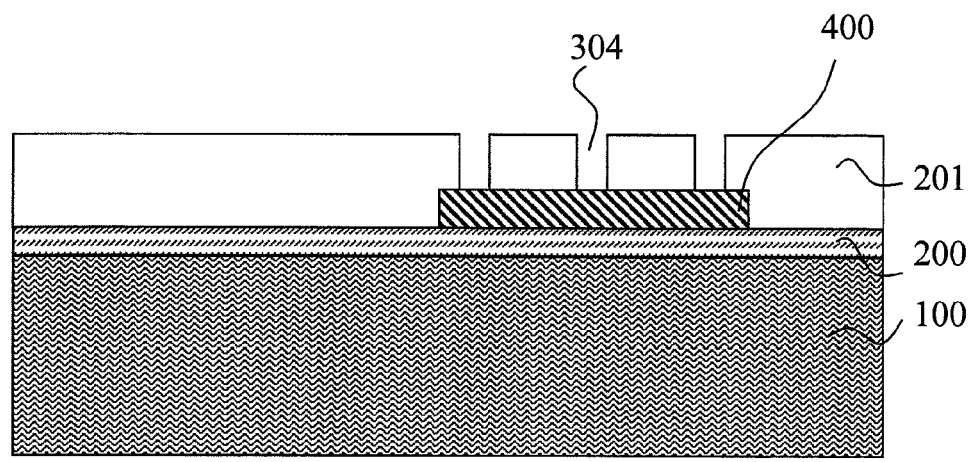
FIG. 7B is a schematic cross-sectional view of the main part of the manufacturing process continued from FIG. 7A.

Then, after a carbon-containing silicon oxide (SiOC) having a film thickness of 750 nm is formed, the surface thereof is planarized by using chemical mechanical polishing, thereby forming a first interlayer insulating film 201. An opening is provided in a desired region in the first interlayer insulating film 201 using the Low-k material, thereby forming a first connection via opening 304. In this process, the first connection via opening 304 is formed so that part of the first metal wiring 400 is exposed (FIG. 7B).

Figure 7C:
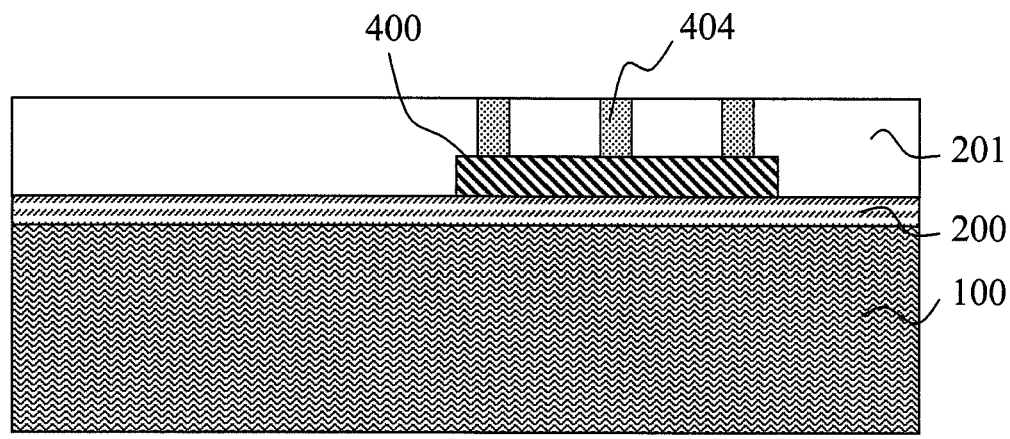
FIG. 7C is a schematic cross-sectional view of the main part of the manufacturing process continued from FIG. 7B.

Then, after a tungsten film is formed by using sputtering and CVD so as to fill the first connection via opening 304, the tungsten film in the region other than the opening is removed by using chemical mechanical polishing, thereby forming a first connection via 404 as shown in FIG. 7C.

Figure 7D:
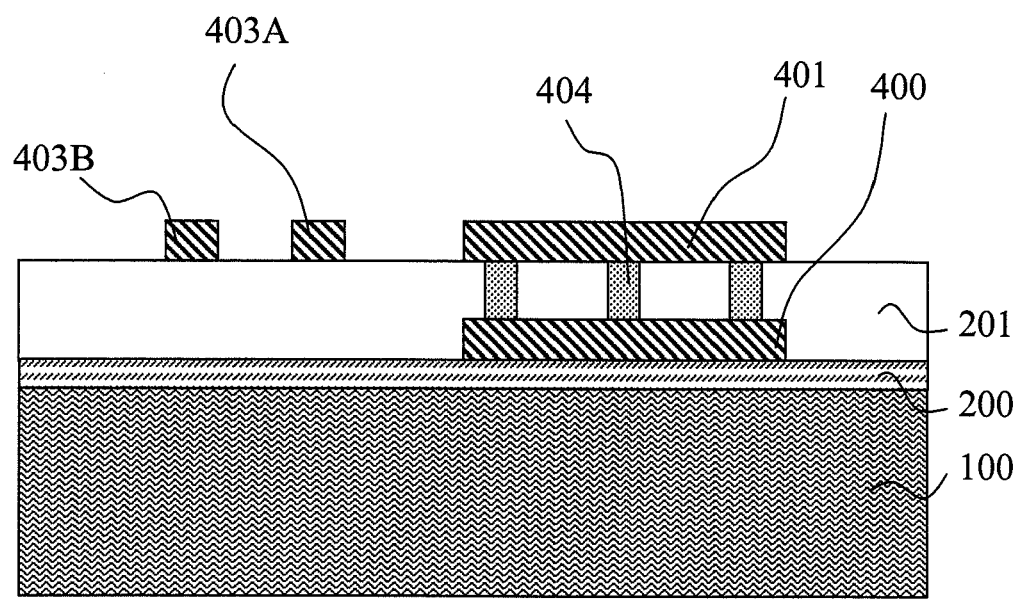
FIG. 7D is a schematic cross-sectional view of the main part of the manufacturing process continued from FIG. 7C.

Then, a stacked structure of a titanium nitride film having a film thickness of 50 nm, an aluminum film having a film thickness of 300 nm, and a titanium nitride film having a film thickness of 50 nm is formed by using sputtering, and the titanium nitride film and the aluminum film in the region other than the region in which a metal wiring is desired to be formed are removed by using lithography and dry etching, thereby forming a second metal wiring 401, an adjacent parallel metal wiring 403A, and an adjacent parallel metal wiring 403B made of titanium nitride and aluminum. In this process, the second metal wiring 401 is formed so as to cover the first connection via 404 (FIG. 7D).

Figure 7E:
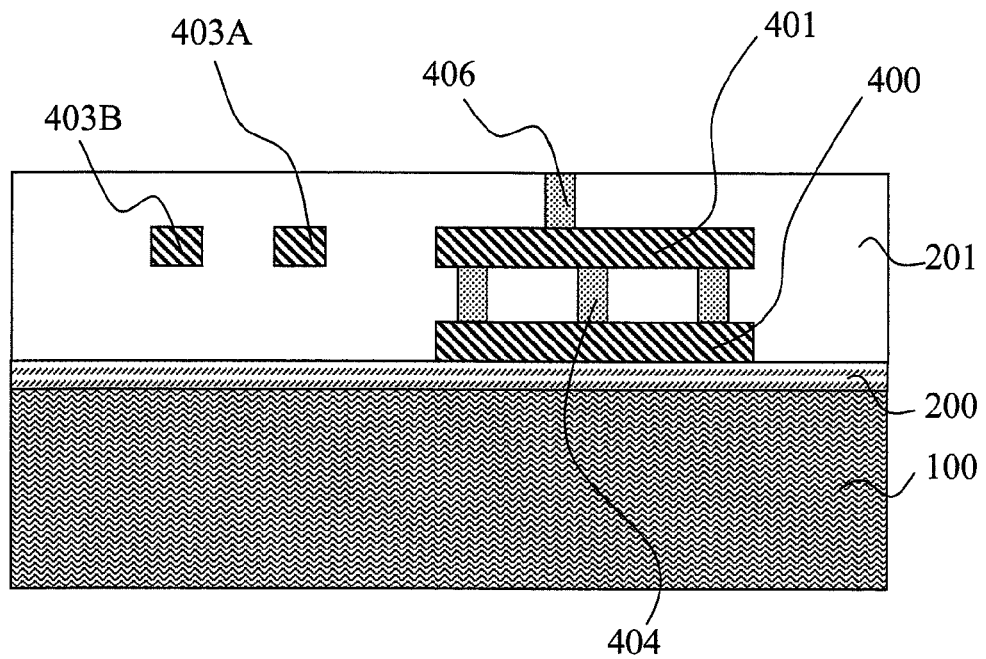
FIG. 7E is a schematic cross-sectional view of the main part of the manufacturing process continued from FIG. 7D.

Then, after an interlayer insulating film made of carbon-containing silicon oxide (SiOC) and having a film thickness of 750 nm is formed, the surface thereof is planarized by using chemical mechanical polishing. In the interlayer insulating film, an opening is formed in a region in which a connection via is desired to be formed. In this process, the opening is formed so that part of the second metal wiring 401 is exposed therefrom. After a tungsten film is formed by using sputtering and CVD so as to fill the opening, the tungsten film in the region other than the opening is removed by using chemical mechanical polishing, thereby forming a second connection via 406 as shown in FIG. 7E.

Figure 7F:
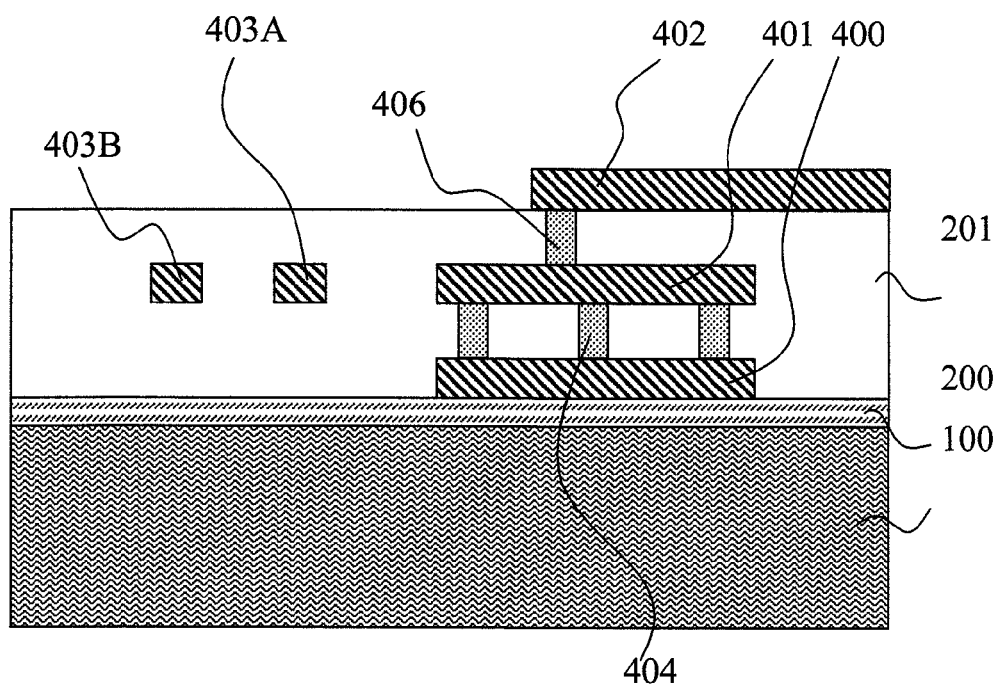
FIG. 7F is a schematic cross-sectional view of the main part of the manufacturing process continued from FIG. 7E.

Then, a stacked structure of a titanium nitride film having a film thickness of 50 nm, an aluminum film having a film thickness of 300 nm, and a titanium nitride film having a film thickness of 50 nm is formed by using sputtering, and the titanium nitride film and the aluminum film in the region other than the region in which a metal wiring is desired to be formed are removed by using lithography and dry etching, thereby forming a third metal wiring 402 made of titanium nitride and aluminum. In this process, the third metal wiring 402 is formed so as to cover the second connection via 406 (FIG. 7F).

Figure 7G:
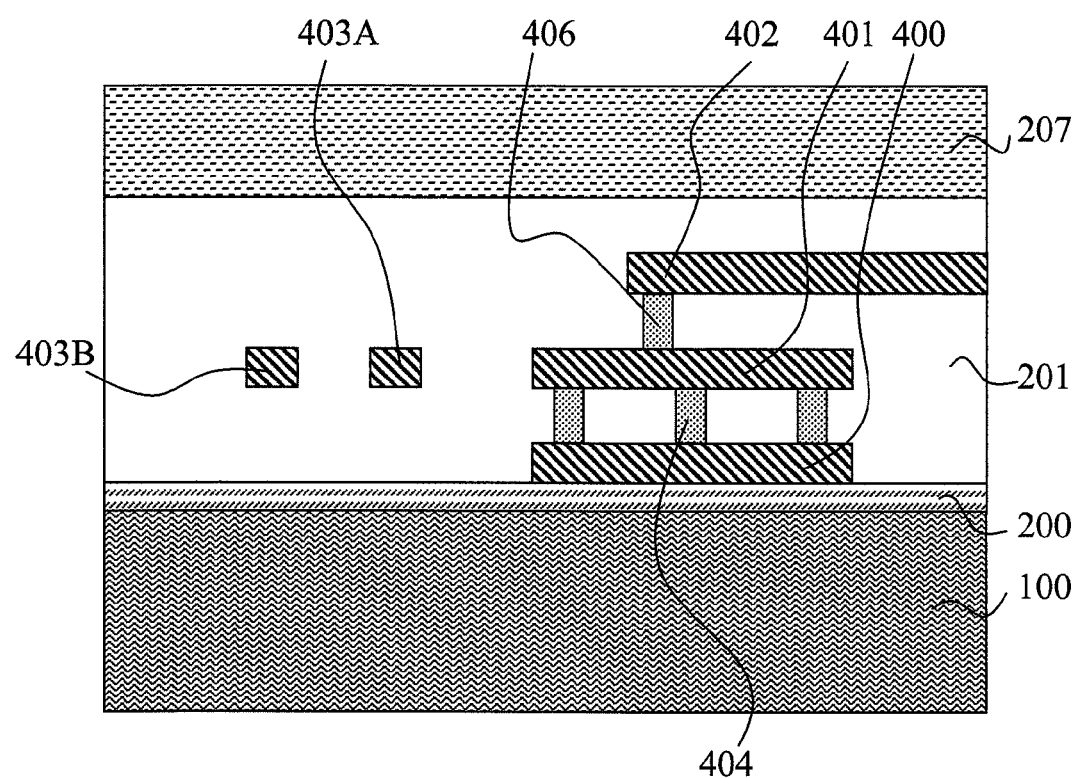
FIG. 7G is a schematic cross-sectional view of the main part of the manufacturing process continued from FIG. 7F.

Then, an interlayer insulating film made of carbon-containing silicon oxide (SiOC) and having a film thickness of 750 nm is formed, and the surface thereof is planarized by using chemical mechanical polishing. Thereafter, at least in a region of the interlayer insulating film in which a metal pad is desired to be formed, an opening is formed so as to expose the third metal wiring 402 by using lithography and dry etching. A titanium nitride film having a film thickness of 50 nm and an aluminum film having a film thickness of 500 nm are formed by sputtering so as to cover the opening, and the titanium nitride film and the aluminum film in the region other than a desired region are removed by using lithography and dry etching, thereby forming an aluminum pad made of titanium nitride and aluminum. Then, a passivation film 207 made up of a silicon oxide film having a film thickness of 200 nm and a silicon nitride film having a film thickness of 250 nm is formed by using plasma CVD. At this time, an opening is formed by using lithography and dry etching so that the aluminum pad is exposed in a desired region. The semiconductor device having multilayer wiring as shown in FIG. 7G can be formed through the above-described process.

Figure 8A:
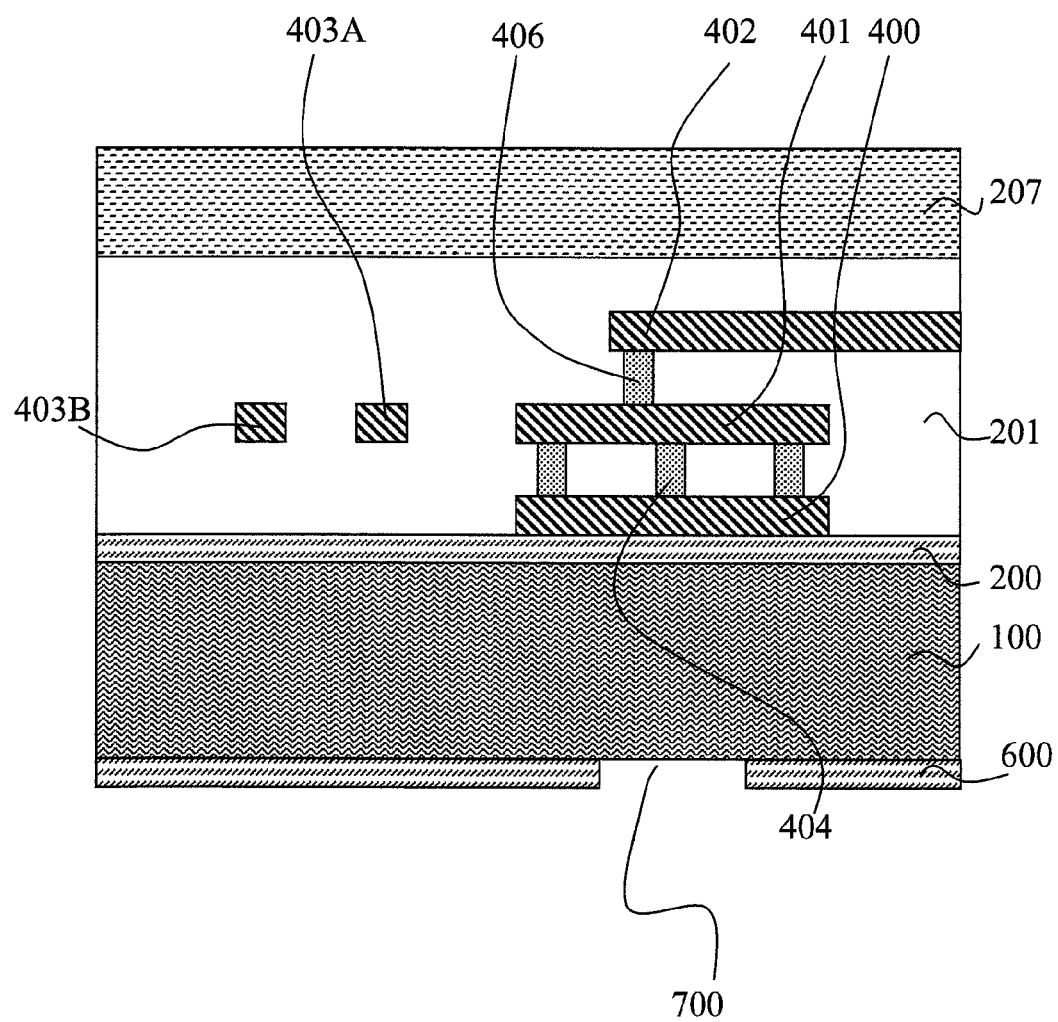
FIG. 8A is a schematic cross-sectional view of the main part of the manufacturing process of the semiconductor device of the second embodiment of the present invention continued from FIG. 7G.

Then, to the semiconductor device having the above-described multilayer wiring, as shown in FIG. 8A, a first back-surface insulating film 600 made of silicon oxide is formed on the back surface of the substrate 100 on which the semiconductor element has been formed by plasma CVD. Thereafter, an opening is formed by using lithography and dry etching in a region of the first back-surface insulating film 600 in which a silicon through electrode is desired to be formed, thereby forming a first back-surface insulating-film opening 700.

Figure 8B:
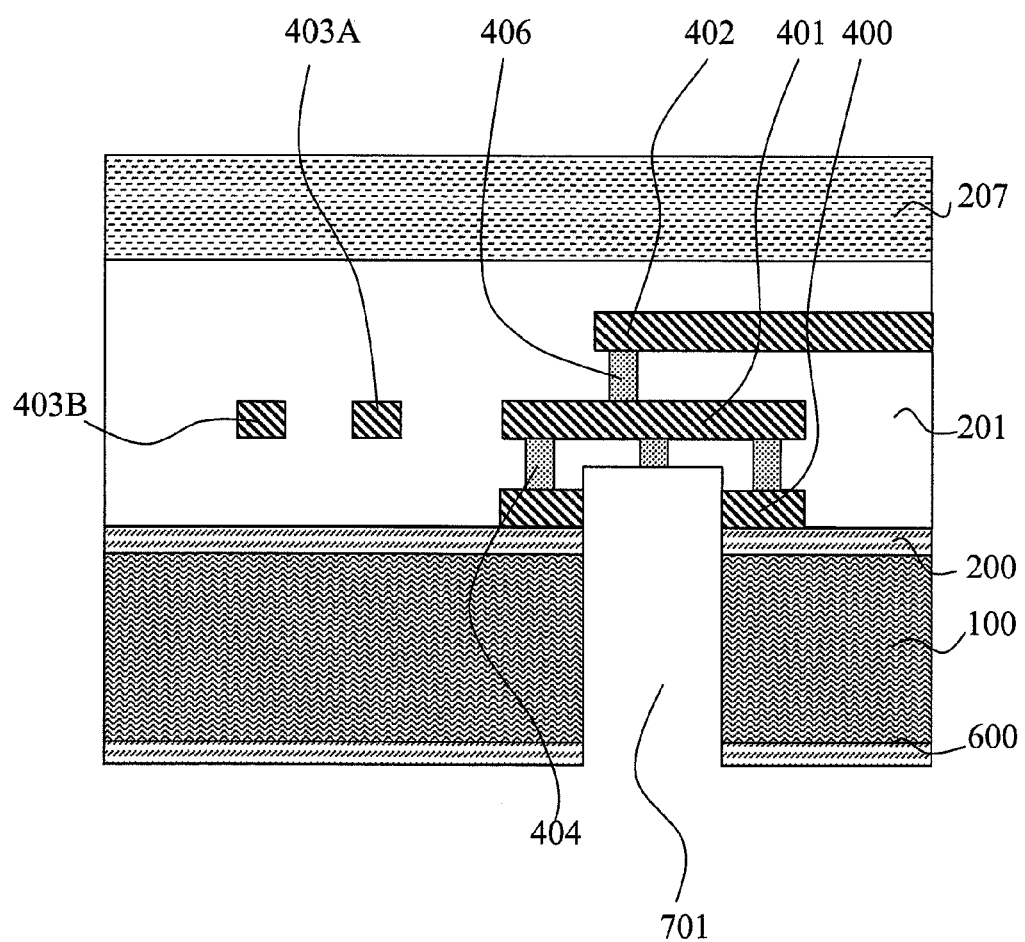
FIG. 8B is a schematic cross-sectional view of the main part of the manufacturing process continued from FIG. 8A.

Then, dry etching is carried out with using the back-surface insulating film as an etching mask until the etching penetrates through at least the substrate 100 on which the semiconductor device has been formed, and reaches at least the first metal wiring 400, thereby forming a silicon through hole 701 as shown in FIG. 8B.

Figure 8C:
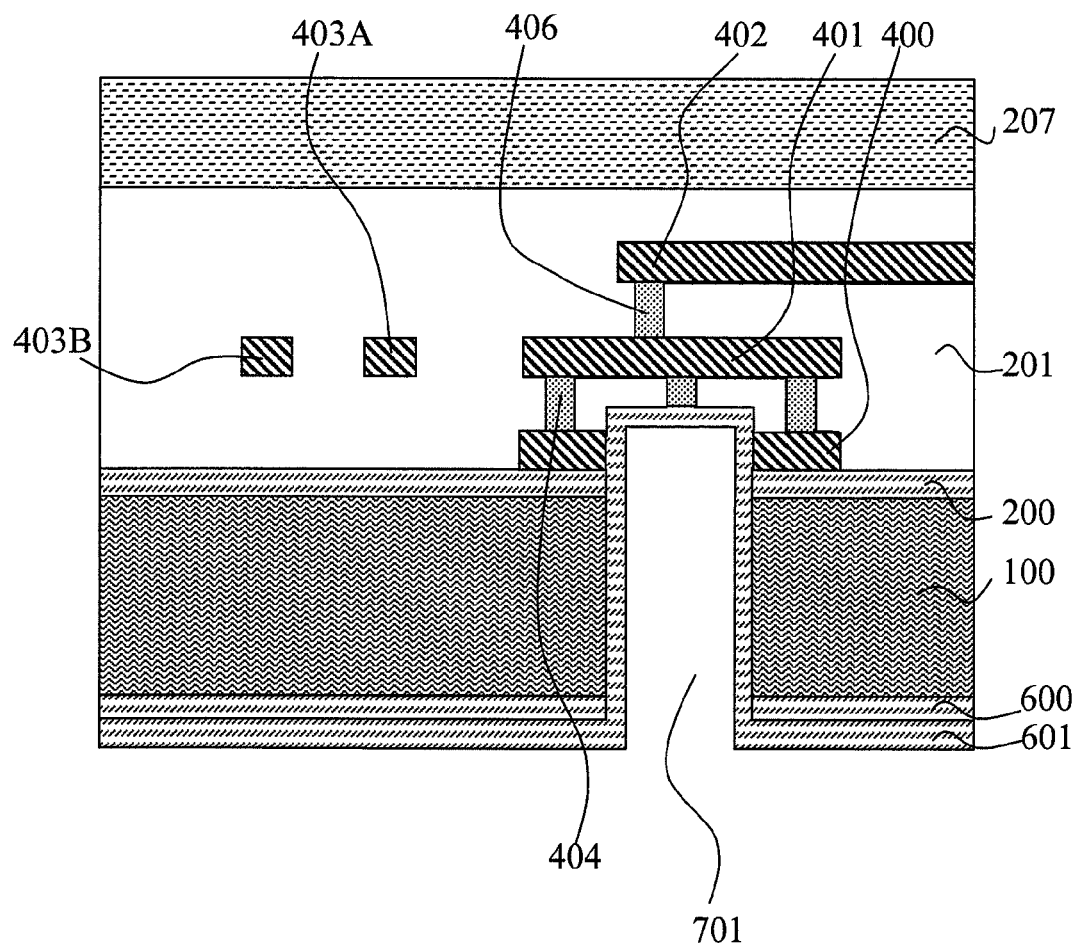
FIG. 8C is a schematic cross-sectional view of the main part of the manufacturing process continued from FIG. 8B.
Figure 8D:
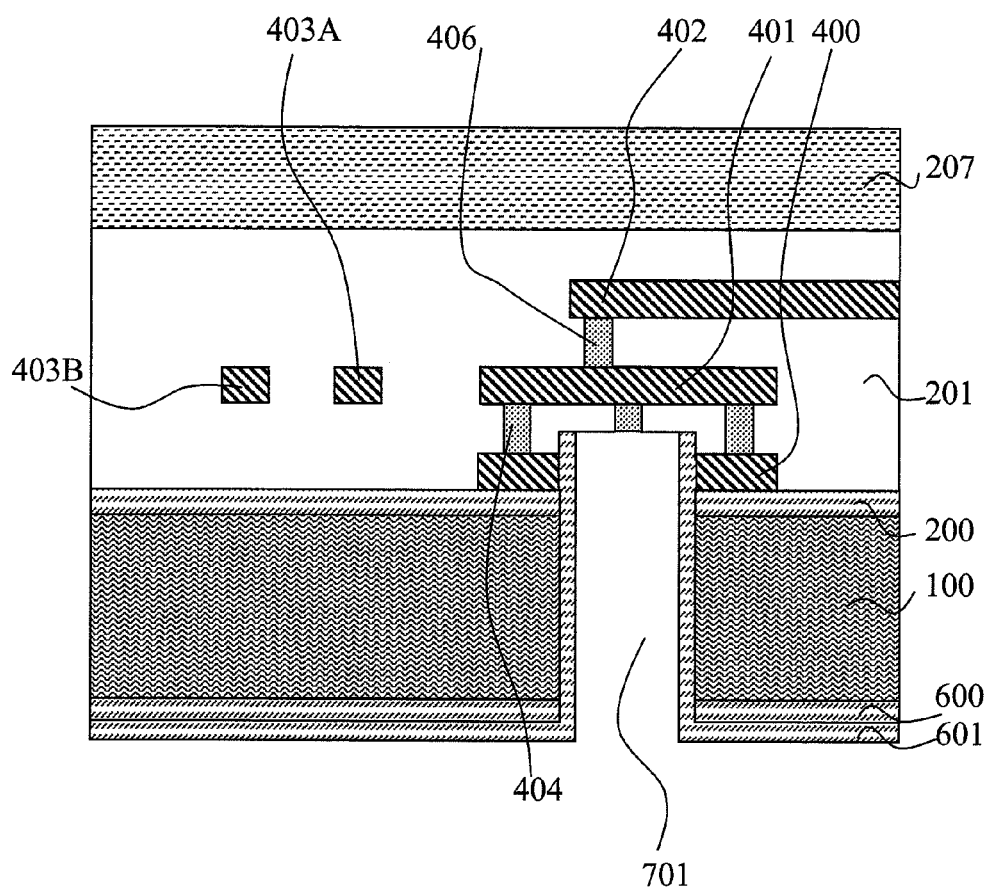
FIG. 8D is a schematic cross-sectional view of the main part of the manufacturing process continued from FIG. 8C.

Then, as shown in FIG. 8C, a silicon oxide film having a film thickness of 1 μm is formed by plasma CVD so as to cover the silicon through hole 701. Thereafter, full-surface etch back is carried out, thereby forming a second back-surface insulating film 601 having a sidewall insulating film on the sidewall of the silicon through hole as shown in FIG. 8D.

Figure 8E:
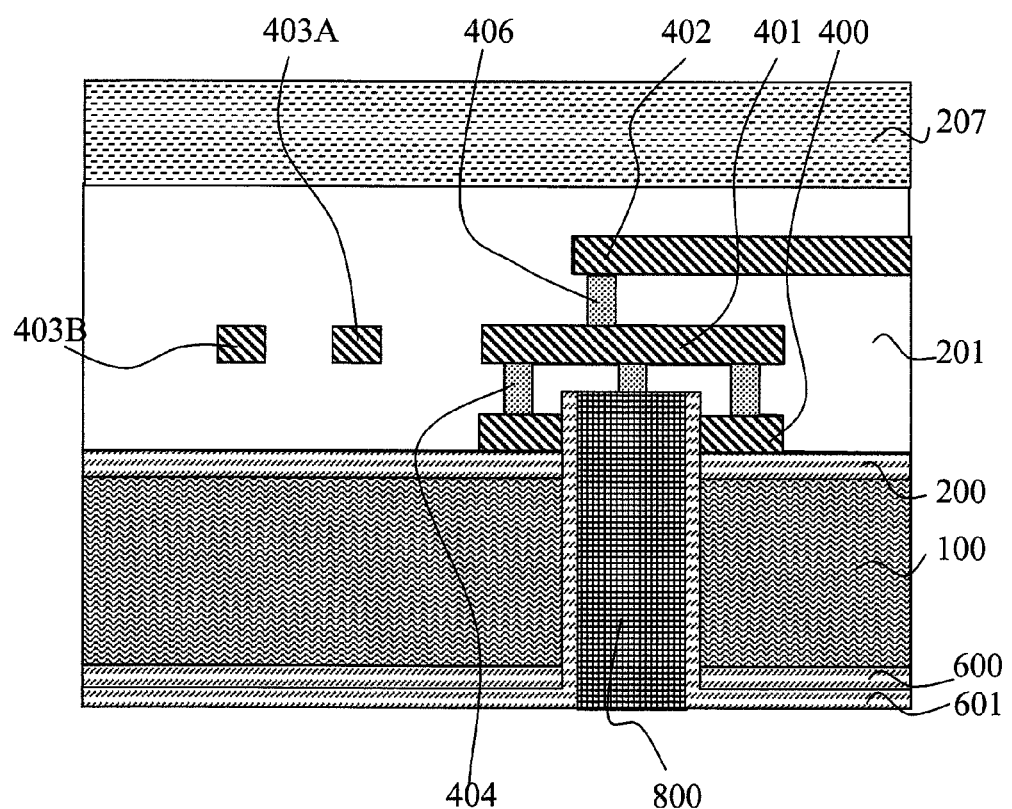
FIG. 8E is a schematic cross-sectional view of the main part of the manufacturing process continued from FIG. 8D.

Then, a tantalum film having a film thickness of 50 nm and a plating seed film made of copper and having a film thickness of 50 nm are sequentially formed by using sputtering, and the silicon through hole 701 is completely filled with copper by using electrolytic plating. Thereafter, the tantalum film and the copper film in the region other than the silicon through hole 701 are removed by using chemical mechanical polishing, thereby forming the semiconductor device having the silicon through electrode 800 formed from the back surface of the substrate on which the semiconductor element has been formed as shown in FIG. 8E.

In the second embodiment, part (the silicon through hole, the first and second metal wirings, the first connection via, and the adjacent parallel metal wirings) in the layout plan view of the semiconductor device formed in the above-described process is not shown like the first embodiment, but the part is similar to the layout drawing of FIG. 6.

When the performance of the semiconductor device formed in this manner is checked, like the one shown as the comparative example of the first embodiment, increase in the parasitic capacitance, increase in the via chain resistance, and conduction failure are found in the semiconductor device in which the ring-shaped frame 505 is not provided compared with the case in which the ring-shaped frame 505 is provided.

In other words, the semiconductor device having the wiring having low parasitic capacitance and low via resistance in the circuit region in the vicinity of the silicon through hole can be formed by forming metal wirings in plural layers so as to completely enclose the region in which the silicon through hole is formed, and further forming the ring-shaped structure so as to enclose the silicon through hole by using the connection vias between the metal wirings according to the present embodiment.

Also, the semiconductor device having the wiring having low parasitic capacitance and low via resistance in the circuit region in the vicinity of the silicon through hole can be formed by forming a film through which moisture is hard to pass such as a metal wiring, a connection via or an under-wiring insulating film between the interlayer insulating film using the Low-k material exposed from the opening of the silicon through hole and the interlayer insulating film using the Low-k material formed in the circuit wiring region according to the present embodiment.

In the present embodiment, two layers of metal wirings, that is, the first metal wiring 400 and the second metal wiring 401 and the first connection via 404 connecting the metal wirings to each other are used as moisture barrier films for preventing moisture absorption of the Low-k material. However, three or more wiring layers and connection vias connecting the wiring layers can also be utilized. The larger the number of used wiring layers, the larger the margin with respect to the overetching can be made in the etching for forming the opening of the silicon through via. On the other hand, since the region in which the moisture barrier film is formed cannot be used as a circuit wiring, the layout of wiring is restricted.

In the present embodiment, etching of the silicon through hole 701 is stopped at an intermediate part of the layer in which the first connection via 404 is formed. However, the effectiveness of the present invention is not limited to this case. Since the condition for making the silicon through electrode function is that the etching penetrates through at least the substrate 100 on which the semiconductor device has been formed and reaches the first metal wiring 400, etching may proceed to the upper wiring layer of the second metal wiring layer. However, if etching proceeds to the upper wiring layer of the second metal wiring layer and the Low-k material and the silicon through hole 701 are in contact with each other, in order to limit the region in which moisture permeates to the Low-k material, the ring-shaped frame 505 has to be provided also in the upper wiring layer to which etching of the silicon through hole 701 reaches, and the upper metal wiring having the shape that encloses the ring-shaped frame 505 has to be formed.

Moreover, in the present embodiment, the third metal wiring 402 is used as a method for extracting the wiring which is electrically connected to the silicon through electrode 800. However, the wiring may be extracted by the second metal wiring layer. In the present embodiment, tungsten is used as the material of the first and second connection vias, but the material is not limited thereto. For example, similar effects can be expected by aluminum.

Moreover, in the present embodiment, tungsten is used as the material of the ring-shaped frame 505. However, a different material can be used as long as the effect of preventing passage of moisture can be expected by the material like Al or SiCN. When a metal is used as a material of the ring-shaped frame, the effect of preventing passage of moisture can be expected if the ring-shaped frame has a thickness of about 10 nm. Furthermore, in the layout plan view, the shape of the ring-shaped frame is not required to be quadrangular, and may surround the periphery of the silicon through electrode a plurality of times.

The first, second, and third metal wirings use the material mainly made of aluminum in the present embodiment, but may use a material mainly made of tungsten.

The first, second, and third metal wirings use titanium nitride as barrier metal in the present embodiment, but the material is not limited thereto. For example, tungsten, molybdenum, nickel, or a compound thereof can also be used. Furthermore, a plurality of films may be stacked in the structure of the barrier metal.

In the present embodiment, the interlayer insulating film uses the insulating film made of SiOC. However, the effects of the present invention are not limited to this material. Similar effects can be expected even by a porous Low-k film or an organic Low-k film.

Third Embodiment

The present embodiment is one of application examples of the first embodiment, and the embodiment will be described with reference to cross-sectional views (FIG. 9 and FIG. 10) showing the manufacturing process of a semiconductor device. Also, FIG. 11 is a layout plan view of FIG. 10. Hereinafter, the process will be sequentially described.

Figure 9A:
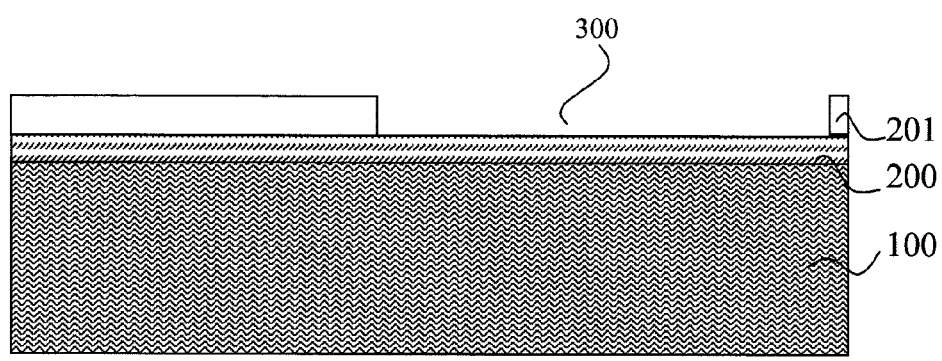
FIG. 9A is a schematic cross-sectional view of a main part of the manufacturing process of a semiconductor device of the third embodiment of the present invention.
Figure 9B:
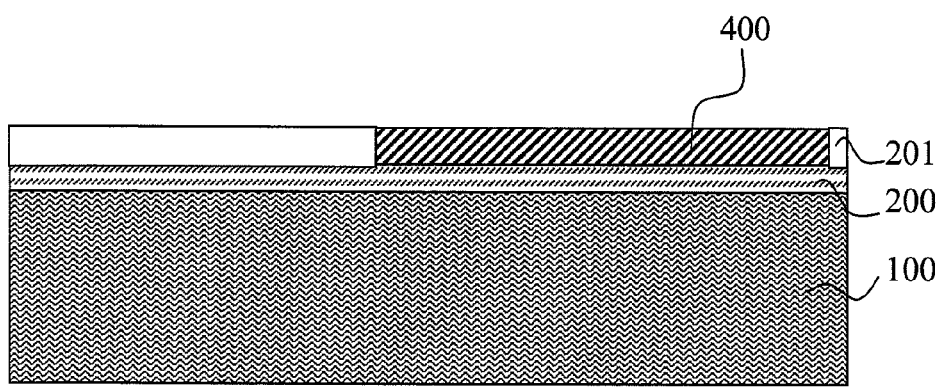
FIG. 9B is a schematic cross-sectional view of the main part of the manufacturing process continued from FIG. 9A.

An under-wiring insulating film 200 made up of a silicon oxide film having a film thickness of 250 nm and silicon nitride having a film thickness of 50 nm is formed on a substrate 100 on which a semiconductor element has been formed, an opening is formed in a desired region of the under-wiring insulating film 200, and a tungsten plug is formed therein by using CVD and chemical mechanical polishing. Then, a first interlayer insulating film 201 using a Low-k material made of carbon-containing silicon oxide (SiOC) and having a film thickness of 100 nm is formed by using plasma CVD, and a first metal wiring opening 300 is formed (FIG. 9A) by using lithography and dry etching in a region of the first interlayer insulating film 201 in which at least a metal wiring is desired to be formed. Sequentially, a tantalum film having a film thickness of 50 nm is formed by using sputtering, and a copper film is formed by using sputtering and electrolytic plating so as to fill the metal wiring opening 300. Thereafter, the tantalum film and the copper film in the region other than the first metal wiring opening 300 are removed by using chemical mechanical polishing, thereby forming a first metal wiring 400 as shown in FIG. 9B.

Figure 9C:
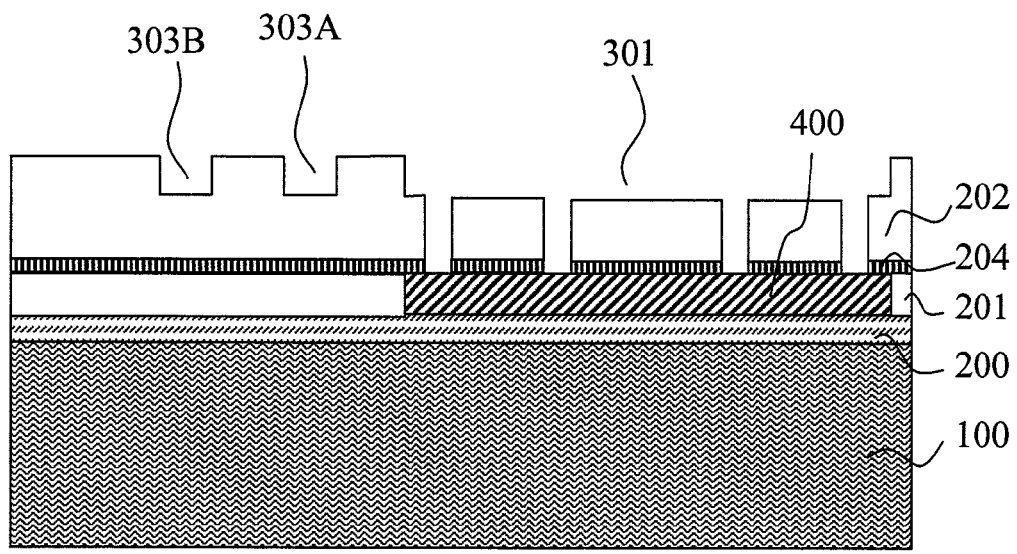
FIG. 9C is a schematic cross-sectional view of the main part of the manufacturing process continued from FIG. 9B.

Then, a first protective insulating film 204 made of nitrogen-containing silicon carbide (SiCN) and having a film thickness of 25 nm is formed by using plasma CVD, and a second interlayer insulating film 202 using a Low-k material made of SiOC and having a film thickness of 250 nm is formed by plasma CVD on the first protective insulating film 204. Openings are provided in desired regions of the interlayer insulating film 202 by using lithography and dry etching twice, and the openings are used as a second metal wiring opening 301 and adjacent parallel metal wiring openings 303A and 303B. In this process, the second metal wiring opening 301 is formed so that part of the first metal wiring 400 is exposed therefrom (FIG. 9C).

Figure 9D:
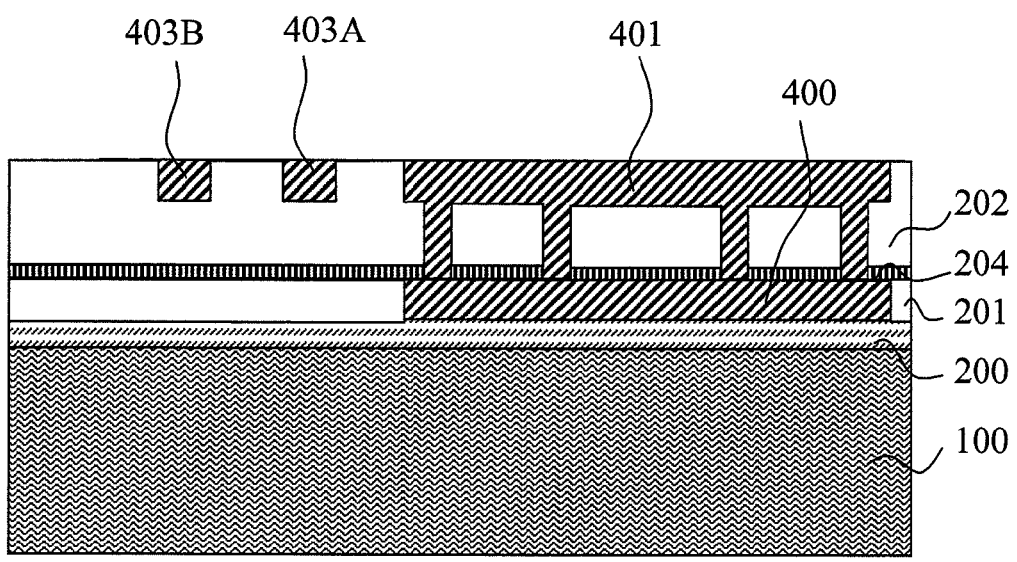
FIG. 9D is a schematic cross-sectional view of the main part of the manufacturing process continued from FIG. 9C.

Then, sequentially, a tantalum film having a film thickness of 50 nm is formed by using sputtering and a copper film having a film thickness of 500 nm is formed by using sputtering and electrolytic plating so as to fill the second metal wiring opening 301 and the adjacent parallel metal wiring openings 303A and 303B. Thereafter, the tantalum film and the copper film in the region other than the openings are removed by using chemical mechanical polishing, thereby forming a second metal wiring 401 and adjacent parallel metal wirings 403A and 403B as shown in FIG. 9D.

Figure 9E:
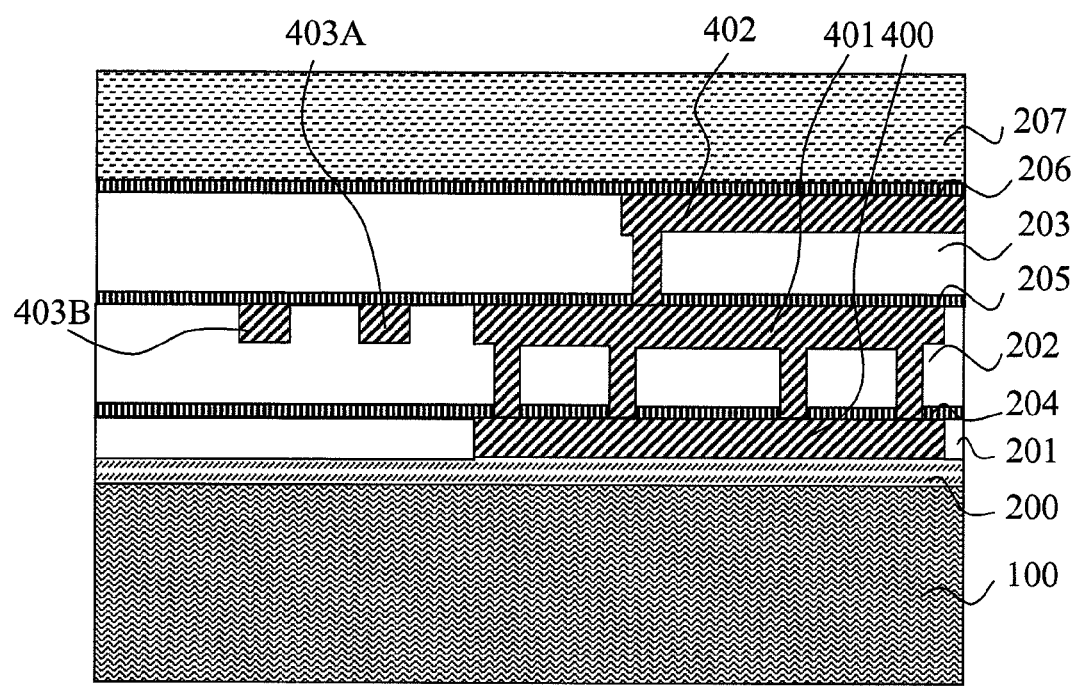
FIG. 9E is a schematic cross-sectional view of the main part of the manufacturing process continued from FIG. 9D.

Then, according to the process shown in the first embodiment, a second protective insulating film 205 made of SiCN and having a film thickness of 25 nm, a third interlayer insulating film 203 using a Low-k material made of SiOC and having a film thickness of 250 nm, and a third metal wiring 402 made up of a tantalum film and a copper film and having a film thickness of 50 nm are sequentially formed. Furthermore, a third protective insulating film 206 made of SiCN and having a film thickness of 25 nm and an aluminum pad made of titanium nitride and aluminum are formed, and a passivation film 207 made up of a silicon oxide film having a film thickness of 200 nm and silicon nitride having a film thickness of 250 nm is formed. In this manner, the semiconductor device having a multilayer wiring as shown in FIG. 9E can be formed.

Figure 10:
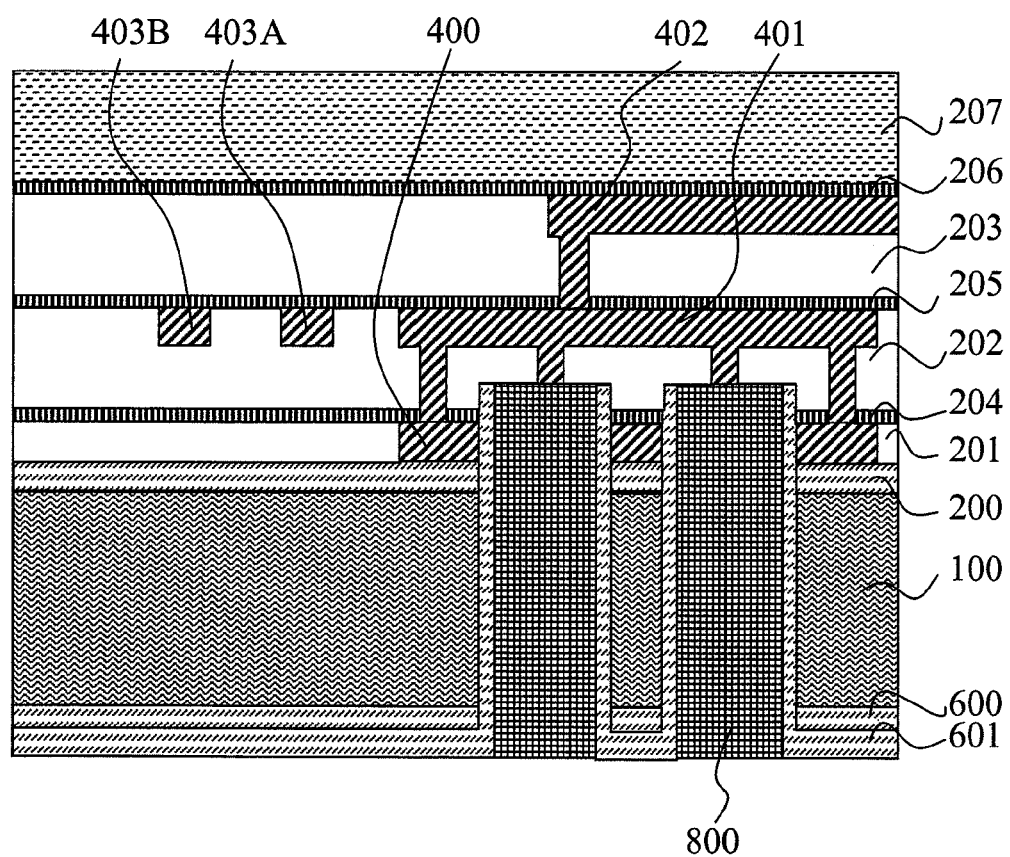
FIG. 10 is a schematic cross-sectional view of the main part of the manufacturing process of the semiconductor device of the third embodiment of the present invention continued from FIG. 9E.
Figure 11:
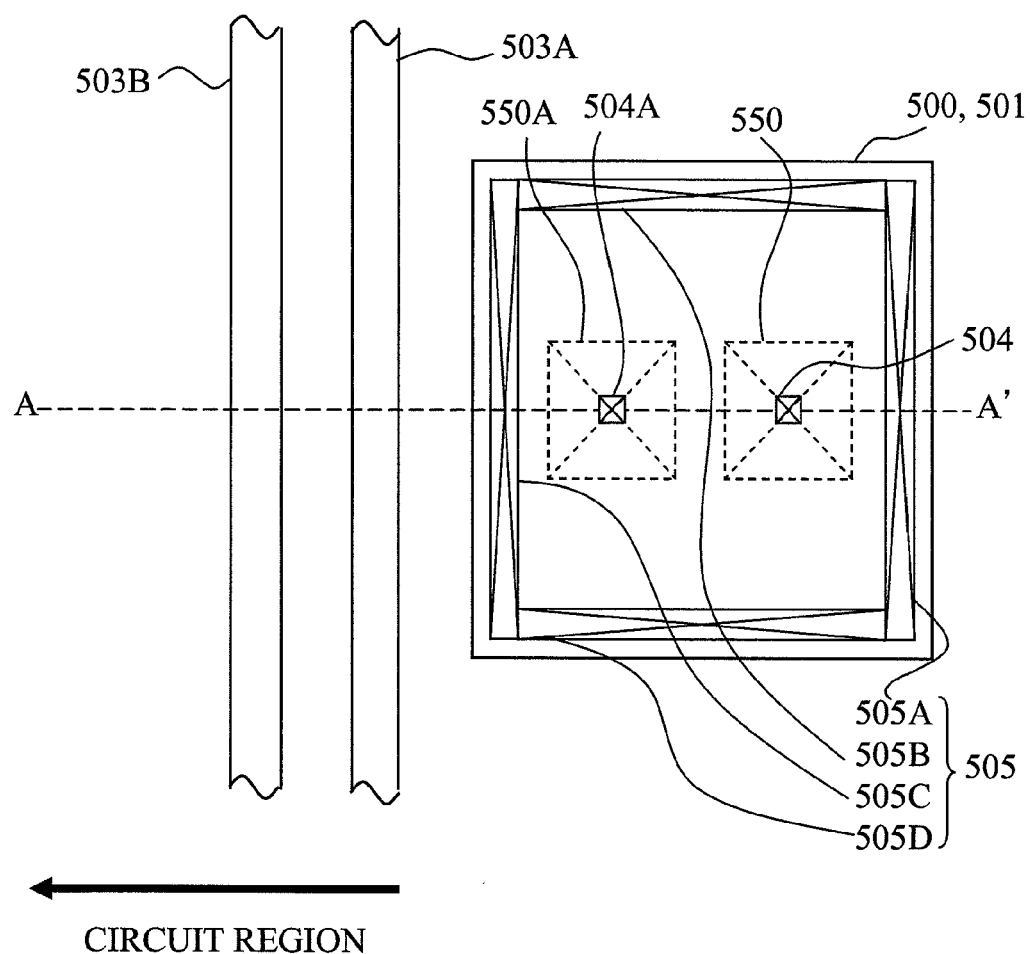
FIG. 11 is a schematic layout plan view of the third embodiment of the present invention.

Then, in the semiconductor device having the multilayer wiring described above in the present embodiment (FIG. 9E), according to the manufacturing process of the silicon through electrode of the first embodiment, a semiconductor device having a first back-surface insulating film 600 and a second back-surface insulating film 601 made of silicon oxide and a plurality of silicon through electrodes 800 made of tantalum and copper is formed (FIG. 10).

FIG. 11 shows part (the silicon through hole, the first and second metal wirings, the first connection via, and the adjacent parallel metal wirings) in a layout plan view of the semiconductor device formed in the above process. The cross-sectional view shown in FIG. 10 is a cross section taken along the line A-A' in FIG. 11. In FIG. 11, connection via regions 505A, 505B, 505C, and 505D constituting the second metal wiring form a ring-shaped frame 505 and enclose a plurality of silicon through hole regions 550 and 550A. Herein, the length of each of the connection via regions 505A, 505B, 505C, and 505D constituting the second metal wiring in a short-side direction is 100 nm. Moreover, the ring-shaped frame 505 is disposed so as to be completely enclosed in a first metal wiring region 500 and a second metal wiring region 501. Furthermore, an adjacent parallel metal wiring region 503A and an adjacent parallel metal wiring region 503B are laid outside the ring-shaped frame 505.

When the performance of the semiconductor device formed in this manner is checked, like the one shown in the first embodiment, increase in the parasitic capacitance, increase in the via chain resistance, and conduction failure are found in the semiconductor device in which the ring-shaped frame 505 is not provided compared with the case in which the ring-shaped frame 505 is provided.

In other words, the semiconductor device having the wiring having low parasitic capacitance and low via resistance in the circuit region in the vicinity of the silicon through hole can be formed by forming metal wirings in plural layers so as to completely enclose the region in which the silicon through hole is formed, and further forming the ring-shaped structure so as to enclose the silicon through hole by using the connection vias between the metal wirings according to the present embodiment.

Also, the semiconductor device having the wiring having low parasitic capacitance and low via resistance in the circuit region in the vicinity of the silicon through hole can be formed by forming a film through which moisture is hard to pass such as a metal wiring or an under-wiring insulating film between the interlayer insulating film using the Low-k material exposed from the opening of the silicon through hole and the interlayer insulating film using the Low-k material formed in the circuit wiring region according to the present embodiment.

In the present embodiment, unlike the first embodiment, the plurality of silicon through electrodes are enclosed in the ring-shaped frame. Since the plurality of silicon through electrodes are connected to one metal wiring in the present embodiment, compared with the first embodiment, there is an advantage that reliability of electrical connection can be improved.

In the present embodiment, two layers of metal wirings, that is, the first metal wiring 400 and the second metal wiring 401 are used as moisture barrier films for preventing moisture absorption of the Low-k material. However, three or more wiring layers can also be utilized. The larger the number of used wiring layers, the larger the margin with respect to the overetching can be made in the etching for forming the opening of the silicon through via. On the other hand, since the region in which the moisture barrier film is formed cannot be used as a circuit wiring, the layout of wiring is restricted.

In the present embodiment, etching of the silicon through hole 701 is stopped at an intermediate part of the second interlayer insulating film 202 using the Low-k material. However, the effectiveness of the present invention is not limited to this case. Since the condition for making the silicon through electrode function is that the etching penetrates through at least the substrate 100 on which the semiconductor device has been formed, and reaches the first metal wiring 400, etching may proceed to the upper wiring layer of the second interlayer insulating film 202 using the Low-k material. However, if etching proceeds to the third interlayer insulating film 203 using the Low-k material or above and the Low-k material and the silicon through hole 701 are in contact with each other, in order to limit the region in which moisture permeates to the Low-k material, the ring-shaped frame 505 has to be provided also in the upper wiring layer to which etching of the silicon through hole 701 reaches.

Moreover, in the present embodiment, the third metal wiring 402 is used as a method for extracting the wiring which is electrically connected to the silicon through electrode 800. However, the wiring may be extracted by the second metal wiring layer.

Moreover, in the present embodiment, tantalum and copper are used as the materials of the ring-shaped frame 505. However, other materials can be used as long as the effect of preventing passage of moisture can be expected by the materials like SiCN. When a metal is used as a material of the ring-shaped frame, the effect of preventing passage of moisture can be expected if the ring-shaped frame has a thickness of about 10 nm. Furthermore, in the layout plan view, the shape of the ring-shaped frame is not required to be quadrangular, and may surround the periphery of the silicon through electrode a plurality of times.

Moreover, in the present embodiment, the metal wiring does not have an opening. However, the metal wiring is not necessarily required to have no opening. For example, part of the metal wiring may include an opening in order to improve flatness.

The first, second, and the third metal wirings use the material mainly made of copper in the present embodiment, but may use a material mainly made of tungsten.

The first, second, and third metal wirings use tantalum as barrier metal in the present embodiment, but the material is not limited thereto. For example, a tantalum compound, titanium, tungsten, ruthenium, manganese, or a compound thereof can be used. Furthermore, a plurality of films may be stacked in the structure of the barrier metal.

In the present embodiment, the interlayer insulating film uses the insulating film made of SiOC formed by using plasma CVD. However, the effects of the present invention are not limited to this material. Similar effects can be expected even by a porous Low-k film or an organic Low-k film. A method other than CVD can also be used as a film formation method.

In the present embodiment, insulating films made of SiCN formed by using plasma CVD are used as the material of the first, second, and third protective insulating films. However, the material is not limited thereto. For example, SiN, SiC, and a stacked structure thereof may be used.

Fourth Embodiment

The present embodiment is one of application examples of the second embodiment, and the embodiment will be sequentially described hereinafter with reference to cross-sectional views (FIG. 12 and FIG. 13) showing the manufacturing process of a semiconductor device.

Figure 12A:
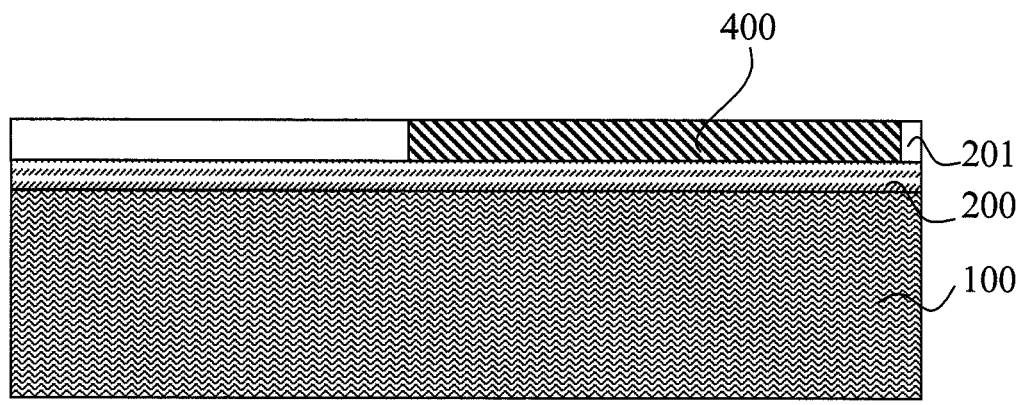
FIG. 12A is a schematic cross-sectional view of a main part of the manufacturing process of a semiconductor device of the fourth embodiment of the present invention.

An under-wiring insulating film 200 made up of a silicon oxide film having a film thickness of 250 nm and silicon nitride having a film thickness of 50 nm is formed on a substrate 100 on which a semiconductor element has been formed, an opening is formed in a desired region of the under-wiring insulating film 200, and a tungsten plug is formed therein by using CVD and chemical mechanical polishing. Then, a stacked structure of a titanium nitride film having a film thickness of 50 nm, an aluminum film having a film thickness of 300 nm, and a titanium nitride film having a film thickness of 50 nm is formed by sputtering, and the titanium nitride film and the aluminum film in the region other than the region in which a metal wiring is desired to be formed are removed by using lithography and dry etching, thereby forming a first metal wiring 400 made of titanium nitride and aluminum (FIG. 12A).

Figure 12B:
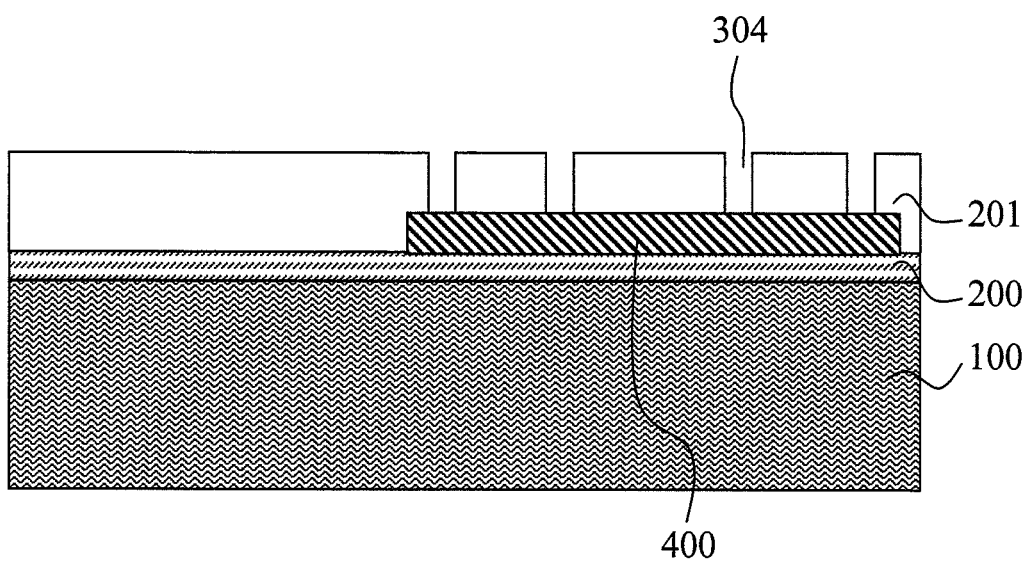
FIG. 12B is a schematic cross-sectional view of the main part of the manufacturing process continued from FIG. 12A.

Then, after carbon-containing silicon oxide (SiOC) having a film thickness of 750 nm is formed, the surface thereof is planarized by using chemical mechanical polishing, thereby providing a first interlayer insulating film 201. Openings are formed in a desired region in the first interlayer insulating film 201 using a Low-k material, thereby forming first connection via openings 304. In this process, the first connection via openings 304 are formed so that part of the first metal wiring 400 is exposed therefrom (FIG. 12B).

Figure 12C:
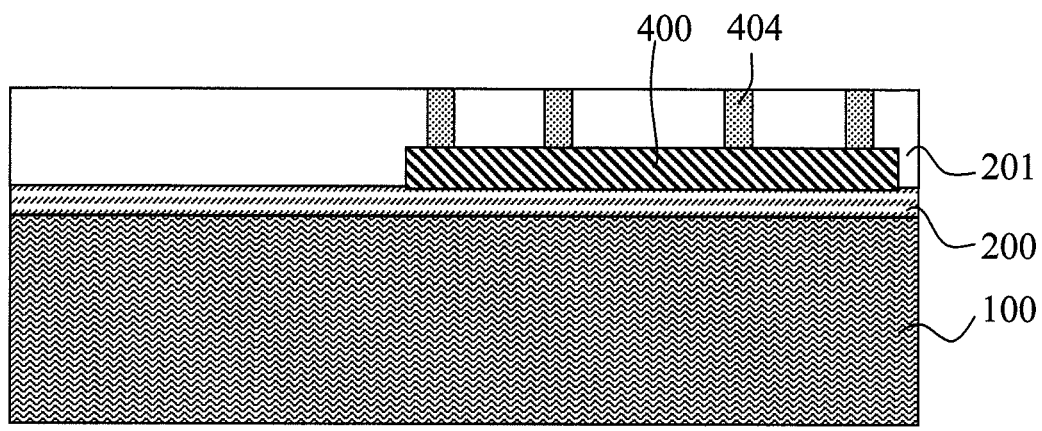
FIG. 12C is a schematic cross-sectional view of the main part of the manufacturing process continued from FIG. 12B.

Then, after a tungsten film is formed by sputtering and CVD so as to fill the first connection via openings 304, the tungsten film in the region other than the openings is removed by using chemical mechanical polishing, thereby forming first connection vias 404 as shown in FIG. 12C.

Figure 12D:
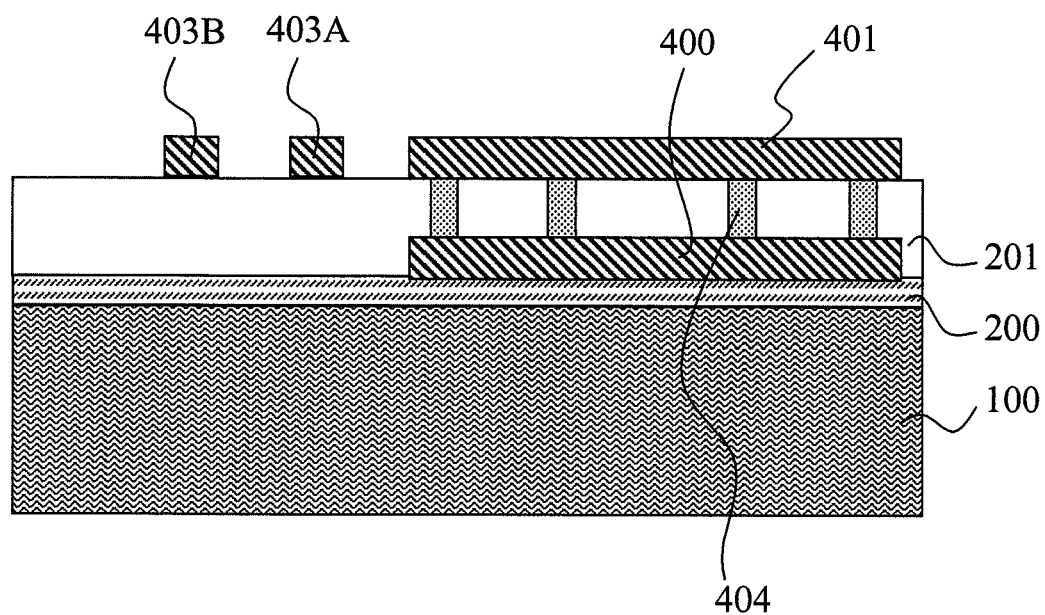
FIG. 12D is a schematic cross-sectional view of the main part of the manufacturing process continued from FIG. 12C.

Then, a stacked structure of a titanium nitride film having a film thickness of 50 nm, an aluminum film having a film thickness of 300 nm, and a titanium nitride film having a film thickness of 50 nm is formed by using sputtering, and the titanium nitride film and the aluminum film in the region other than the region in which a metal wiring is desired to be formed are removed by using lithography and dry etching, thereby forming a second metal wiring 401, an adjacent second parallel metal wiring 403A, a second parallel metal wiring 403B made of titanium nitride and aluminum. In this process, the second metal wiring 401 is formed so as to cover the first connection vias 404 (FIG. 12D).

Figure 12E:
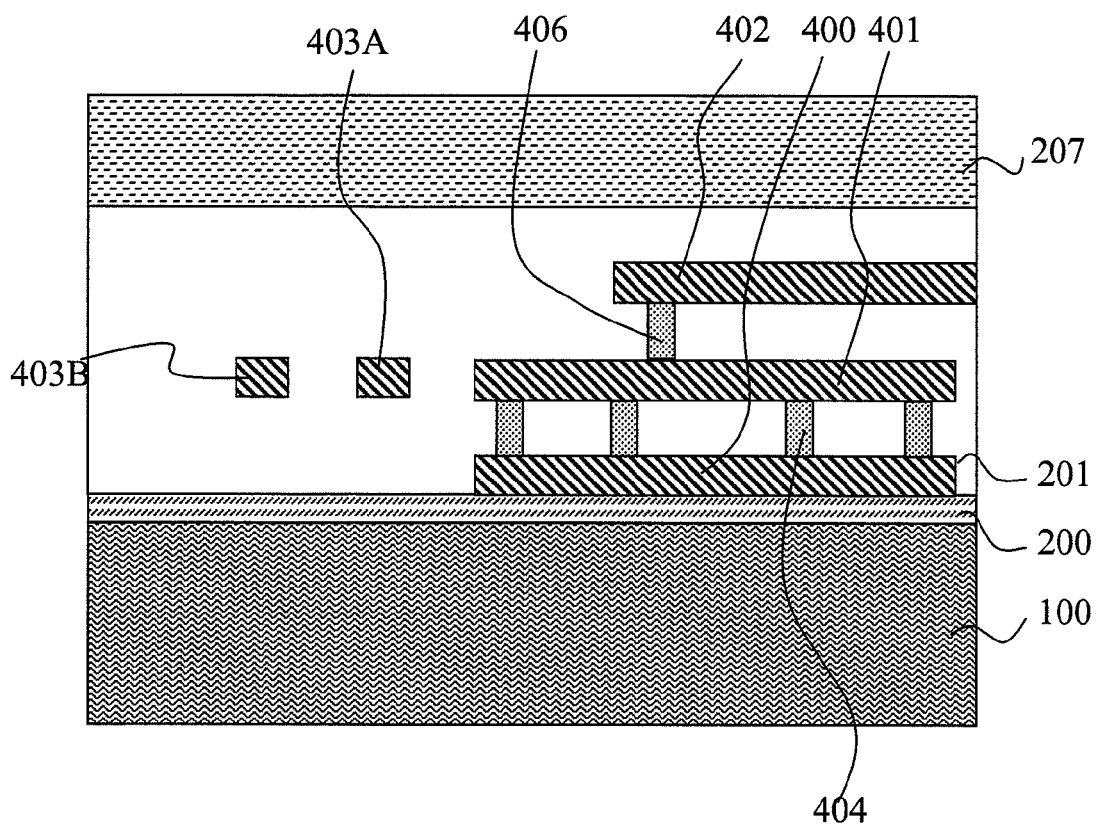
FIG. 12E is a schematic cross-sectional view of the main part of the manufacturing process continued from FIG. 12D.

Then, according to the process shown in the second embodiment, an interlayer insulating film made of carbon-containing silicon oxide (SiOC) and having a film thickness of 750 nm, a second connection via 406 made of tungsten, a third metal wiring 402 having a film thickness of 50 nm and made of titanium nitride and aluminum, an interlayer insulating film having a film thickness of 750 nm and made of carbon-containing silicon oxide (SiOC), an aluminum pad made of titanium nitride and aluminum, and a passivation film 207 made up of a silicon oxide film having a film thickness of 200 nm and a silicon nitride film having a film thickness of 250 nm are formed. The semiconductor device having a multilayer wiring as shown in FIG. 12E can be formed through the above-described process.

Figure 13:
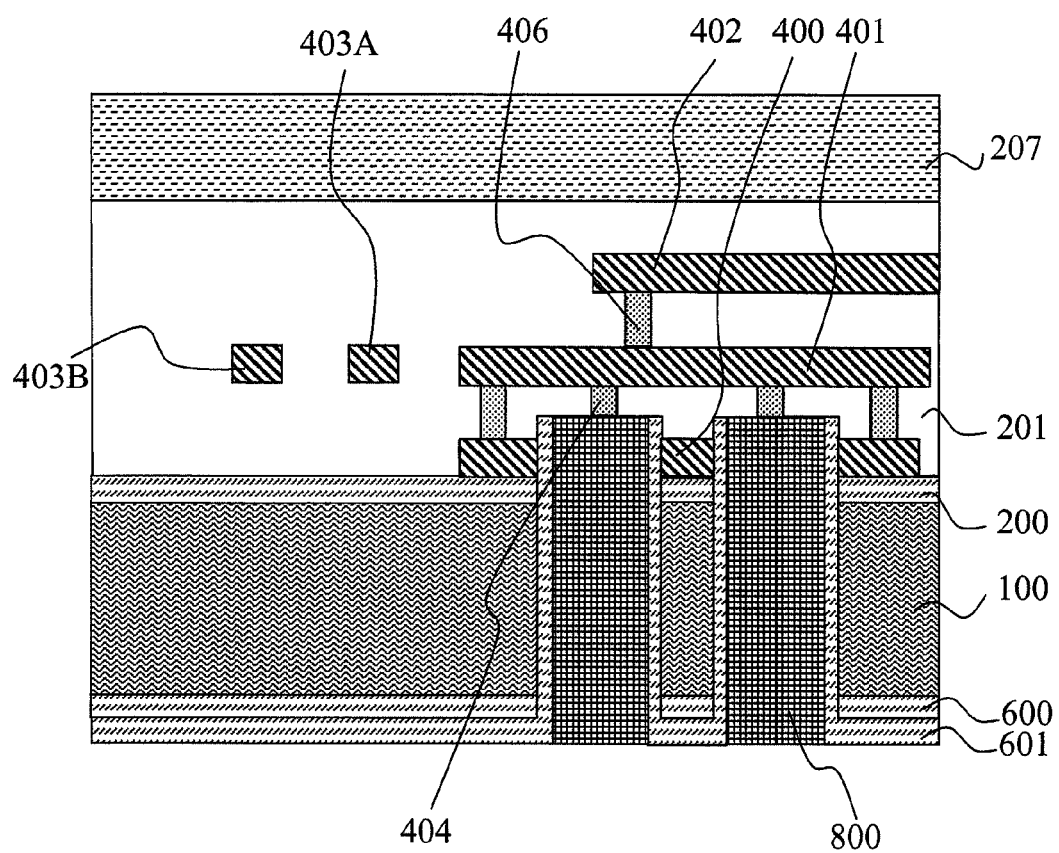
FIG. 13 is a schematic cross-sectional view of the main part of the manufacturing process of the semiconductor device of the fourth embodiment of the present invention continued from FIG. 12E.

Then, in the semiconductor device having the multi layer wiring described above in the present embodiment (FIG. 12E), according to the manufacturing process of the silicon through electrode of the second embodiment, a semiconductor device having a first back-surface insulating film 600 and a second back-surface insulating film 601 made of silicon oxide and a plurality of silicon through electrodes 800 made of tantalum and copper is formed (FIG. 13).

In the fourth embodiment, part (the silicon through hole, the first and second metal wirings, the first connection via, and the adjacent parallel metal wirings) of the layout plan view of the semiconductor device formed in the above-described process is not shown like the third embodiment, but the part is similar to the layout drawing of FIG. 11.

When the performance of the semiconductor device formed in this manner is checked, like the one shown as the comparative example of the first embodiment, increase in the parasitic capacitance, increase in the via chain resistance, and conduction failure are found in the semiconductor device in which the ring-shaped frame 505 is not provided compared with the case in which the ring-shaped frame 505 is provided.

In other words, the semiconductor device having the wiring having low parasitic capacitance and low via resistance in the circuit wiring region in the vicinity of the silicon through hole can be formed by forming metal wirings in plural layers so as to completely enclose the region in which the silicon through hole is formed, and further forming the ring-shaped structure so as to enclose the silicon through hole by using the connection vias between the metal wirings according to the present embodiment.

Also, the semiconductor device having the wiring having low parasitic capacitance and low via resistance in the circuit region in the vicinity of the silicon through hole can be formed by forming a film through which moisture is hard to pass such as a metal wiring, a connection via or an under-wiring insulating film between the interlayer insulating film using the Low-k material exposed from the opening of the silicon through hole and the interlayer insulating film using the Low-k material formed in the circuit wiring region according to the present embodiment.

In the present embodiment, unlike the second embodiment, the plurality of silicon through electrodes are enclosed in the ring-shaped frame. Since the plurality of silicon through electrodes are connected to one metal wiring in the present embodiment, compared with the second embodiment, there is an advantage that reliability of electrical connection can be improved.

In the present embodiment, two layers of metal wirings, that is, the first metal wiring 400 and the second metal wiring 401 and the first connection via 404 connecting the metal wirings to each other are used as moisture barrier films for preventing moisture absorption of the Low-k material. However, three or more wiring layers and connection vias connecting the wiring layers can also be utilized. The larger the number of used wiring layers, the larger the margin with respect to the overetching can be made in the etching for forming the opening of the silicon through via. On the other hand, since the region in which the moisture barrier film is formed cannot be used as a circuit wiring, the layout of wiring is restricted.

In the present embodiment, etching of the silicon through hole 701 is stopped at an intermediate part of the layer in which the first connection via 404 is formed. However, the effectiveness of the present invention is not limited to this case. Since the condition for making the silicon through electrode function is that the etching penetrates through at least the substrate 100 on which the semiconductor device has been formed and reaches the first metal wiring 400, etching may proceed to the upper wiring layer of the second metal wiring layer. However, if etching proceeds to the upper wiring layer of the second metal wiring layer and the Low-k material and the silicon through hole 701 are in contact with each other, in order to limit the region in which moisture permeates to the Low-k material, the ring-shaped frame 505 has to be provided also in the upper wiring layer to which etching of the silicon through hole 701 reaches, and the upper metal wiring having the shape that encloses the ring-shaped frame 505 has to be formed.

In the present embodiment, etching of the silicon through hole 701 is stopped at an intermediate part of the layer in which the first connection via 404 is formed. However, the effectiveness of the present invention is not limited to this case. Since the condition for making the silicon through electrode function is that the etching penetrates through at least the substrate 100 on which the semiconductor device has been formed and reaches the first metal wiring 400, etching may proceed to the upper wiring layer of the second metal wiring layer. However, if etching proceeds to the upper wiring layer of the second metal wiring layer and the Low-k material and the silicon through hole 701 are in contact with each other, in order to limit the region in which moisture permeates to the Low-k material, the ring-shaped frame 505 has to be provided also in the upper wiring layer to which etching of the silicon through hole 701 reaches, and the upper metal wiring having the shape that encloses the ring-shaped frame 505 has to be formed.

Moreover, in the present embodiment, the third metal wiring 402 is used as a method for extracting the wiring which is electrically connected to the silicon through electrode 800. However, the wiring may be extracted by the second metal wiring layer.

The first, second, and the third metal wirings use the material mainly made of aluminum in the present embodiment, but may use a material mainly made of tungsten.

Moreover, in the present embodiment, tungsten is used as the material of the ring-shaped frame 505. However, a different material can be used as long as the effect of preventing passage of moisture can be expected by the material like Al or SiCN. When a metal is used as a material of the ring-shaped frame, the effect of preventing passage of moisture can be expected if the ring-shaped frame has a thickness of about 10 nm. Furthermore, in the layout plan view, the shape of the ring-shaped frame is not required to be quadrangular, and may surround the periphery of the silicon through electrode a plurality of times.

In the present embodiment, in the first, second, and third metal wirings, aluminum is used as a main component, but tungsten may be used.

The first, second, and third metal wirings use titanium nitride as barrier metal in the present embodiment, but the material is not limited thereto. For example, tungsten, molybdenum, nickel, or a compound thereof can be used. Furthermore, a plurality of films may be stacked in the structure of the barrier metal.

Furthermore, in the present embodiment, the interlayer insulating film uses the insulating film made of SiOC. However, the effects of the present invention are not limited to this material.

Similar effects can be expected even by a porous Low-k film or an organic Low-k film.

Fifth Embodiment

The present embodiment is one of application examples of the first embodiment, and the embodiment will be described with reference to cross-sectional views (FIG. 14 and FIG. 15) showing the manufacturing process of a semiconductor device. Also, FIG. 16 is a layout plan view of FIG. 15. Hereinafter, the process will be sequentially described.

Figure 14A:
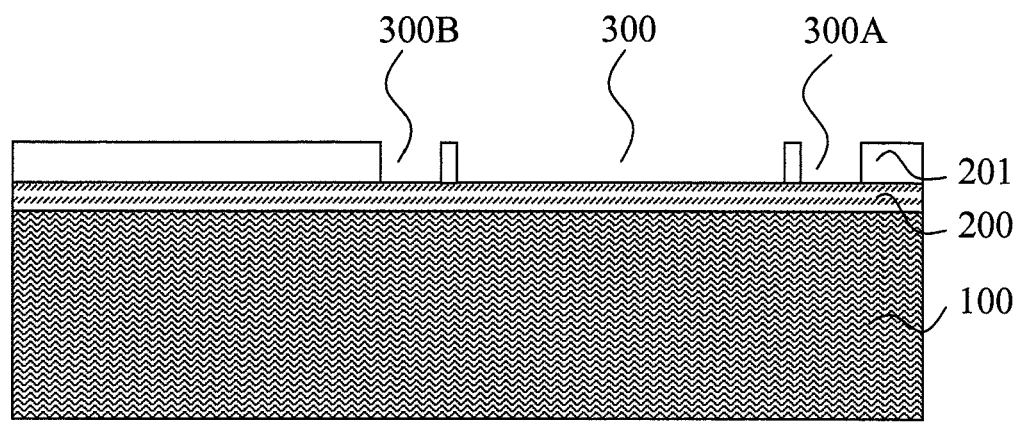
FIG. 14A is a schematic cross-sectional view of a main part of the manufacturing process of a semiconductor device of the fifth embodiment of the present invention.
Figure 14B:
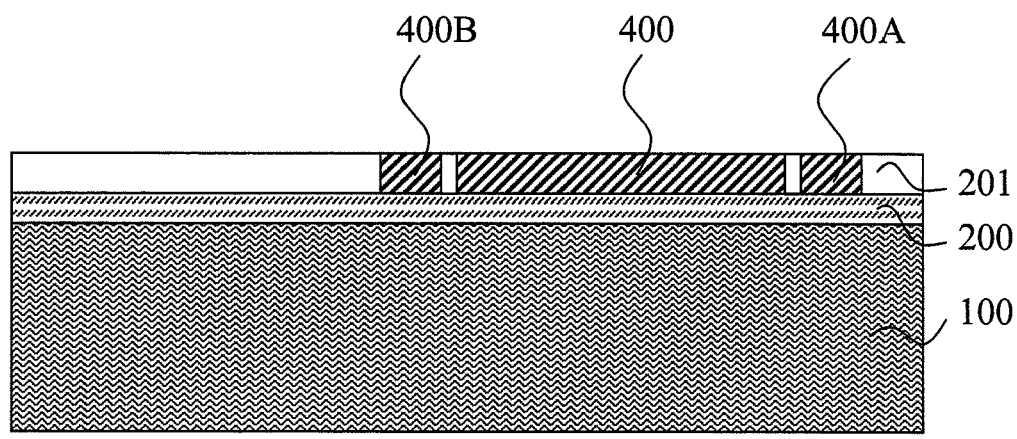
FIG. 14B is a schematic cross-sectional view of the main part of the manufacturing process continued from FIG. 14A.

An under-wiring insulating film 200 made up of a silicon oxide film having a film thickness of 250 nm and silicon nitride having a film thickness of 50 nm is formed on a substrate 100 on which a semiconductor element has been formed, an opening is formed in a desired region of the under-wiring insulating film 200, and a tungsten plug is formed therein by using CVD and chemical mechanical polishing. Then, a first interlayer insulating film 201 having a film thickness of 100 nm and using a Low-k material made of carbon-containing silicon oxide (SiOC) is formed by using plasma CVD, and first metal wiring openings 300, 300A, and 300B are formed by using lithography and dry etching in at least the regions of the first interlayer insulating film 201 in which metal wirings are desired to be formed (FIG. 14A). Sequentially, a tantalum film having a film thickness of 50 nm is formed by using sputtering, and a copper film is formed by using sputtering and electrolytic plating so as to fill the metal wiring openings 300, 300A, and 300B. Thereafter, the tantalum film and the copper film in the region other than the first metal wiring openings 300, 300A, and 300B are removed by using chemical mechanical polishing, thereby forming first meal wirings 400, 400A, and 400B as shown in FIG. 14B.

Figure 14C:
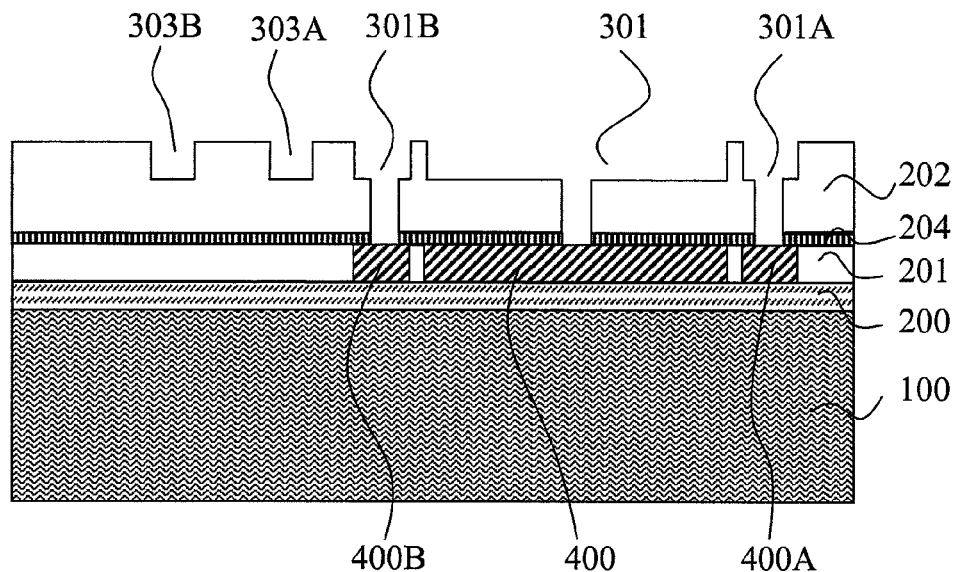
FIG. 14C is a schematic cross-sectional view of the main part of the manufacturing process continued from FIG. 14B.

Then, a first protective insulating film 204 made of nitrogen-containing silicon carbide (SiCN) and having a film thickness of 25 nm is formed by using plasma CVD, and a second interlayer insulating film 202 having a film thickness of 250 nm and using a Low-k material made of SiOC is formed by using plasma CVD on the first protective insulating film 204. Openings are provided in desired regions in the interlayer insulating film 202 by using lithography and dry etching twice, and the openings are used as second metal wiring openings 301, 301A, and 301B and adjacent parallel metal wiring openings 303A and 303B. In this process, the second metal wiring opening 301 is formed so that part of the first metal wiring 400 is exposed, the second metal wiring opening 301A is formed so that part of the first metal wiring 400A is exposed, and the second metal wiring opening 301B is formed so that part of the first metal wiring 400B is exposed (FIG. 14C).

Figure 14D:
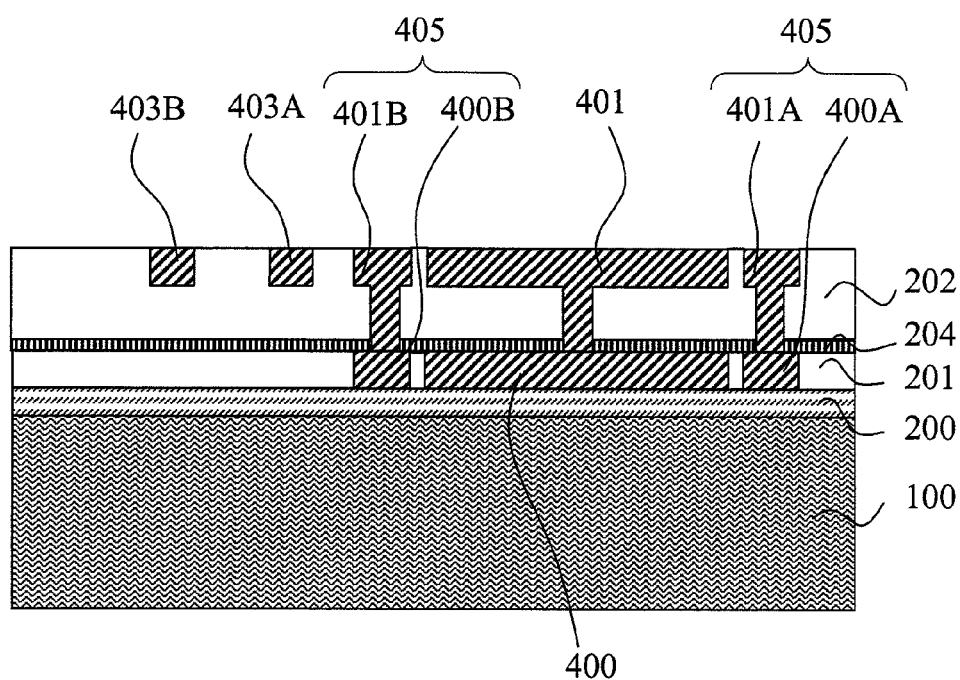
FIG. 14D is a schematic cross-sectional view of the main part of the manufacturing process continued from FIG. 14C.

Then, sequentially, a tantalum film having a film thickness of 50 nm is formed by using sputtering and a copper film having a film thickness of 500 nm is formed by using sputtering and electrolytic plating so as to fill the second metal wiring openings 301, 301A, and 301B and adjacent parallel metal wiring openings 303A and 303B. Thereafter, the tantalum film and the copper film in the region other than the openings are removed by using chemical mechanical polishing, thereby forming second metal wirings 401, 401A, and 401B and adjacent parallel metal wirings 403A and 403B as shown in FIG. 14D. In this process, the first metal wiring 400A, the second metal wiring 401A, the first metal wiring 400B, and the second metal wiring 401B are mutually connected in the same layer to form a ring-shaped frame 405.

Figure 14E:
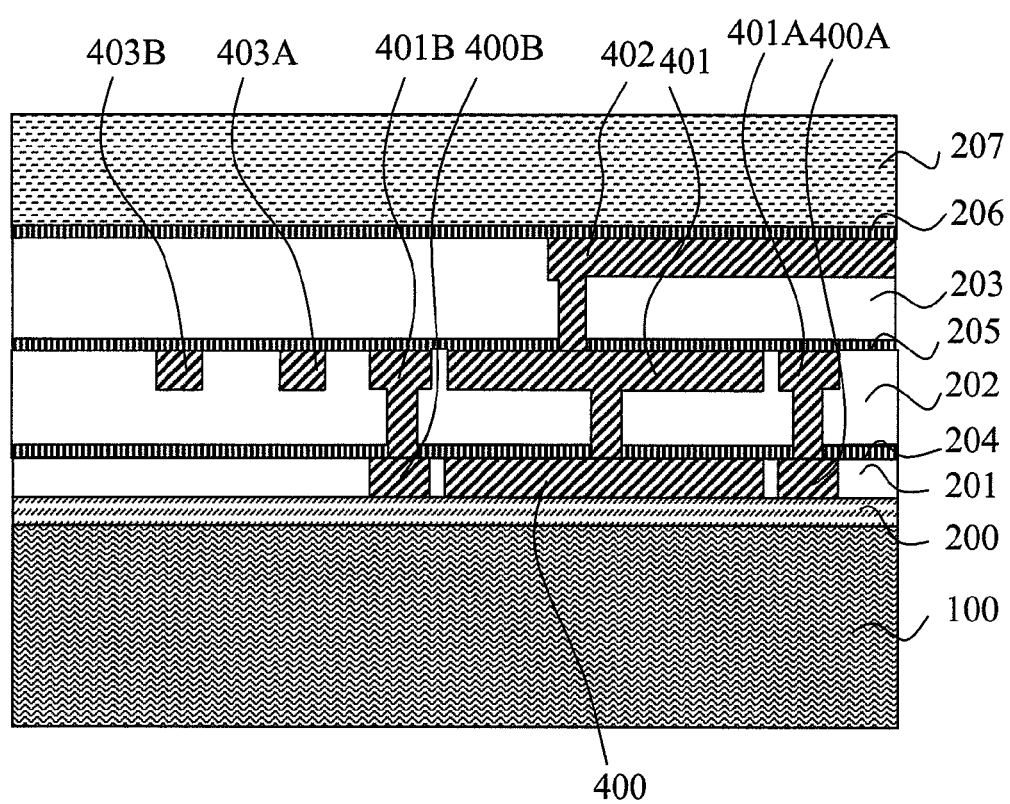
FIG. 14E is a schematic cross-sectional view of the main part of the manufacturing process continued from FIG. 14D.

Then, according to the process shown in the first embodiment, a second protective insulating film 205 made of SiCN and having a film thickness of 25 nm, a third interlayer insulating film 203 having a film thickness of 250 nm and using a Low-k material made of SiOC, and a third metal wiring 402 having a film thickness of 50 nm and made up of a tantalum film and a copper film are sequentially formed. Furthermore, a third protective insulating film 206 having a film thickness of 25 nm and made of SiCN and an aluminum pad made of titanium nitride and aluminum are formed, and a passivation film 207 made up of a silicon oxide film having a film thickness of 200 nm and silicon nitride having a film thickness of 250 nm is formed, thereby forming the semiconductor device having the multilayer wiring as shown in FIG. 14E.

Figure 15:
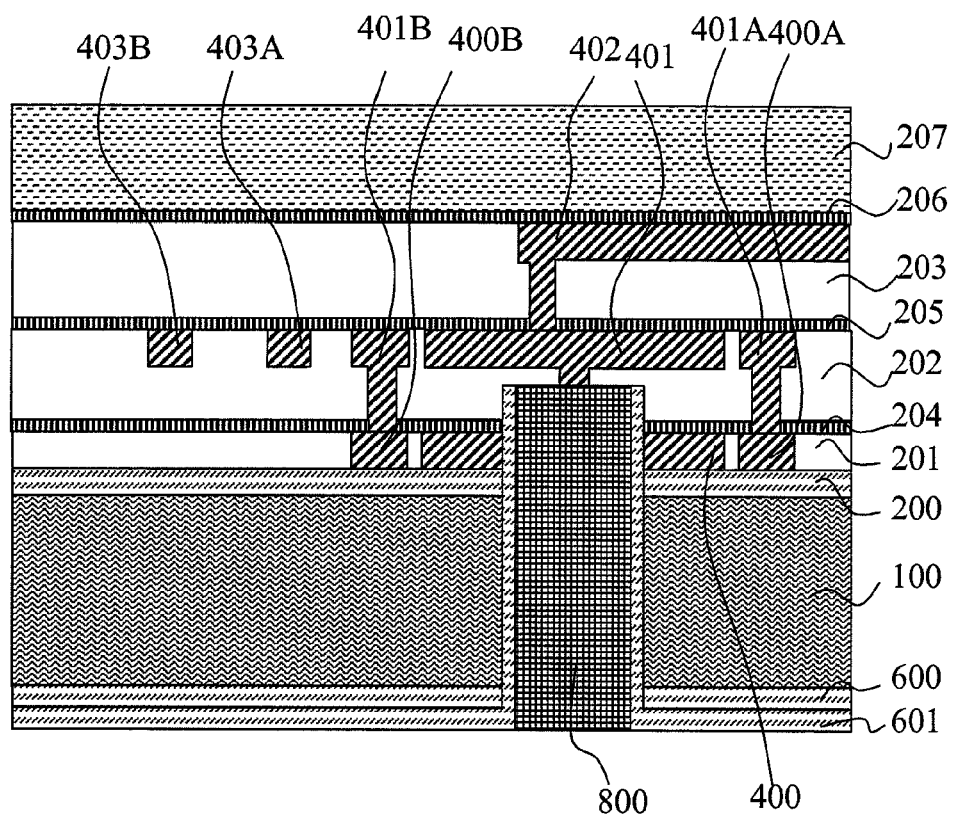
FIG. 15 is a schematic cross-sectional view of the main part of the manufacturing process of the semiconductor device of the fifth embodiment of the present invention continued from FIG. 14E.
Figure 16:
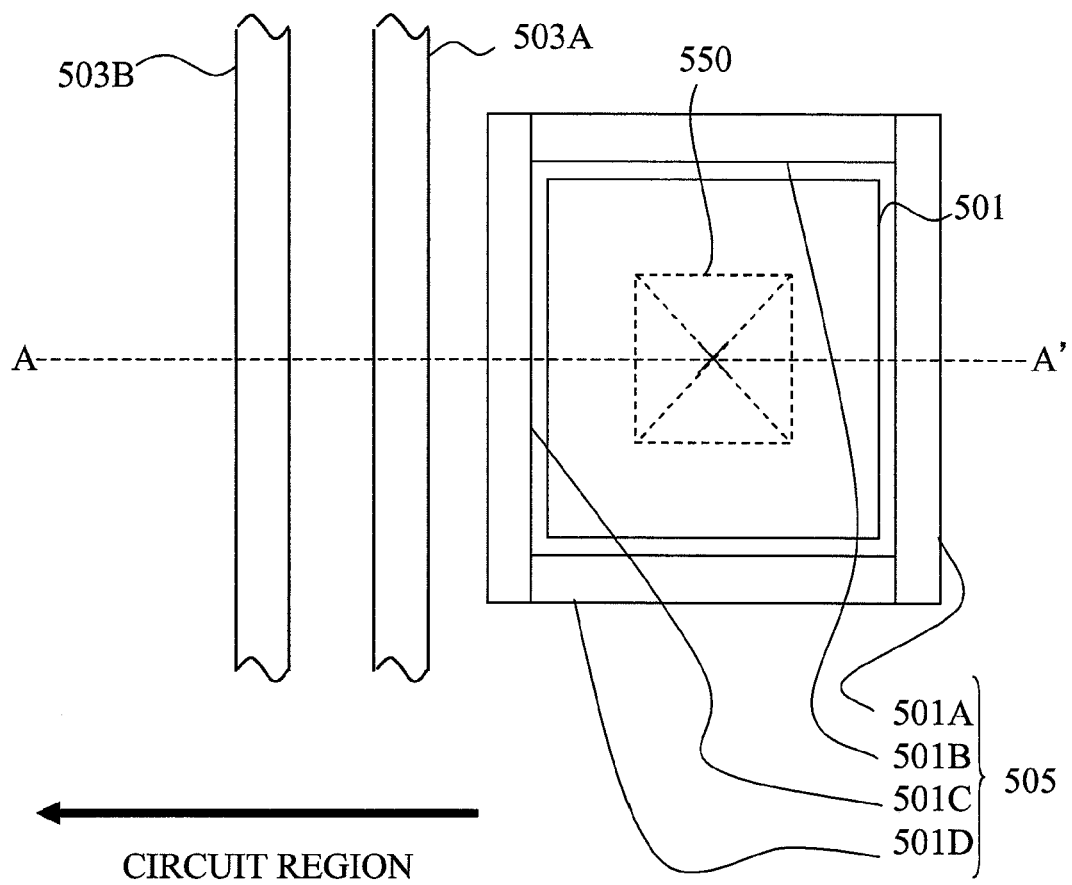
FIG. 16 is a schematic layout plan view of the fifth embodiment of the present invention.

Then, in the semiconductor device having the multilayer wiring described above in the present embodiment (FIG. 14E), according to the manufacturing process of the silicon through electrode of the first embodiment, a semiconductor device having a first back-surface insulating film 600 and a second back-surface insulating film 601 made of silicon oxide and a silicon through electrode 800 made of tantalum and copper is formed (FIG. 15).

FIG. 16 shows part (the silicon through hole, the second metal wiring, and the adjacent metal wirings) of the layout plan view of the semiconductor device formed in the above-described process. In the cross-sectional view shown in FIG. 15, the silicon through hole is added to the cross section taken along the line A-A' in FIG. 16.

In FIG. 16, regions 501A, 501B, 501C, and 501D constituting the second metal wiring form a ring-shaped frame 505 and enclose a silicon through hole region 550. Herein, the second metal wiring region 501 is disposed so as to be completely enclosed in the ring-shaped frame 505. Furthermore, an adjacent parallel metal wiring region 503A and an adjacent parallel metal wiring region 503B are laid outside the ring-shaped frame 505.

When the performance of the semiconductor device formed in this manner is checked, like the one shown as the comparative example of the first embodiment, increase in the parasitic capacitance, increase in the via chain resistance, and conduction failure are found in the semiconductor device in which the ring-shaped frame 505 is not provided compared with the case in which the ring-shaped frame 505 is provided.

In other words, the semiconductor device having the wiring having low parasitic capacitance and low via resistance in the circuit region in the vicinity of the silicon through hole can be formed by forming the metal wirings in plural layers so as to enclose the region in which the silicon through hole is to be formed, forming the ring-shaped structure by using the metal wirings and connection vias, and further forming a protective insulating film to enclose the silicon through hole according to the present embodiment.

Also, the semiconductor device having the wiring having low parasitic capacitance and low via resistance in the circuit region in the vicinity of the silicon through hole can be formed by forming a film through which moisture is hard to pass such as a metal wiring, an under-wiring insulating film, or a protective insulating film between the interlayer insulating film using the Low-k material exposed from the opening of the silicon through hole and the interlayer insulating film using the Low-k material formed in the circuit wiring region according to the present embodiment.

In the present embodiment, unlike the first embodiment, the metal wiring for making direct electrical connection to the silicon through electrode and the metal wiring serving as a barrier of moisture permeation are separately laid out and a gap is provided between both of the metal wirings. Therefore, the metal wiring for making the electrical connection is not necessarily required to play the role of the moisture permeation barrier. Therefore, the degree of freedom of wiring layout can be increased.

In the present embodiment, two layers of metal wirings, that is, the first metal wirings (400A and 4003) and the second metal wirings (401A and 401B) are used as moisture barrier films for preventing moisture absorption of the Low-k material. However, three or more wiring layers can also be utilized. The larger the number of used wiring layers, the larger the margin with respect to the overetching can be made in the etching for forming the opening of the silicon through via. On the other hand, since the region in which the moisture barrier film is formed cannot be used as a circuit wiring, the layout of wiring is restricted.

In the present embodiment, etching of the silicon through hole 701 is stopped at an intermediate part of the second interlayer insulating film 202 using the Low-k material. However, the effectiveness of the present invention is not limited to this case. Since the condition for making the silicon through electrode function is that the etching penetrates through at least the substrate 100 on which the semiconductor device has been formed, and reaches the first metal wiring 400, etching may proceed to the upper wiring layer of the second interlayer insulating film 202 using the Low-k material. However, if etching proceeds to the third interlayer insulating film 203 using the Low-k material or above and the Low-k material and the silicon through hole 701 are in contact with each other, in order to limit the region in which moisture permeates to the Low-k material, the ring-shaped frame 505 has to be provided also in the upper wiring layer to which etching of the silicon through hole 701 reaches.

Moreover, in the present embodiment, the third metal wiring 402 is used as a method for extracting the wiring which is electrically connected to the silicon through electrode 800. However, the wiring may be extracted by the second metal wiring layer.

Moreover, in the present embodiment, tantalum and copper are used as the materials of the ring-shaped frame 505. However, other materials can be used as long as the effect of preventing passage of moisture can be expected by the materials like SiCN. When a metal is used as a material of the ring-shaped frame, the effect of preventing passage of moisture can be expected if the ring-shaped frame has a thickness of about 10 nm. Furthermore, in the layout plan view, the shape of the ring-shaped frame is not required to be quadrangular, and may surround the periphery of the silicon through electrode a plurality of times.

Moreover, in the present embodiment, the metal wiring does not have an opening. However, the metal wiring is not necessarily required to have no opening. For example, part of the metal wiring may include an opening in order to improve flatness.

The first, second, and third metal wirings use the material mainly made of copper in the present embodiment, but may use a material mainly made of tungsten.

The first, second, and third metal wirings use tantalum as barrier metal in the present embodiment, but the material is not limited thereto. For example, a tantalum compound, titanium, tungsten, ruthenium, manganese, or a compound thereof can be used. Furthermore, a plurality of films may be stacked in the structure of the barrier metal.

In the present embodiment, the interlayer insulating film uses the insulating film made of SiOC formed by using plasma CVD. However, the effects of the present invention are not limited to this material. Similar effects can be expected even by a porous Low-k film or an organic Low-k film. A method other than CVD can also be used as a film formation method.

In the present embodiment, insulating films made of SiCN formed by using plasma CVD are used as the material of the first, second, and third protective insulating films. However, the material is not limited thereto. For example, SiN, SiC, and a stacked structure thereof may be used.

Sixth Embodiment

The present embodiment is one of application examples of the second embodiment, and the embodiment will be described with reference to cross-sectional views (FIG. 17 and FIG. 18) showing the manufacturing process of a semiconductor device. FIG. 19 is a layout plan view of FIG. 18. Hereinafter, the process will be sequentially described.

Figure 17A:
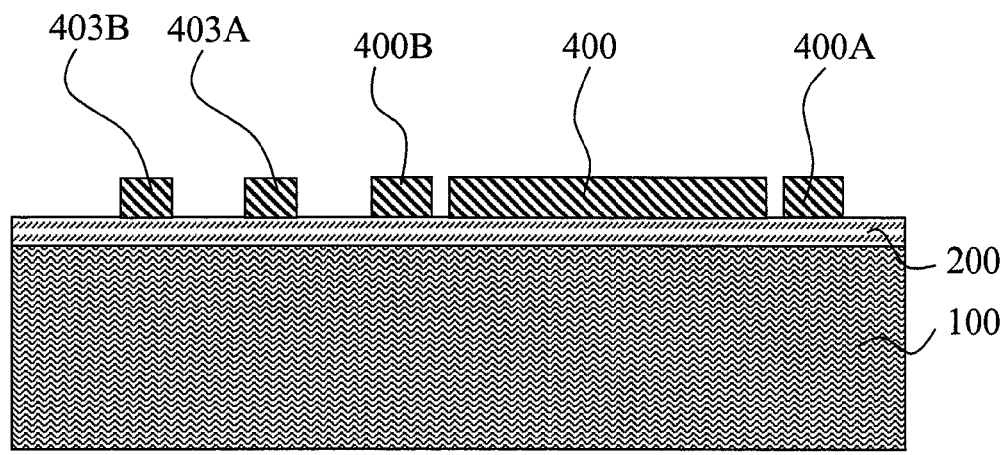
FIG. 17A is a schematic cross-sectional view of a main part of the manufacturing process of a semiconductor device of the sixth embodiment of the present invention.

An under-wiring insulating film 200 made up of a silicon oxide film having a film thickness of 250 nm and silicon nitride having a film thickness of 50 nm is formed on a substrate 100 on which a semiconductor element has been formed, an opening is provided in a desired region of the under-wiring insulating film 200, and a tungsten plug is formed therein by using CVD and chemical mechanical polishing. Then, a stacked structure of a titanium nitride film having a film thickness of 50 nm, an aluminum film having a film thickness of 300 nm, and a titanium nitride film having a film thickness of 50 nm is formed by using sputtering, and the titanium nitride film and the aluminum film in the region other than the region in which metal wirings are desired to be formed are removed by using lithography and dry etching, thereby forming a first metal wiring 400, a first metal wiring 400A, a first metal wiring 400B, an adjacent parallel metal wiring 403A, and a first metal wiring 403 made of titanium nitride and aluminum (FIG. 17A).

Figure 17B:
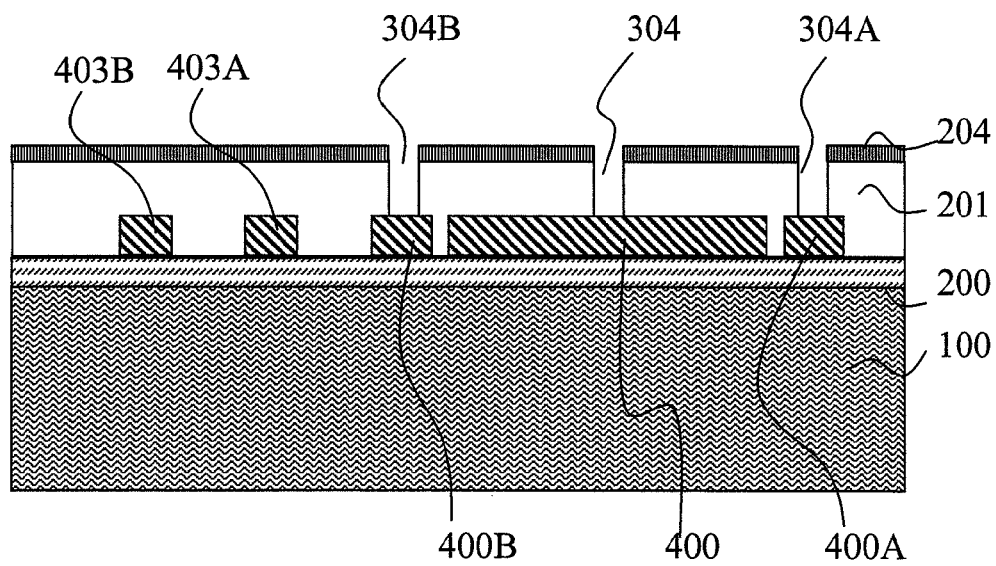
FIG. 17B is a schematic cross-sectional view of the main part of the manufacturing process continued from FIG. 17A.

Then, after carbon-containing silicon oxide (SiOC) having a film thickness of 750 nm is formed, the surface thereof is planarized by using chemical mechanical polishing to provide a first interlayer insulating film 201, and a first protective insulating film 204 made of silicon oxide (SiO) and having a film thickness of 25 nm is formed by using plasma CVD. Openings are provided in desired regions of the first interlayer insulating film 201 and the first protective insulating film 204 using the Low-k material, thereby forming first connection via openings 304, 304A, and 304B. In this process, the first connection via opening 304 is formed so that part of the first metal wiring 400 is exposed, the first connection via opening 304A is formed so that part of the first metal wiring 400A is exposed, and the first connection via opening 304A is formed so that part of the first metal wiring 400B is exposed (FIG. 17B).

Figure 17C:
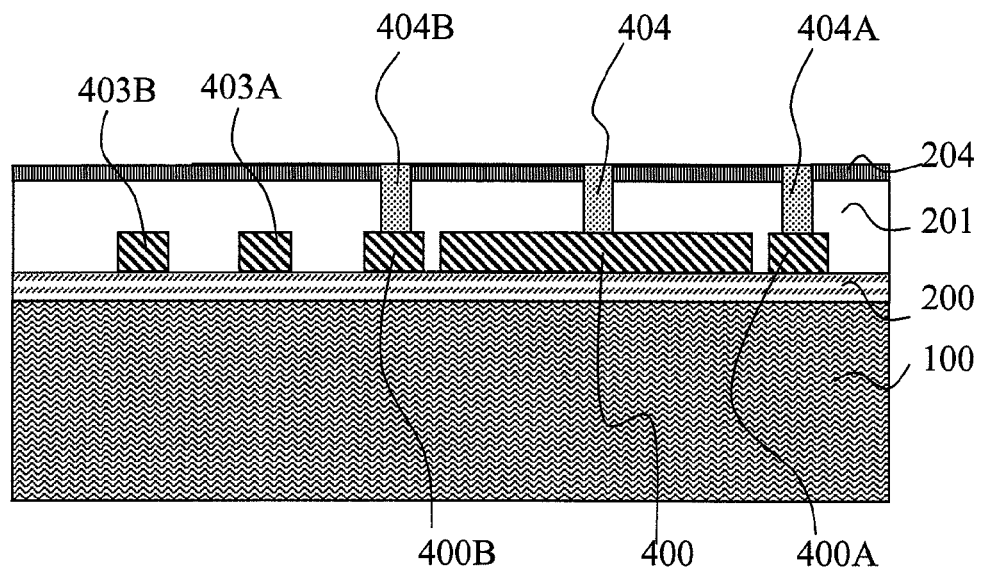
FIG. 17C is a schematic cross-sectional view of the main part of the manufacturing process continued from FIG. 17B.

Then, after a tungsten film is formed by using sputtering and CVD so as to fill the first connection via openings 304, 304A, and 304B, the tungsten film in the region other than the openings is removed by using chemical mechanical polishing, thereby forming first connection vias 404, 404A, and 404B as shown in FIG. 17C.

Figure 17D:
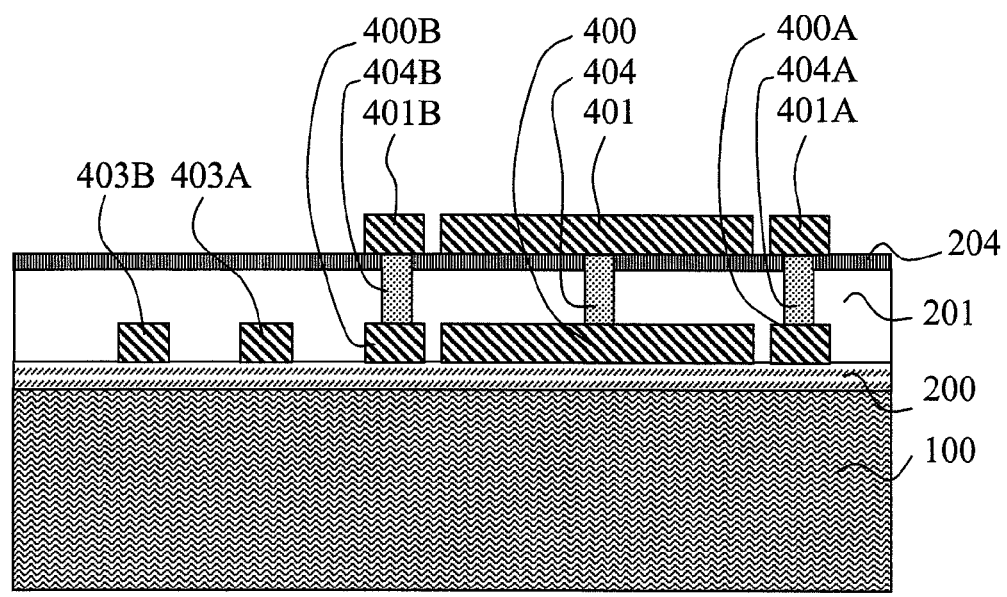
FIG. 17D is a schematic cross-sectional view of the main part of the manufacturing process continued from FIG. 17C.

Then, a stacked structure of a titanium nitride film having a film thickness of 50 nm, an aluminum film having a film thickness of 300 nm, and a titanium nitride film having a film thickness of 50 nm is formed by using sputtering, and the titanium nitride film and the aluminum film in the region other than a desired region are removed by using lithography and dry etching, thereby forming second metal wirings 401, 401A, and 401B made of titanium nitride and aluminum. In this process, the second metal wiring 401 is formed so as to cover the first connection via 404, the second metal wiring 401A is formed so as to cover the first connection via 404A, and the second metal wiring 401B is formed so as to cover the first connection via 404B (FIG. 17D).

Figure 17E:
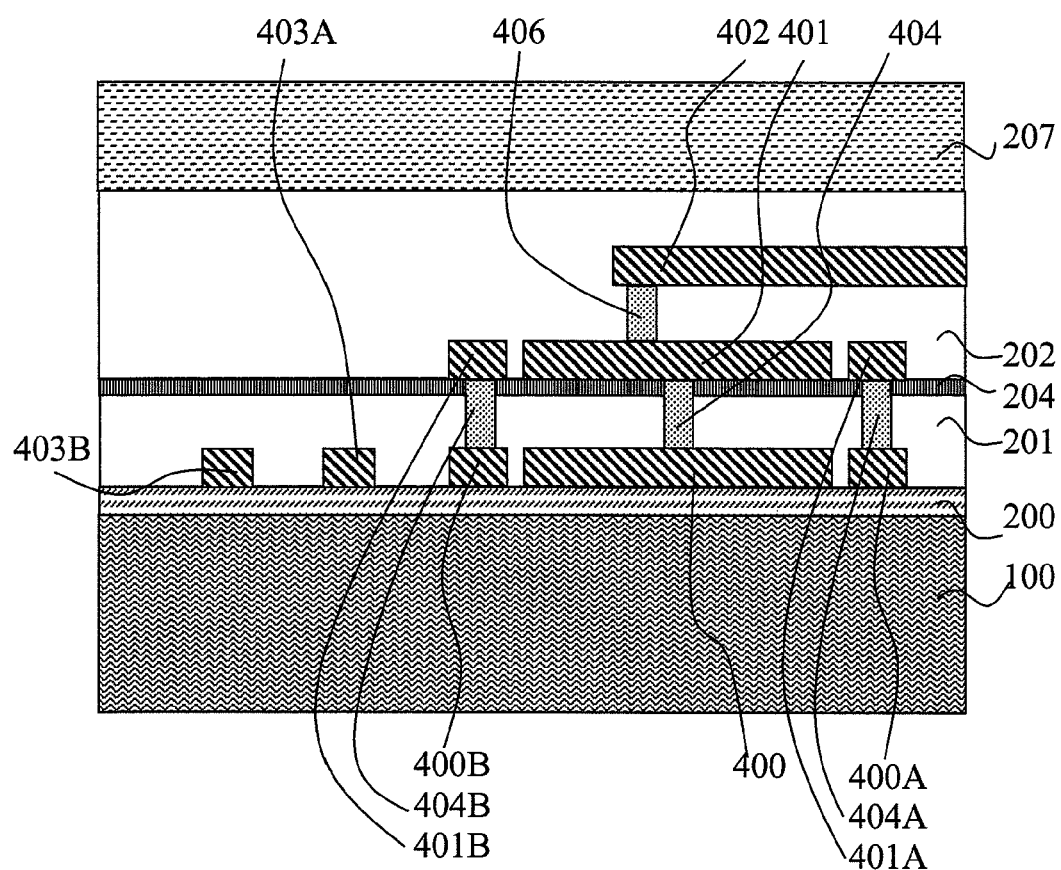
FIG. 17E is a schematic cross-sectional view of the main part of the manufacturing process continued from FIG. 17D.

Then, according to the process shown in the second embodiment, an interlayer insulating film made of carbon-containing silicon oxide (SiOC) and having a film thickness of 750 nm, a second connection via 406 made of tungsten, a third metal wiring 402 having a film thickness of 50 nm and made of titanium nitride and aluminum, an interlayer insulating film having a film thickness of 750 nm and made of carbon-containing silicon oxide (SiOC), an aluminum pad made of titanium nitride and aluminum, and a passivation film 207 made up of a silicon oxide film having a film thickness of 200 nm and a silicon nitride film having a film thickness of 250 nm are formed. The semiconductor device having a multilayer wiring as shown in FIG. 17E can be formed through the above-described process.

Figure 18:
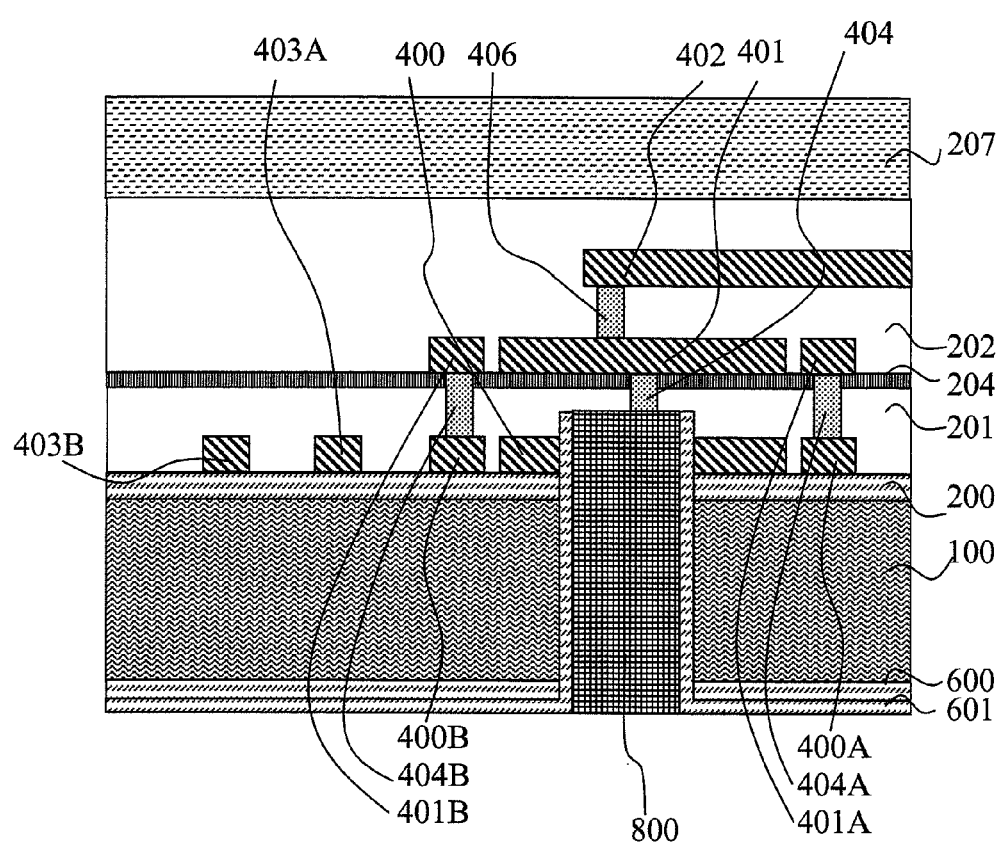
FIG. 18 is a schematic cross-sectional view of the main part of the manufacturing process of the semiconductor device of the sixth embodiment of the present invention continued from FIG. 17E.
Figure 19:
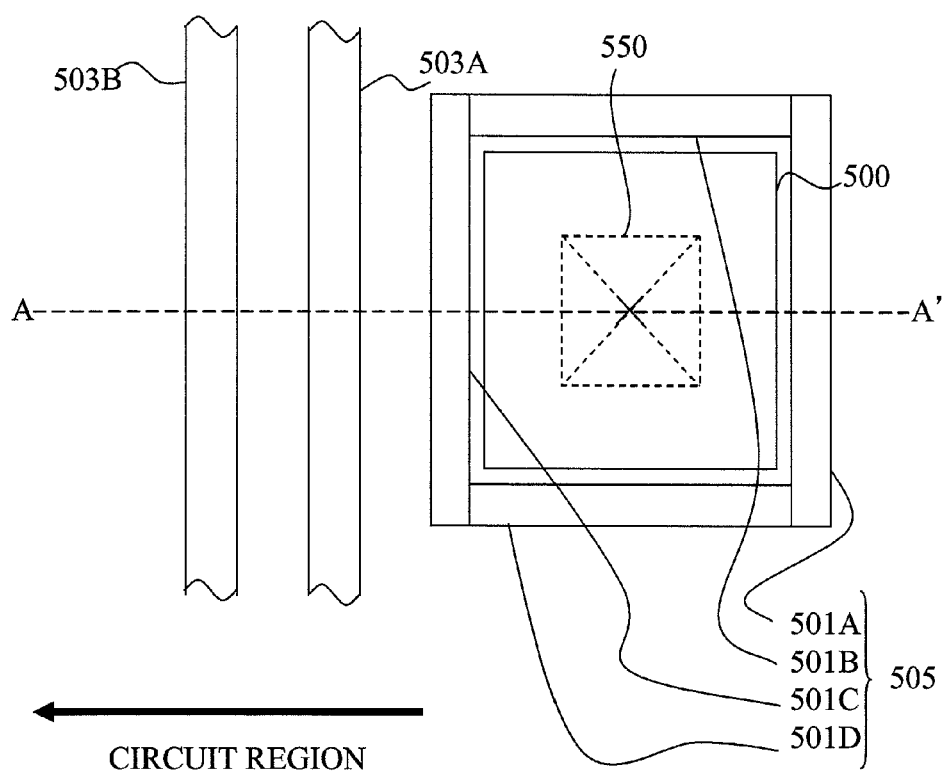
FIG. 19 is a schematic layout plan view of the sixth embodiment of the present invention.

Then, in the semiconductor device having the multilayer wiring described above in the present embodiment (FIG. 17E), according to the manufacturing process of the silicon through electrode of the second embodiment, a semiconductor device having a first back-surface insulating film 600 and a second back-surface insulating film 601 made of silicon oxide and a silicon through electrode 800 made of tantalum and copper is formed (FIG. 18).

FIG. 19 shows part (the silicon through hole, the first metal wiring, and the adjacent parallel metal wirings) of the layout plan view of the semiconductor device formed in the above-described process. The cross-sectional view shown in FIG. 18 is a cross section taken along the line A-A' in FIG. 19. In FIG. 19, regions 501A, 501B, 501C, and 501D constituting the first metal wiring form a ring-shaped frame 505 and enclose a silicon through hole region 550. Herein, the first metal wiring region 500 is disposed so as to be completely enclosed in the ring-shaped frame 505. Furthermore, an adjacent parallel metal wiring region 503A and an adjacent parallel metal wiring region 503B are laid outside the ring-shaped frame 505.

When the performance of the semiconductor device formed in this manner is checked, like the one shown as the comparative example of the first embodiment, increase in the parasitic capacitance, increase in the via chain resistance, and conduction failure are found in the semiconductor device in which the ring-shaped frame 505 is not provided compared with the case in which the ring-shaped frame 505 is provided.

In other words, the semiconductor device having the wiring having low parasitic capacitance and low via resistance in the circuit wiring region in the vicinity of the silicon through hole can be formed by forming the metal wirings in plural layers so as to enclose the region in which the silicon through hole is to be formed, forming the ring-shaped structure by using the metal wirings and connection vias, and further forming a protective insulating film to enclose the silicon through hole according to the present embodiment.

Also, the semiconductor device having the wiring having low parasitic capacitance and low resistance in the circuit wiring region in the vicinity of the silicon through hole can be formed by forming a film through which moisture is hard to pass such as a metal wiring, a connection via, an under-wiring insulating film, or a protective insulating film between the interlayer insulating film using the Low-k material exposed from the opening of the silicon through hole and the interlayer insulating film using the Low-k material formed in the circuit wiring region according to the present embodiment.

In the present embodiment, unlike the first embodiment, the metal wiring for making direct electrical connection to the silicon through electrode and the metal wiring serving as a barrier of moisture permeation are separately laid out and a gap is provided between both of the metal wirings. Therefore, the metal wiring for making the electrical connection is not necessarily required to play the role of the moisture permeation barrier. Therefore, the degree of freedom of wiring layout can be increased.

In the present embodiment, two layers of metal wirings, that is, the first metal wirings (400A and 400B) and the second metal wirings (401A and 401B), and the first connection vias (404A and 404B) connecting therebetween are used as moisture barrier films for preventing moisture absorption of the Low-k material. However, three or more wiring layers and the connection vias connecting the wiring layers can also be utilized. The larger the number of used wiring layers, the larger the margin with respect to the overetching can be made in the etching for forming the opening of the silicon through via. On the other hand, since the region in which the moisture barrier film is formed cannot be used as a circuit wiring, the layout of wiring is restricted.

In the present embodiment, etching of the silicon through hole 701 is stopped at an intermediate part of the layer in which the first connection vias 404 are formed. However, the effectiveness of the present invention is not limited to this case. Since the condition for making the silicon through electrode function is that the etching penetrates through at least the substrate 100 on which the semiconductor device has been formed, and reaches the first metal wiring 400, etching may proceed to the upper wiring layer of the second metal wiring layer. However, if etching proceeds to the upper wiring layer of the second metal wiring layer and the Low-k material and the silicon through hole 701 are in contact with each other, the region in which moisture permeates to the Low-k material has to be limited, and in order to form the upper metal wiring having the shape that encloses the ring-shaped frame 505, the ring-shaped frame 505 has to be formed also in the upper wiring layer to which etching of the silicon through hole 701 reaches.

Moreover, in the present embodiment, the third metal wiring 402 is used as a method for extracting the wiring which is electrically connected to the silicon through electrode 800. However, the wiring may be extracted by the second metal wiring layer.

The first, second, and third metal wirings use the material mainly made of aluminum in the present embodiment, but may use a material mainly made of tungsten.

Moreover, in the present embodiment, tungsten and Al are used as the materials of the ring-shaped frame 505. However, other materials can be used as long as the effect of preventing passage of moisture can be expected by the materials like SiCN. When a metal is used as a material of the ring-shaped frame, the effect of preventing passage of moisture can be expected if the ring-shaped frame has a thickness of about 10 nm. Furthermore, in the layout plan view, the shape of the ring-shaped frame is not required to be quadrangular, and may surround the periphery of the silicon through electrode a plurality of times.

Moreover, in the present embodiment, a main component of the first, second, and third metal wirings uses aluminum, but may use tungsten.

The first, second, and third metal wirings use titanium nitride as barrier metal in the present embodiment, but the material is not limited thereto. For example, tungsten, molybdenum, nickel, or a compound thereof can be used. Furthermore, a plurality of films may be stacked in the structure of the barrier metal.

In the present embodiment, the interlayer insulating film uses the insulating film made of SiOC. However, the effects of the present invention are not limited to this material. Similar effects can be expected even by a porous Low-k film or an organic Low-k film.

Moreover, in the present embodiment, an insulating film made of silicon oxide formed by using plasma CVD is used as the material of the first protective insulating film. However, the material is not limited to this material. For example, the material may be SiN, SiCN, or a stacked structure thereof.

Seventh Embodiment

The present embodiment is one of application examples of the fifth embodiment, and the embodiment will be described with reference to cross-sectional views (FIG. 20 and FIG. 21) showing the manufacturing process of a semiconductor device. FIG. 22 is a layout plan view of FIG. 21. Hereinafter, the process will be sequentially described.

Figure 20A:
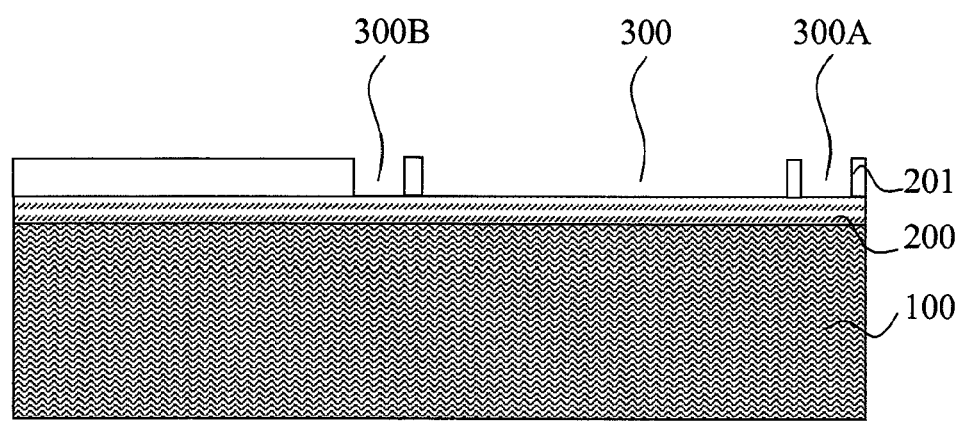
FIG. 20A is a schematic cross-sectional view of a main part of the manufacturing process of a semiconductor device of the seventh embodiment of the present invention.
Figure 20B:
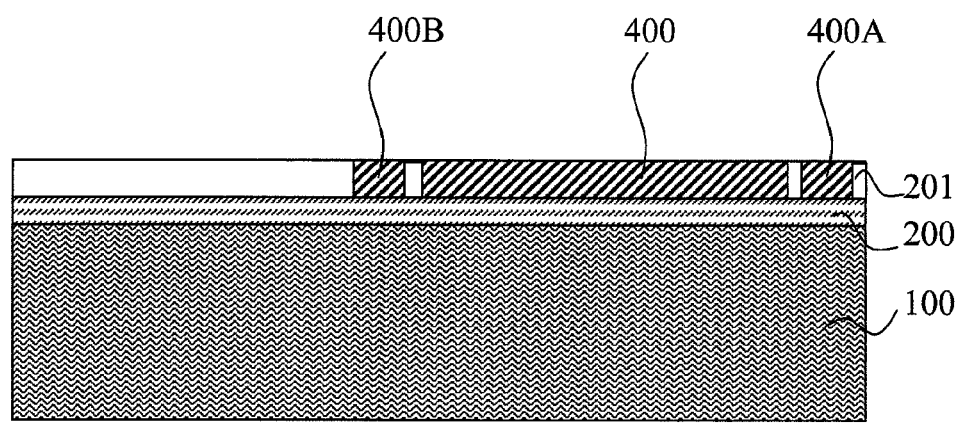
FIG. 20B is a schematic cross-sectional view of the main part of the manufacturing process continued from FIG. 20A.

An under-wiring insulating film 200 made up of a silicon oxide film having a film thickness of 250 nm and silicon nitride having a film thickness of 50 nm is formed on a substrate 100 on which a semiconductor element has been formed, an opening is formed in a desired region of the under-wiring insulating film 200, and a tungsten plug is formed therein by using CVD and chemical mechanical polishing. Then, a first interlayer insulating film 201 using a Low-k material made of carbon-containing silicon oxide (SiOC) and having a film thickness of 100 nm is formed by using plasma CVD, and first metal wiring openings 300, 300A, and 300B are formed by using lithography and dry etching at least in the regions of the first interlayer insulating film 201 in which metal wirings are desired to be formed (FIG. 20A). Sequentially, a tantalum film having a film thickness of 50 nm is formed by using sputtering, and a copper film is formed by using sputtering and electrolytic plating so as to fill the metal wiring openings 300, 300A, and 300B. Thereafter, the tantalum film and the copper film in the region other than the first metal wiring openings 300, 300A, and 300B are removed by using chemical mechanical polishing, thereby forming first metal wirings 400, 400A, and 400B as shown in FIG. 20B.

Figure 20C:
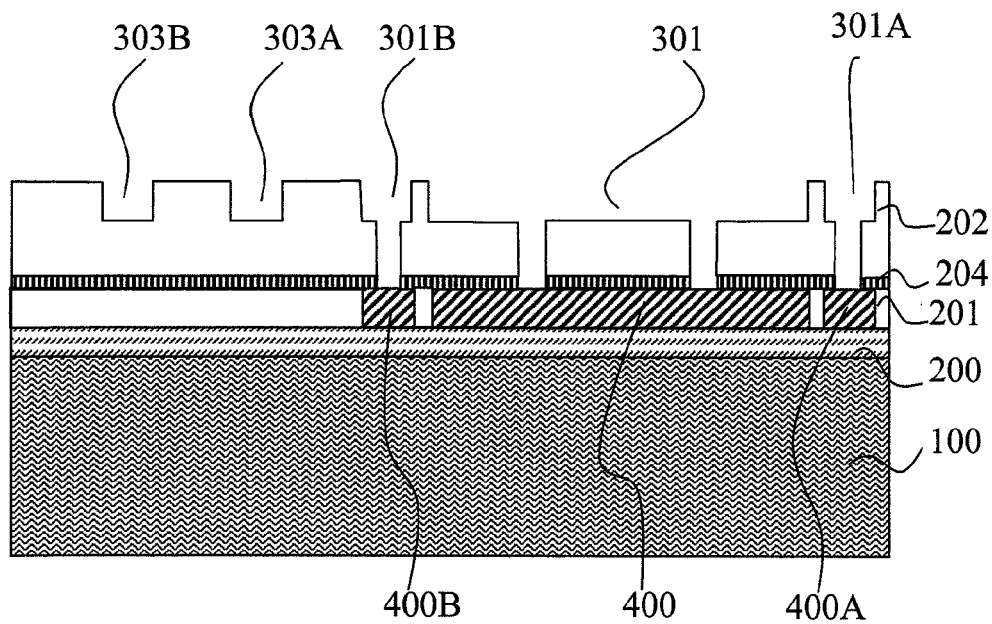
FIG. 20C is a schematic cross-sectional view of the main part of the manufacturing process continued from FIG. 20B.

Then, a first protective insulating film 204 made of nitrogen-containing silicon carbide (SiCN) and having a film thickness of 25 nm is formed by using plasma CVD, and a second interlayer insulating film 202 using a Low-k material made of SiOC and having a film thickness of 250 nm is formed on the first protective insulating film 204 by using plasma CVD. Openings are provided in desired regions of the interlayer insulating film 202 by using lithography and dry etching twice, and the openings are used as second metal wiring openings 301, 301A, and 301B and adjacent parallel metal wiring openings 303A and 303B. In this process, the second metal wiring opening 301 is formed so that part of the first metal wiring 400 is exposed, the second metal wiring opening 301A is formed so that part of the first metal wiring 400A is exposed, and the second metal wiring opening 301B is formed so that part of the first metal wiring 400B is exposed (FIG. 20C).

Figure 20D:
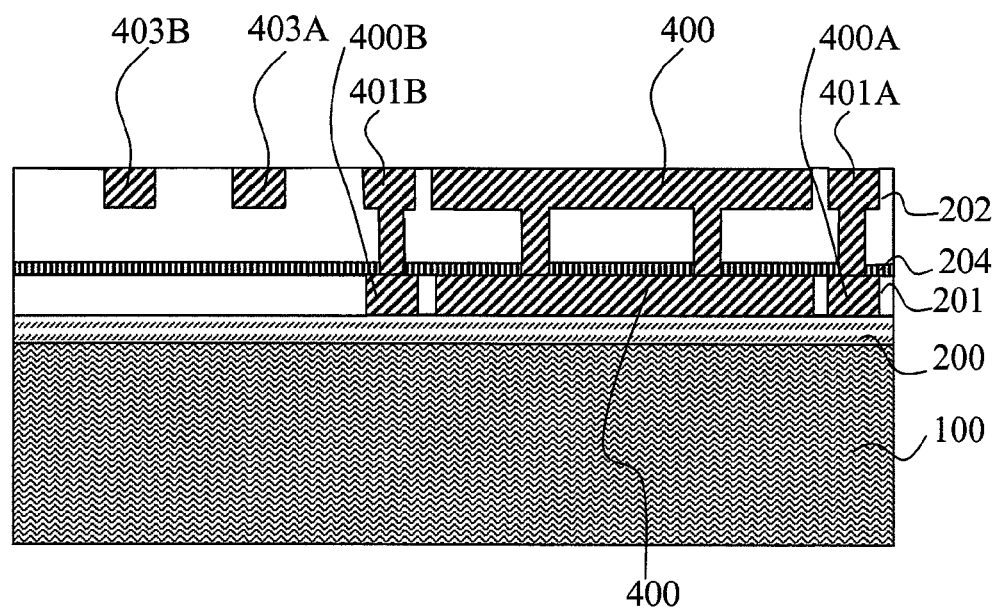
FIG. 20D is a schematic cross-sectional view of the main part of the manufacturing process continued from FIG. 20C.

Then, sequentially, a tantalum film having a film thickness of 50 nm is formed by using sputtering, and a copper film having a film thickness of 500 nm is formed by using sputtering and electrolytic plating so as to fill the second metal wiring openings 301, 301A, and 301B and adjacent parallel metal wiring openings 303A and 303B. Thereafter, the tantalum film and the copper film in the region other than the openings are removed by using chemical mechanical polishing, thereby forming second metal wirings 401, 401A, and 401B and adjacent parallel metal wirings 403A and 403B as shown in FIG. 20D. Herein, the first metal wiring 400A, the second metal wiring 401A, the first metal wiring 400B, and the second metal wiring 401B are connected in the same layer to form a ring-shaped frame 505.

Figure 20E:
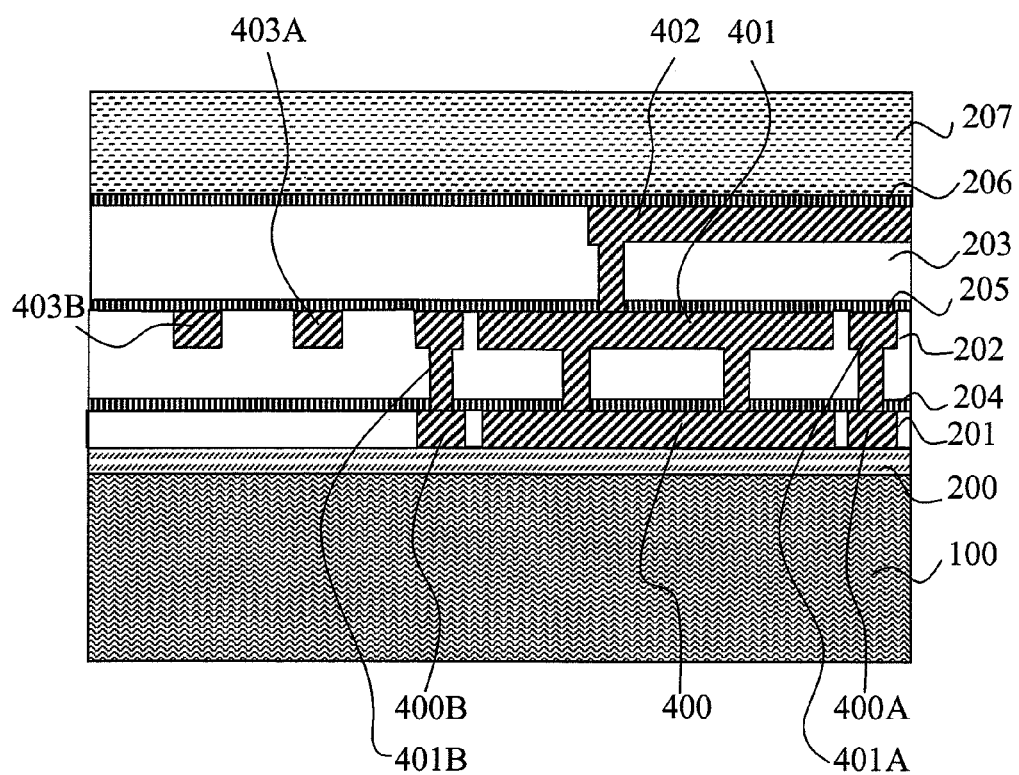
FIG. 20E is a schematic cross-sectional view of the main part of the manufacturing process continued from FIG. 20D.

Then, according to the process shown in the first embodiment, a second protective insulating film 205 made of SiCN and having a film thickness of 25 nm, a third interlayer insulating film 203 having a film thickness of 250 nm and using a Low-k material made of SiOC, and a third metal wiring 402 having a film thickness of 50 nm and made up of a tantalum film and a copper film are sequentially formed. Furthermore, a third protective insulating film 206 having a film thickness of 25 nm and made of SiCN and an aluminum pad made of titanium nitride and aluminum are formed, and a passivation film 207 made up of a silicon oxide film having a film thickness of 200 nm and silicon nitride having a film thickness of 250 nm is formed, thereby forming the semiconductor device having the multilayer wiring as shown in FIG. 20E.

Figure 21:
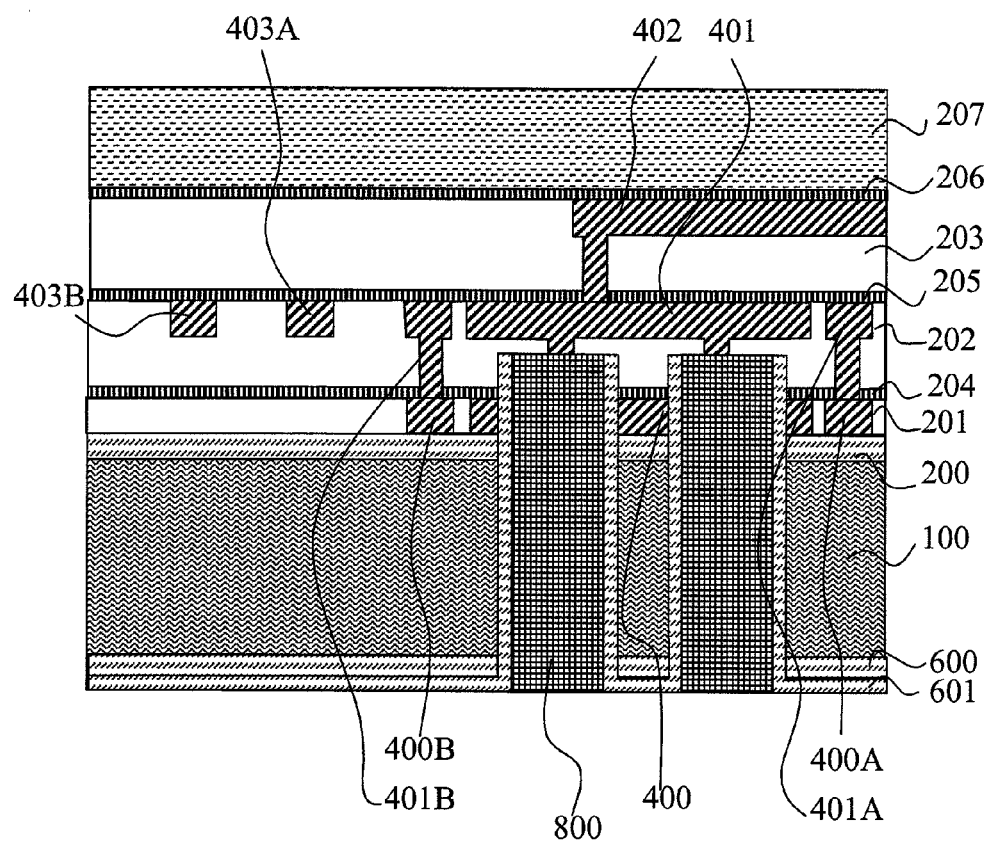
FIG. 21 is a schematic cross-sectional view of the main part of the manufacturing process of the semiconductor device of the seventh embodiment of the present invention continued from FIG. 20E.
Figure 22:
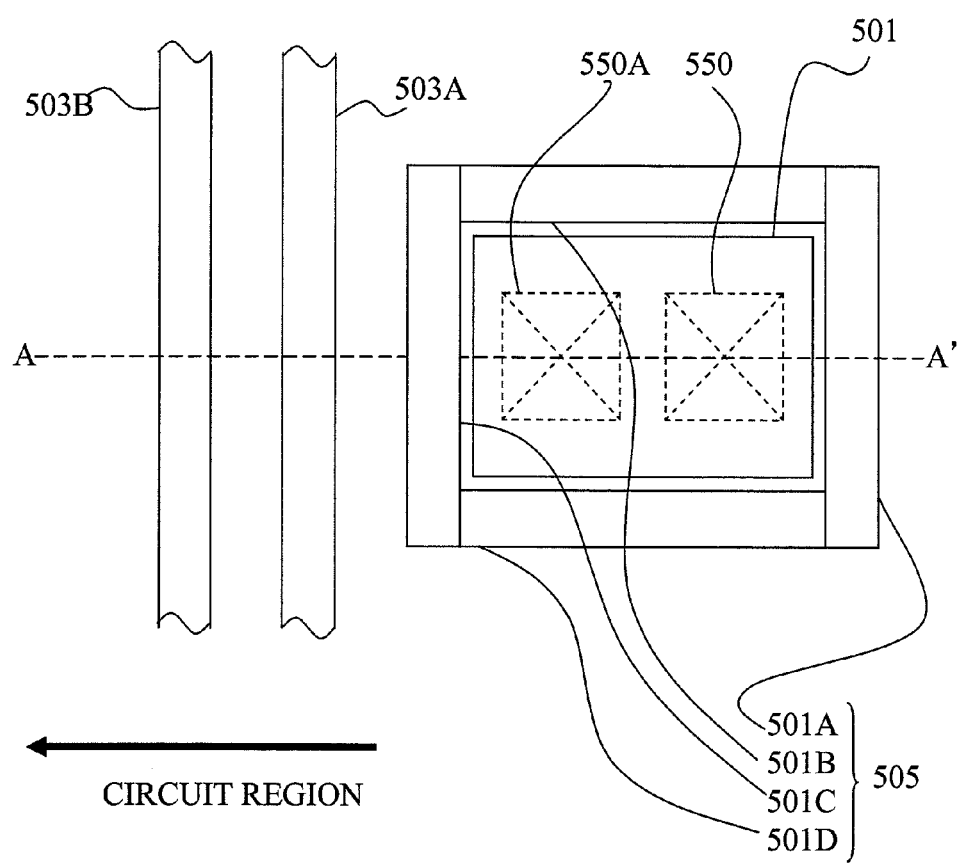
FIG. 22 is a schematic layout plan view of the seventh embodiment of the present invention.

Then, in the semiconductor device having the multilayer wiring described above in the present embodiment (FIG. 20E), according to the manufacturing process of the silicon through electrode of the second embodiment, a semiconductor device having a first back-surface insulating film 600 and a second back-surface insulating film 601 made of silicon oxide and a plurality of silicon through electrodes 800 made of tantalum and copper is formed (FIG. 21).

FIG. 22 shows part (the silicon through holes, the second metal wiring, and the adjacent parallel metal wirings) of the layout plan view of the semiconductor device formed in the above-described process. In the cross-sectional view shown in FIG. 21, the silicon through holes are added to the cross section taken along the line A-A' in FIG. 22. In FIG. 22, regions 501A, 501B, 501C, and 501D constituting the second metal wiring form the ring-shaped frame 505 and enclose a plurality of silicon through hole regions 550 and 550A. Herein, the second metal wiring region 501 is disposed so as to be completely enclosed in the ring-shaped frame 505. Furthermore, the adjacent parallel metal wiring region 503A and the adjacent parallel metal wiring region 503B are laid outside the ring-shaped frame 505.

When the performance of the semiconductor device formed in this manner is checked, like the one shown as the comparative example of the first embodiment, increase in the parasitic capacitance, increase in the via chain resistance, and conduction failure are found in the semiconductor device in which the ring-shaped frame 505 is not provided compared with the case in which the ring-shaped frame 505 is provided.

In other words, the semiconductor device having the wiring having low parasitic capacitance and low via resistance in the circuit wiring region in the vicinity of the silicon through hole can be formed by forming the metal wirings in plural layers so as to enclose the region in which the silicon through hole is to be formed, forming the ring-shaped structure by using the metal wirings and connection vias, and further forming a protective insulating film to enclose the silicon through hole according to the present embodiment.

Also, the semiconductor device having the wiring having low parasitic capacitance and low resistance in the circuit wiring region in the vicinity of the silicon through hole can be formed by forming a film through which moisture is hard to pass such as a metal wiring, an under-wiring insulating film, or a protective insulating film between the interlayer insulating film using the Low-k material exposed from the opening of the silicon through hole and the interlayer insulating film using the Low-k material formed in the circuit wiring region according to the present embodiment.

In the present embodiment, unlike the fifth embodiment, the plurality of silicon through electrodes are enclosed in the ring-shaped frame. Since the plurality of silicon through electrodes are connected to one metal wiring compared with the fifth embodiment, there is an advantage that reliability of electrical connection can be improved.

In the present embodiment, two layers of metal wirings, that is, the first metal wirings (400A and 400B) and the second metal wirings (401A and 401B) are used as moisture barrier films for preventing moisture absorption of the Low-k material. However, three or more wiring layers can also be utilized. The larger the number of used wiring layers, the larger the margin with respect to the overetching can be made in the etching for forming the opening of the silicon through via. On the other hand, since the region in which the moisture barrier film is formed cannot be used as a circuit wiring, the layout of wiring is restricted.

In the present embodiment, etching of the silicon through hole 701 is stopped at an intermediate part of the second interlayer insulating film 202 using the Low-k material. However, the effectiveness of the present invention is not limited to this case. Since the condition for making the silicon through electrode function is that the etching penetrates through at least the substrate 100 on which the semiconductor device has been formed, and reaches the first metal wiring 400, etching may proceed to the upper wiring layer of the second interlayer insulating film 202 using the Low-k material. However, if etching proceeds to the third interlayer insulating film 203 using the Low-k material or above and the Low-k material and the silicon through hole 701 are in contact with each other, in order to limit the region in which moisture permeates to the Low-k material, the ring-shaped frame 505 has to be provided also in the upper wiring layer to which etching of the silicon through hole 701 reaches.

In the present embodiment, one metal wiring is enclosed in the ring-shaped frame. However, a plurality of metal wirings each of which includes at least one or more silicon through electrodes may be enclosed in the ring-shaped frame. Furthermore, the metal wirings to which the silicon through electrodes are connected are not required to be electrically connected.

Moreover, in the present embodiment, the third metal wiring 402 is used as a method for extracting the wiring which is electrically connected to the silicon through electrode 800. However, the wiring may be extracted by the second metal wiring layer.

Moreover, in the present embodiment, tantalum and copper are used as the materials of the ring-shaped frame 505. However, other materials can be used as long as the effect of preventing passage of moisture can be expected by the materials like SiCN. When a metal is used as a material of the ring-shaped frame, the effect of preventing passage of moisture can be expected if the ring-shaped frame has a thickness of about 10 nm. Furthermore, in the layout plan view, the shape of the ring-shaped frame is not required to be quadrangular, and may surround the periphery of the silicon through electrode a plurality of times.

Moreover, in the present embodiment, the metal wiring does not have an opening. However, the metal wiring is not necessarily required to have no opening. For example, part of the metal wiring may include an opening in order to improve flatness.

The first, second, and third metal wirings use the material mainly made of copper in the present embodiment, but may use a material mainly made of tungsten.

The first, second, and third metal wirings use tantalum as barrier metal in the present embodiment, but the material is not limited thereto. For example, a tantalum compound, titanium, tungsten, ruthenium, manganese, or a compound thereof can be used. Furthermore, a plurality of films may be stacked in the structure of the barrier metal.

In the present embodiment, the interlayer insulating film uses the insulating film made of SiOC formed by using plasma CVD. However, the effects of the present invention are not limited to this material. Similar effects can be expected even by a porous Low-k film or an organic Low-k film. A method other than CVD can also be used as a film formation method.

In the present embodiment, insulating films made of SiCN formed by using plasma CVD are used as the material of the first, second, and third protective insulating films. However, the material is not limited thereto. For example, SiN, SiC, and a stacked structure thereof may be used.

Eighth Embodiment

The present embodiment is one of application examples of the sixth embodiment, and the embodiment will be described with reference to cross-sectional views (FIG. 23 and FIG. 24) showing the manufacturing process of a semiconductor device. FIG. 25 is a layout plan view of FIG. 24. Hereinafter, the process will be sequentially described.

Figure 23A:
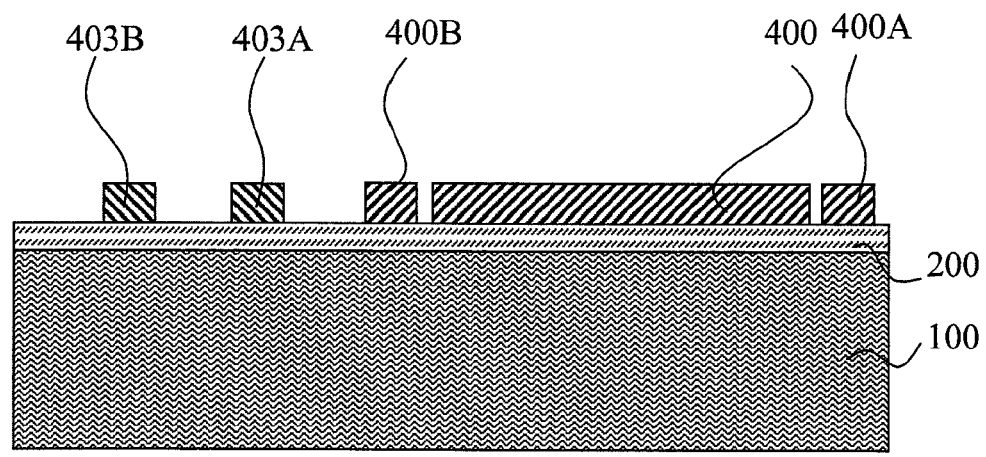
FIG. 23A is a schematic cross-sectional view of a main part of the manufacturing process of a semiconductor device of the eighth embodiment of the present invention.

An under-wiring insulating film 200 made up of a silicon oxide film having a film thickness of 250 nm and silicon nitride having a film thickness of 50 nm is formed on a substrate 100 on which a semiconductor element has been formed, an opening is provided in a desired region of the under-wiring insulating film 200, and a tungsten plug is formed therein by using CVD and chemical mechanical polishing. Then, a stacked structure of a titanium nitride film having a film thickness of 50 nm, an aluminum film having a film thickness of 300 nm, and a titanium nitride film having a film thickness of 50 nm is formed by using sputtering, and the titanium nitride film and the aluminum film in the region other than the region in which metal wirings are desired to be formed are removed by using lithography and dry etching, thereby forming first metal wirings 400, 400A, and 400B, an adjacent metal wiring 403A, and an adjacent metal wiring 403B made of titanium nitride and aluminum (FIG. 23A).

Figure 23B:
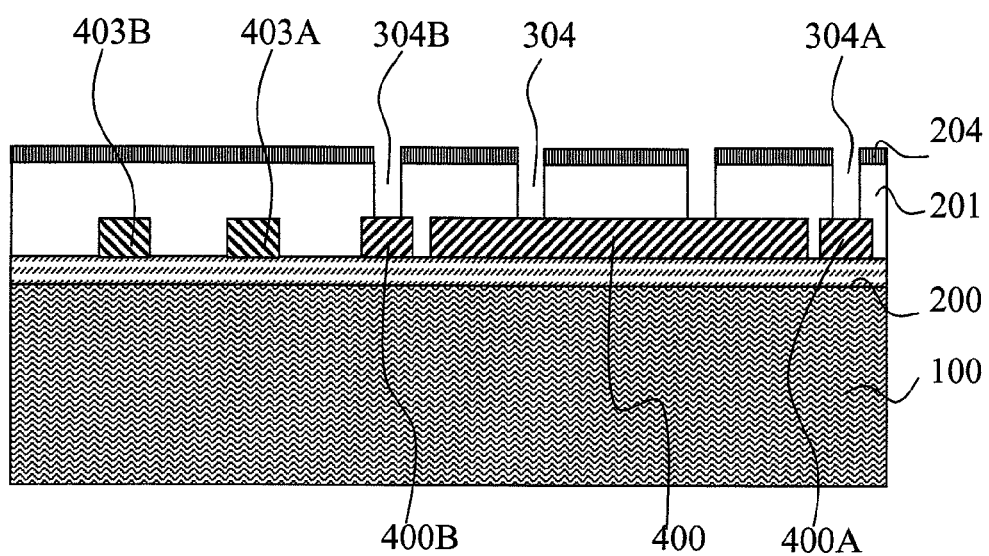
FIG. 23B is a schematic cross-sectional view of the main part of the manufacturing process continued from FIG. 23A.

Then, after carbon-containing silicon oxide (SiOC) having a film thickness of 750 nm is formed, the surface thereof is planarized by using chemical mechanical polishing to form a first interlayer insulating film 201, and a first protective insulating film 204 made of silicon oxide (SiO) and having a film thickness of 25 nm is formed by using plasma CVD. Openings are provided in desired regions in the first interlayer insulating film 201 using the Low-k material and the first protective insulating film 204, thereby providing first connection via openings 304, 304A, and 304B. In this process, the first connection via opening 304 is formed so that part of the first metal wiring 400 is exposed, the first connection via opening 304A is formed so that part of the first metal wiring 400A is exposed, and the first connection via opening 304B is formed so that part of the first metal wiring 400B is exposed (FIG. 23B).

Figure 23C:
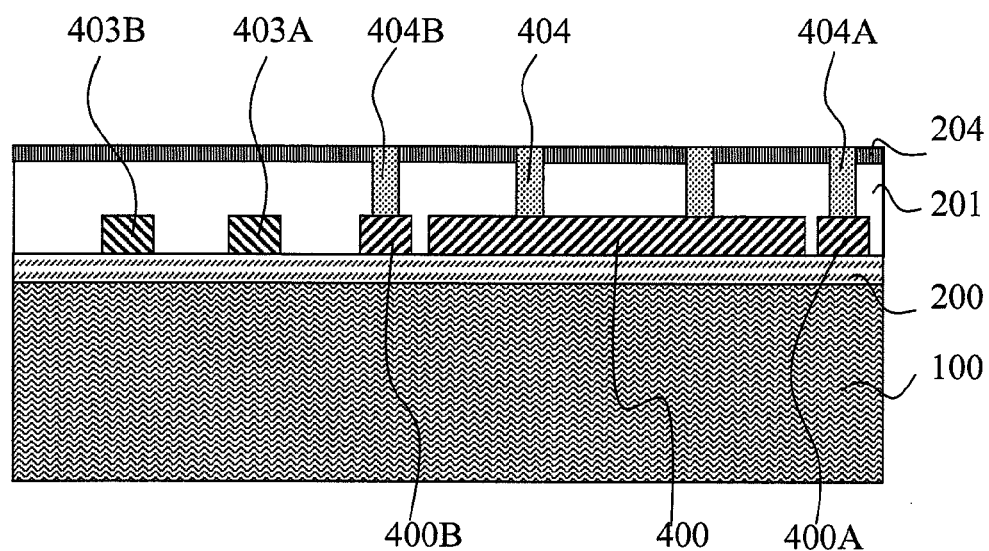
FIG. 23C is a schematic cross-sectional view of the main part of the manufacturing process continued from FIG. 23B.

Then, after a tungsten film is formed by using sputtering and CVD so as to fill the first connection via openings 304, 304A, and 304B, the tungsten film in the region other than the openings is removed by using chemical mechanical polishing, thereby forming a plurality of first connection vias 404, 404A, and 404B as shown in FIG. 23C.

Figure 23D:
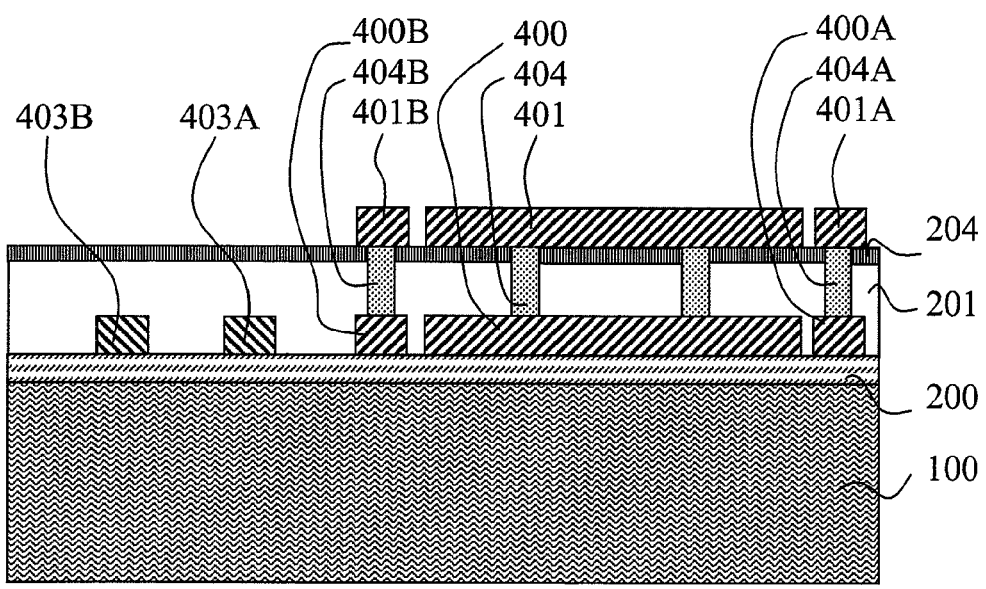
FIG. 23D is a schematic cross-sectional view of the main part of the manufacturing process continued from FIG. 23C.

Then, a stacked structure of a titanium nitride film having a film thickness of 50 nm, an aluminum film having a film thickness of 300 nm, and a titanium nitride film having a film thickness of 50 nm is formed by using sputtering, and the titanium nitride film and the aluminum film in the region other than the desired regions are removed by using lithography and dry etching, thereby forming second metal wirings 401, 401A, and 401B made of titanium nitride and aluminum. In this process, the second metal wiring 401 is formed so as to cover the first connection via 404, the second metal wiring 401A is formed so as to cover the first connection via 404A, and the second metal wiring 401B is formed so as to cover the first connection via 404B (FIG. 23D).

Figure 23E:
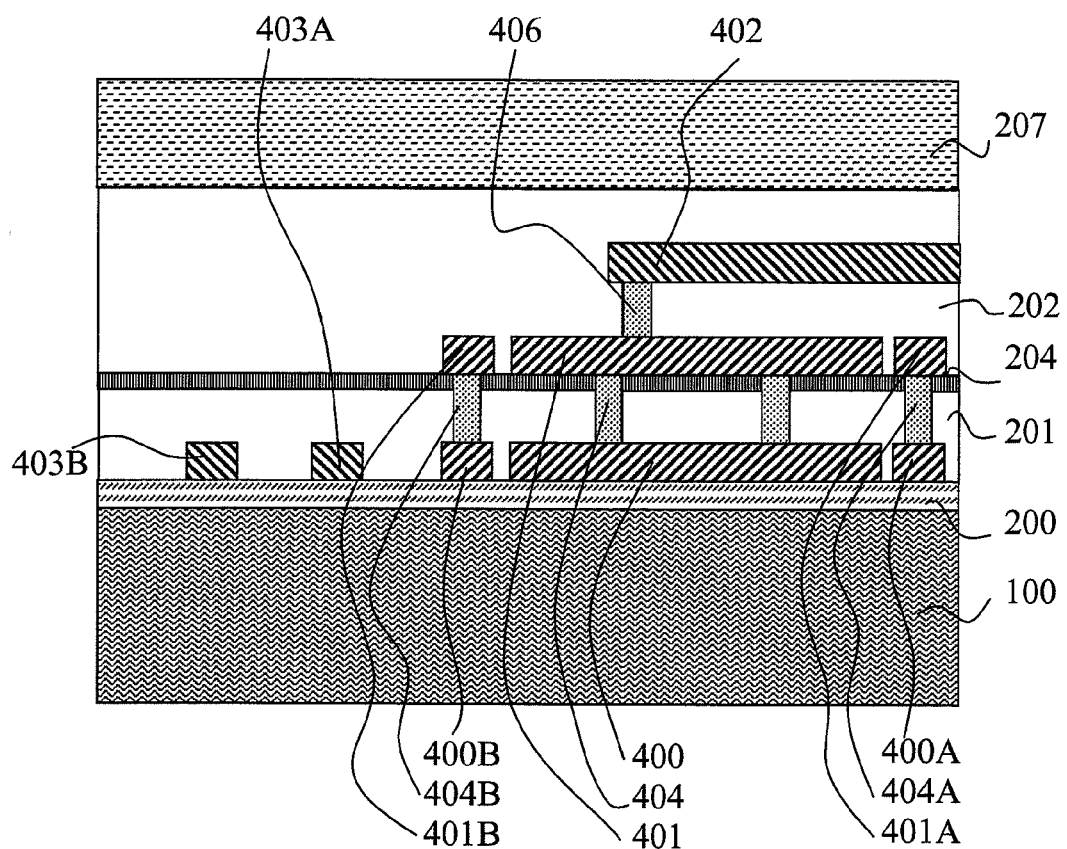
FIG. 23E is a schematic cross-sectional view of the main part of the manufacturing process continued from FIG. 23D.

Then, according to the process shown in the second embodiment, an interlayer insulating film made of carbon-containing silicon oxide (SiOC) and having a film thickness of 750 nm, a second connection via 406 made of tungsten, a third metal wiring 402 having a film thickness of 50 nm and made of titanium nitride and aluminum, an interlayer insulating film having a film thickness of 750 nm and made of carbon-containing silicon oxide (SiOC), an aluminum pad made of titanium nitride and aluminum, and a passivation film 207 made up of a silicon oxide film having a film thickness of 200 nm and a silicon nitride film having a film thickness of 250 nm are formed. The semiconductor device having a multilayer wiring as shown in FIG. 23E can be formed through the above-described process.

Figure 24:
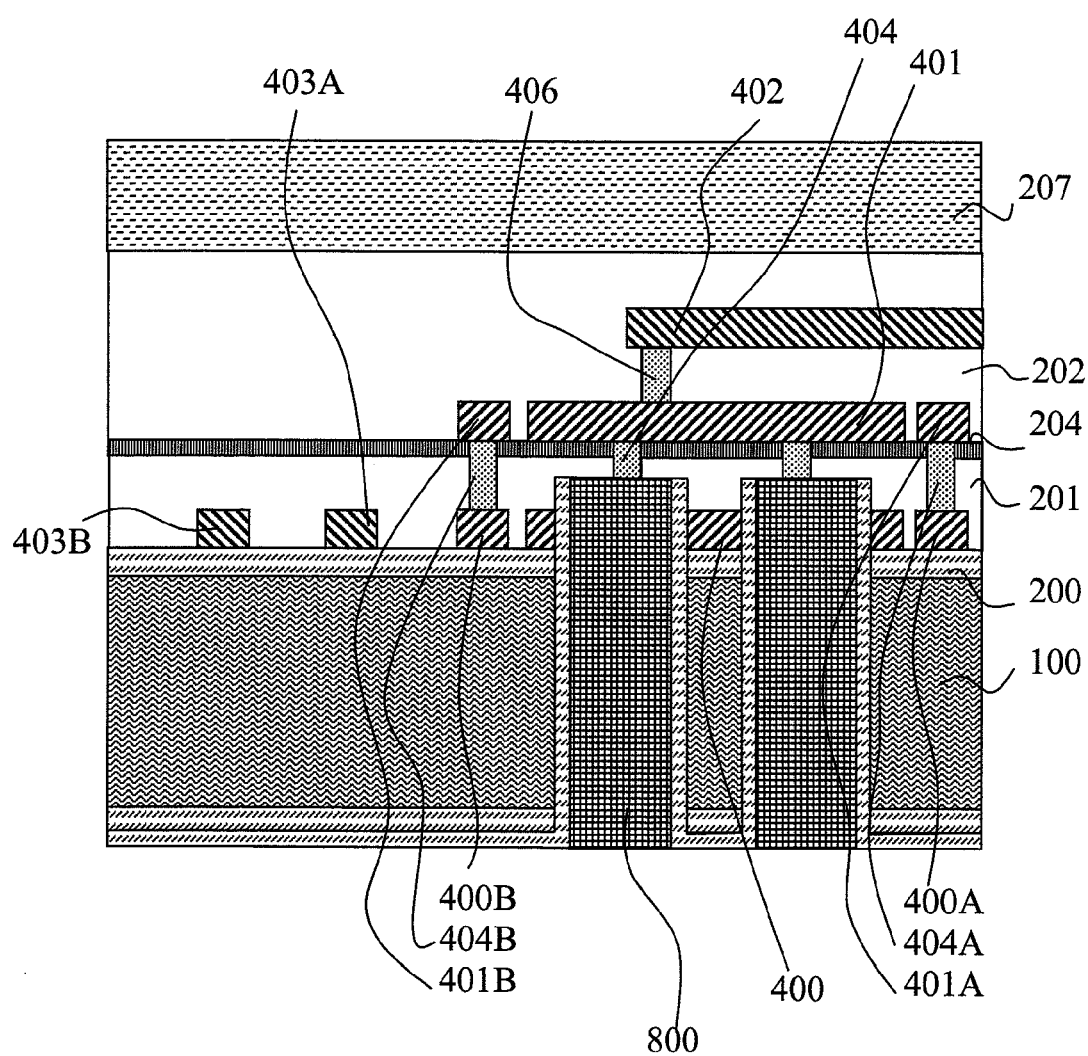
FIG. 24 is a schematic cross-sectional view of the main part of the manufacturing process of the semiconductor device of the eighth embodiment of the present invention continued from FIG. 23E.
Figure 25:
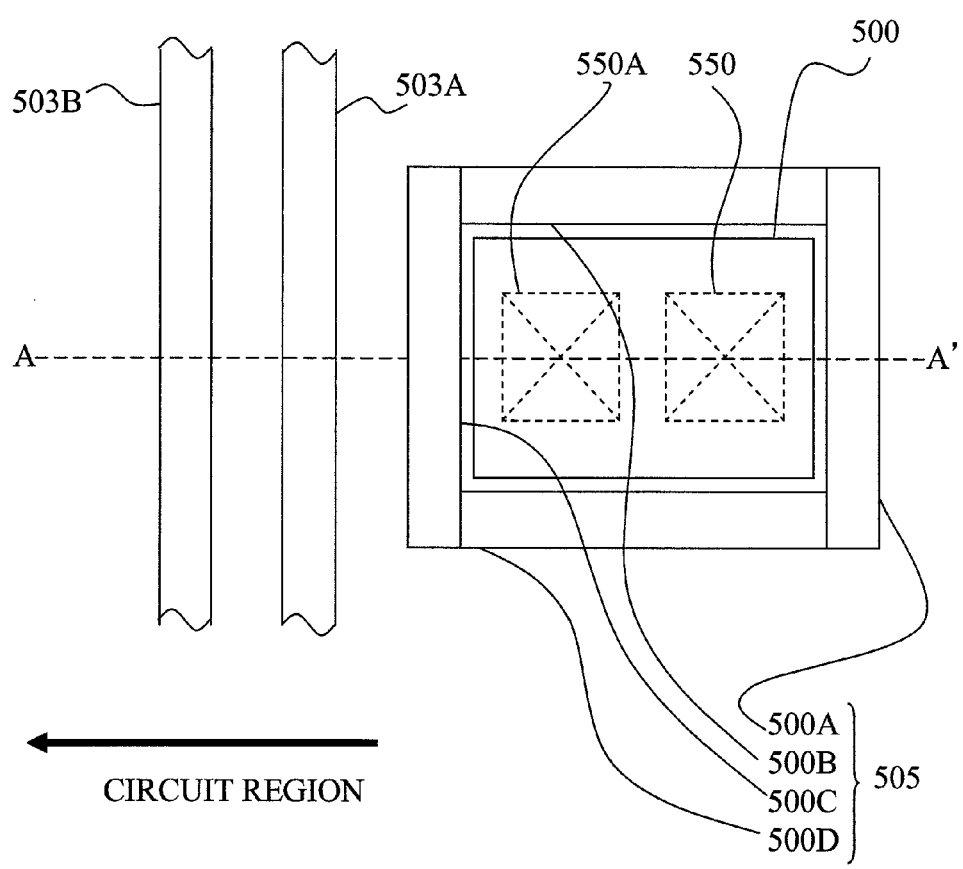
FIG. 25 is a schematic layout plan view of the eighth embodiment of the present invention.

Then, in the semiconductor device having the multilayer wiring described above in the present embodiment (FIG. 23E), according to the manufacturing process of the silicon through electrode of the second embodiment, a semiconductor device having a first back-surface insulating film 600 and a second back-surface insulating film 601 made of silicon oxide and a plurality of silicon through electrodes 800 made of tantalum and copper is formed (FIG. 24).

FIG. 25 shows part (the silicon through holes, the first metal wiring, and the adjacent parallel metal wirings) of the layout plan view of the semiconductor device formed by the above-described process. The cross-sectional view shown in FIG. 24 is a cross section taken along the line A-A' in FIG. 25. In FIG. 25, regions 500A, 500B, 500C, and 500D constituting the first metal wiring form the ring-shaped frame 505 and enclose a silicon through hole region 550 and a silicon through hole region 550A. Herein, the first metal wiring region 500 is disposed so as to be completely enclosed in the ring-shaped frame 505. Furthermore, an adjacent parallel metal wiring region 503A and an adjacent parallel metal wiring region 503B are laid outside the ring-shaped frame 505.

When the performance of the semiconductor device formed in this manner is checked, like the one shown as the comparative example of the first embodiment, increase in the parasitic capacitance, increase in the via chain resistance, and conduction failure are found in the semiconductor device in which the ring-shaped frame 505 is not provided compared with the case in which the ring-shaped frame 505 is provided.

In other words, the semiconductor device having the wiring having low parasitic capacitance and low via resistance in the circuit wiring region in the vicinity of the silicon through hole can be formed by forming the metal wirings in plural layers so as to enclose the region in which the plurality of silicon through holes are to be formed, forming the ring-shaped structure by using the metal wirings and connection vias, and further forming a protective insulating film to enclose the silicon through holes according to the present embodiment.

Also, the semiconductor device having the wiring having low parasitic capacitance and low resistance in the circuit wiring region in the vicinity of the silicon through hole can be formed by forming a film through which moisture is hard to pass such as a metal wiring, an connection via, an under-wiring insulating film, or a protective insulating film between the interlayer insulating film using the Low-k material exposed from the opening of the silicon through hole and the interlayer insulating film using the Low-k material formed in the circuit wiring region according to the present embodiment.

In the present embodiment, unlike the sixth embodiment, the plurality of silicon through electrodes are enclosed in the ring-shaped frame. Since the plurality of silicon through electrodes are connected to one metal wiring in the present embodiment compared with the sixth embodiment, there is an advantage that reliability of electrical connection can be improved.

In the present embodiment, two layers of metal wirings, that is, the first metal wirings (400A and 400B) and the second metal wirings (401A and 401B), and the first connection vias (404A and 404B) connecting therebetween are used as moisture barrier films for preventing moisture absorption of the Low-k material. However, three or more wiring layers and the connection vias connecting the wiring layers can also be utilized. The larger the number of used wiring layers, the larger the margin with respect to the overetching can be made in the etching for forming the opening of the silicon through via. On the other hand, since the region in which the moisture barrier film is formed cannot be used as a circuit wiring, the layout of wiring is restricted.

In the present embodiment, etching of the silicon through hole 701 is stopped at an intermediate part of the layer in which the first connection vias 404 are formed. However, the effectiveness of the present invention is not limited to this case. Since the condition for making the silicon through electrode function is that the etching penetrates through at least the substrate 100 on which the semiconductor device has been formed, and reaches the first metal wiring 400, etching may proceed to the upper wiring layer of the second metal wiring layer. However, if etching proceeds to the upper wiring layer of the second metal wiring layer and the Low-k material and the silicon through hole 701 are in contact with each other, in order to limit the region in which moisture permeates to the Low-k material, the ring-shaped frame 505 has to be formed also in the upper wiring layer to which etching of the silicon through hole 701 reaches, and the upper metal wiring having the shape that encloses the ring-shaped frame 505 has to be formed.

In the present embodiment, one metal wiring is enclosed in the ring-shaped frame. However, a plurality of metal wirings each of which includes at least one or more silicon through electrodes may be enclosed in the ring-shaped frame. The metal wirings to which the silicon through electrodes are connected are not required to be electrically connected.

In the present embodiment, in order to simplify descriptions, the number of stacked wirings is limited to three. However, any number of stacked layers will cause no problem.

Moreover, in the present embodiment, the third metal wiring 402 is used as a method for extracting the wiring which is electrically connected to the silicon through electrode 800. However, the wiring may be extracted by the second metal wiring layer.

Moreover, in the present embodiment, tungsten and Al are used as the materials of the ring-shaped frame 505. However, other materials can be used as long as the effect of preventing passage of moisture can be expected by the materials like SiCN. When a metal is used as a material of the ring-shaped frame, the effect of preventing passage of moisture can be expected if the ring-shaped frame has a thickness of about 10 nm. Furthermore, in the layout plan view, the shape of the ring-shaped frame is not required to be quadrangular, and may surround the periphery of the silicon through electrode a plurality of times.

In the present embodiment, materials mainly made of aluminum are used in the first, second, and third metal wirings. However, the materials may be mainly made of tungsten.

The first, second, and third metal wirings use titanium nitride as barrier metal in the present embodiment, but the material is not limited thereto. For example, tungsten, molybdenum, nickel, or a compound thereof can also be used. Furthermore, a plurality of films may be stacked in the structure of the barrier metal.

In the present embodiment, the interlayer insulating film uses the insulating film made of SiOC. However, the effects of the present invention are not limited to this material. Similar effects can be expected even by a porous Low-k film or an organic Low-k film.

In the present embodiment, insulating films made of silicon oxide formed by using plasma CVD is used as the material of the first protective insulating films. However, the material is not limited thereto. For example, SiN, SiCN, and a stacked structure thereof may be used.

INDUSTRIAL APPLICABILITY

In the present invention, increase in the dielectric constant of the interlayer insulating film and increase in the resistance of the wirings can be prevented in the semiconductor device in which a silicon through electrode is formed to the inside of an interlayer insulating film using a Low-k material. Therefore, it is possible to provide a highly-reliable semiconductor device having the wirings with good electrical characteristics.

DESCRIPTION OF REFERENCE NUMERALS

100: substrate on which semiconductor element has been formed, 200: under-wiring insulating film, 201: first interlayer insulating film using low-k material, 202: second interlayer insulating film using low-k material, 203: third interlayer insulating film using low-k material, 204: first protective insulating film, 205: second protective insulating film, 206: third protective insulating film, 207: passivation film, 300: first metal wiring opening, 300A: first metal wiring opening, 300B: first metal wiring opening, 301: second metal wiring opening, 301A: second metal wiring opening, 301B: second metal wiring opening, 302: third metal wiring opening, 303A: adjacent parallel metal wiring opening, 303B: adjacent parallel metal wiring opening, 304: first connection via opening, 304A: first connection via opening, 304B: first connection via opening, 400: first metal wiring, 400A: first metal wiring, 400B: first metal wiring, 401: second metal wiring, 401A: second metal wiring, 401B: second metal wiring, 402: third metal wiring, 403A: adjacent parallel metal wiring opening, 403B: adjacent parallel metal wiring opening, 404: first connection via, 404A: first connection via, 404B: first connection via, 405: ring-shaped frame, 406: second connection via, 500: wiring region constituting first metal wiring, 500A: wiring region constituting first metal wiring, 500B: wiring region constituting first metal wiring, 500C: wiring region constituting first metal wiring, 500D: wiring region constituting first metal wiring, 501: wiring region constituting second metal wiring, 501A: wiring region constituting second metal wiring, 501B: wiring region constituting second metal wiring, 501C: wiring region constituting second metal wiring, 501D: wiring region constituting second metal wiring, 503A: adjacent parallel metal wiring opening, 503B: adjacent parallel metal wiring opening, 504: connection via region connecting silicon through electrode and second metal wiring, 504A: connection via region connecting silicon through electrode and second metal wiring, 505: ring-shaped frame, 505A: connection via region constituting second metal wiring, 505B: connection via region constituting second metal wiring, 505C: connection via region constituting second metal wiring, 505D: connection via region constituting second metal wiring, 550: silicon through hole region, 550A: silicon through hole region, 600: first back-surface insulating film, 601: second back-surface insulating film, 700: first back-surface insulating film opening, 701: silicon through hole, 800: silicon through electrode

The invention claimed is:

1. A semiconductor device comprising:
a substrate having a semiconductor element formed on a front surface side thereof;
a first metal wiring formed on the substrate;
a circuit wiring made from a same metal layer as the first metal wiring, the circuit wiring being electrically connected to the semiconductor element and constituting part of a circuit network;
a Low-k insulating film formed to bury the metal wiring and the circuit wiring; and
a silicon through electrode extending from a back surface side of the substrate to within the Low-k insulating film,
wherein a moisture barrier is formed between the silicon through electrode and the circuit wiring,
the moisture barrier comprises a plurality of metal wirings formed in two or more different wiring layers and one or more connection vias connecting one of the plurality of metal wirings formed in an upper wiring layer with another of the plurality of metal wirings formed in one of the wiring layers below the upper wiring layer,
the moisture barrier forms, in plan view, one or more ring-shaped frames made up of said plurality of metal wirings and the one or more connection vias,
the silicon through electrode is surrounded by the one or more ring-shaped frames in the plan view,
said one of the plurality of metal wirings is disposed above the silicon through electrode so as to cover the silicon through electrode,
a portion of the low-k insulating film is between a bottom surface of said one of the plurality of metal wirings and a top surface of the silicon through electrode, and
said another of the plurality of metal wirings is disposed to a side of the silicon through electrode so as to surround the silicon through electrode in the plan view.

2. The semiconductor device according to claim 1,
wherein the silicon through electrode is electrically connected to the ring-shaped frame via a metal electrode, and
the metal electrode is also electrically connected to wiring outside of the frame.

3. The semiconductor device according to claim 1,
wherein a main component of the Low-k insulating film is a compound selected from silicon oxide and hydrocarbon.

4. The semiconductor device according to claim 1,
wherein the metal wirings are formed by using any of copper, aluminum, and tungsten as a main component.

5. The semiconductor device according to claim 1,
wherein the one or more connection vias are formed by using any of copper, aluminum, and tungsten as a main component.

6. The semiconductor device according to claim 1,
wherein the silicon through electrode is made of metal mainly made of copper.

7. The semiconductor device according to claim 1, wherein said one of the plurality of metal wirings is the first metal wiring.

8. The semiconductor device according to claim 1, further comprising an insulating film formed on said one of the plurality of metal wirings that prevents passage of moisture.

9. A semiconductor device comprising:
a substrate having a semiconductor element formed on a front surface side thereof;
a moisture barrier formed on the substrate and comprising metal wirings in a plurality of layers and one or more connection vias buried in a Low-k insulating film; and
a silicon through electrode extending from a back surface side of the substrate to within the Low-k insulating film,
wherein the one or more connection vias form at least one ring-shaped frame in plan view,
the silicon through electrode is surrounded by the at least one ring-shaped frame in the plan view,
the metal wirings of the moisture barrier enclosing the silicon through electrode,
one of the metal wirings in an upper layer of the plurality of layers is disposed above the silicon through electrode so as to cover the silicon through electrode,
a portion of the low-k insulating film is between a bottom surface of said one of the metal wirings in the upper layer and top surface of the silicon through electrode, and
another of the metal wirings in a layer below the upper layer is disposed to a side of the silicon through electrode so as to surround the silicon through electrode in the plan view.

10. The semiconductor device according to claim 9,
wherein the silicon through electrode is electrically connected to the ring-shaped frame by a metal electrode, and
the metal electrode is also electrically connected to wiring outside of the frame.

11. The semiconductor device according to claim 9,
wherein a main component of the Low-k insulating film is a compound selected from silicon oxide and hydrocarbon.

12. The semiconductor device according to claim 9,
wherein the silicon through electrode is made of metal mainly made of copper.

13. The semiconductor device according to claim 9, further comprising an insulating film formed on said one of the metal wirings in an upper layer that prevents passage of moisture.

14. A semiconductor device comprising:
a substrate having a semiconductor element with circuit wiring, the substrate having a front surface and a back surface;
a low-k insulating film formed over the front surface of the substrate and having the circuit wiring therein;
a silicon through electrode extending from the back surface of the substrate and terminating within a thickness of the low-k insulating film; and
a moisture barrier comprising first and second metal wirings and a metal connection portion,
wherein the first metal wiring is disposed within the low-k insulating film above an upper surface of the silicon through electrode so as to cover the silicon through electrode in plan view,
the second metal wiring is disposed below the first metal wiring and to a side of the silicon through electrode so as to surround the silicon through electrode in the plan view,
the metal connection portion is disposed within the low-k insulating film and connects the first and second metal wirings together, the metal connection portion surrounding the silicon through electrode in the plan view, and
the moisture barrier encloses a top end portion of the silicon through electrode that extends above the front surface of the substrate and a portion of the low-k insulating film surrounding said top end portion.

\* \* \* \* \*